(12) United States Patent
Gomi

(10) Patent No.: US 10,645,328 B2
(45) Date of Patent: May 5, 2020

(54) SOLID-STATE IMAGING DEVICE AND IMAGING APPARATUS HAVING CIRCUIT ELEMENTS IN PLURALITY OF SEMICONDCUTOR SUBSTRATES CONFIGURED IN A STACKED STRUCTURE

(71) Applicant: OLYMPUS CORPORATION, Hachioji-shi, Tokyo (JP)

(72) Inventor: Yuichi Gomi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/432,140

(22) Filed: Jun. 5, 2019

(65) Prior Publication Data

US 2019/0289239 A1 Sep. 19, 2019

Related U.S. Application Data

(63) Continuation of application No. PCT/JP2016/087002, filed on Dec. 13, 2016.

(51) Int. Cl.
*H04N 5/369* (2011.01)
*H01L 27/146* (2006.01)
(Continued)

(52) U.S. Cl.
CPC ............. *H04N 5/379* (2018.08); *H01L 27/14* (2013.01); *H01L 27/146* (2013.01);
(Continued)

(58) Field of Classification Search
CPC ...... H04N 5/379; H04N 5/341; H04N 5/3745; H01L 27/14636; H01L 27/14645
See application file for complete search history.

(56) References Cited

U.S. PATENT DOCUMENTS

| 2010/0245647 | A1* | 9/2010 | Honda | ............... | H01L 27/14634 348/308 |
| 2015/0163441 | A1* | 6/2015 | Murata | ................... | H04N 5/378 348/308 |
| 2017/0187973 | A1* | 6/2017 | Uchida | ................ | H04N 5/3696 |

FOREIGN PATENT DOCUMENTS

| JP | 2012-79973 A | 4/2012 |
| JP | 2012-253593 A | 12/2012 |
| JP | 2013-9294 A | 1/2013 |

OTHER PUBLICATIONS

International Search Report dated Feb. 21, 2017, issued in counterpart International Application No. PCT/JP2016/087002, w/English translation (2 pages).

* cited by examiner

*Primary Examiner* — Nicholas G Giles
(74) *Attorney, Agent, or Firm* — Westerman, Hattori, Daniels & Adrian, LLP

(57) ABSTRACT

This solid-state imaging device has a plurality of pixels formed by circuit elements distributed in a first and a second semiconductor substrates configured in a stacked structure. The solid-state imaging device has the first and the second semiconductor substrates and a plurality of connection electrodes formed between the first semiconductor substrate and the second semiconductor substrate to electrically connect signal lines of a plurality of photoelectric conversion circuits and signal lines of a plurality of signal processing circuits included in the first and second semiconductor substrates respectively. A plurality of pixel sets are defined to have at least one of the plurality of photoelectric conversion circuits, respectively, and the photoelectric conversion circuits included in the plurality of pixel sets adjacent to each other are connected to the corresponding signal processing circuits (Continued)

via the different connection electrodes which are formed at positions not adjacent to each other, respectively.

10 Claims, 13 Drawing Sheets

(51) Int. Cl.
    *H04N 5/341*     (2011.01)
    *H04N 5/3745*     (2011.01)
    *H01L 27/14*     (2006.01)

(52) U.S. Cl.
    CPC .. *H01L 27/14636* (2013.01); *H01L 27/14645* (2013.01); *H04N 5/341* (2013.01); *H04N 5/369* (2013.01); *H04N 5/3745* (2013.01)

SOLID-STATE IMAGING DEVICE AND IMAGING APPARATUS HAVING CIRCUIT ELEMENTS IN PLURALITY OF SEMICONDCUTOR SUBSTRATES CONFIGURED IN A STACKED STRUCTURE

The present invention relates to a solid-state imaging device and an imaging apparatus. The present application is a continuation application based on a PCT International Application No. PCT/JP2016/087002, filed on Dec. 13, 2016. The content of the PCT International Application is incorporated herein by reference.

BACKGROUND

Field of the Technology

Recently, a CMOS type of solid-state imaging devices (hereinafter "solid-state imaging device") configured by using Complementary metal Oxide Semiconductor (CMOS) are put into practical utilization as solid-state imaging devices equipped in an imaging apparatus such as a digital camera, a digital video camera, an endoscope and the like. In this solid-state imaging device, a plurality of pixels are arranged in a two-dimensional matrix form to configure a pixel array section, wherein the pixel has a photoelectric conversion element such as a photodiode and the like which is configured to transform incident light to an electrical signal. A technology is proposed to configure the solid-state imaging device using pixels having signal holding circuit such as a memory and the like which is configured to hold the electrical signal generated by the photoelectric conversion of the photoelectric conversion element as the pixels formed in the pixel array section. In this solid-state imaging device, it is possible to perform the photoelectrical conversions simultaneously in all of the photoelectrical conversion elements so as to eliminate an optical distortion of an optical image of an object during an imaging process of the object moving fast, by controlling all of the pixels to hold the electrical signals transformed by the photoelectric conversions of the photoelectric conversion elements into the signal holding circuits simultaneously, that is, by performing a function called global shutter function.

Recently, the solid-state imaging device equipped with a column processing circuit in each column of the pixels formed in the pixel array section is developed and produced, wherein the column processing circuit is configured to perform Correlated Double Sampling (CDS) processing and analog-digital transformation processing. In the solid-state imaging device with a general monolithic structure (a structure manufactured by a single semiconductor substrate), various peripheral circuits are configured in the periphery of the pixel array section. Besides the column processing circuit described above, the various peripheral circuits also include logic circuits including a control circuit, a vertical scanning circuit, a horizontal read control circuit, an output circuit and the like.

Recently, the number of pixels in solid-state imaging devices have been progressively increasing. Also, miniaturization of the size (a projected area) of the solid-state imaging device has been requested. However, the size (area) of the pixel having the signal holding circuit is larger than that of the pixel without the signal holding circuit. Accordingly, in the case of configuring the solid-state imaging device having the monolithic structure so as to correspond to the increase of the pixels, the area (chip size) of the semiconductor is increased and thus the size of the solid-state imaging device is enlarged. Furthermore, including the various peripheral circuits described above which are necessary to be arranged in the periphery of the pixel array section, it is difficult to achieve the miniaturization of the solid-state imaging device having a monolithic structure.

As disclosed in Japanese Unexamined Patent Application, First Publication No. 2013-009294, a technology of configuring a stacked-type solid-state imaging device as a single miniaturized semiconductor device is proposed by dividing and configuring the configuration elements of the solid-state imaging device on a plurality of semiconductor substrates, stacking the plurality of semiconductor substrates, and electrically connecting the semiconductor substrates via connection electrodes. In the solid-state imaging device disclosed in Japanese Unexamined Patent Application, First Publication No. 2013-009294, the photoelectric conversion elements having the pixels are arranged in the first substrate, and the signal accumulation circuits (signal holding circuits) are arranged in the second substrate. In the solid-state imaging device disclosed in Japanese Unexamined Patent Application, First Publication No. 2013-009294, the photoelectric conversion elements arranged in the first substrate are electrically connected with the signal accumulation circuits corresponding to the photoelectric conversion elements and being arranged in the second substrate via the connection sections (for example, connection electrodes such as the micro bumps and the like). That is, in the solid-state imaging device disclosed in Japanese Unexamined Patent Application, First Publication No. 2013-009294, one connection section is provided in correspondence to each of the plurality of pixels formed in the pixel array section, and then the photoelectric conversion element arranged in the first substrate and the signal accumulation circuit arranged in the second substrate corresponding to each of the pixels are electrically connected with each other by the corresponding connection section.

In the solid-state imaging device having the structure configured by stacking a plurality of semiconductor substrates, it is necessary to make the connection electrodes configured to electrically connect the semiconductor substrates to be definitely connected with each other. In a situation in which a poor connection occurs in any connection electrode, a signal connection between the semiconductor substrates is interrupted and the exchange of the electrical signal is not performed normally. In the solid-state imaging device having the structure configured by stacking a plurality of semiconductor substrates, when the poor connection occurs in the connection electrode, the pixel arranged at the position where the poor connection occurs falls into the same situation as that when a defect occurs in the pixel. Furthermore, in the solid-state imaging device having the structure configured by stacking a plurality of semiconductor substrates, the poor connection of the connection electrode may occur even if no defect occurs in the photoelectric conversion elements and the signal holding circuits formed in the semiconductor substrates.

Generally, it is difficult to entirely eliminate defects of the pixels in the solid-state imaging device. Accordingly, with respect to a camera, the pixels positioned at the defective positions of the solid-state imaging device are marked as defective pixels, and the signals of the defective pixels are generated (interpolated) by using the signals output from the pixels arranged in the periphery of the defective pixels due to the image processing of defective pixel correction executed thereafter. Since the image processing of defective pixel correction can be performed in the camera, the defective pixels in the solid-state imaging device are accepted to a certain degree. Accordingly, in the solid-state imaging device disclosed in Japanese Unexamined Patent Application, First Publication No. 2013-009294, since the image processing of defective pixel correction described above can be performed, poor connections leading to defective pixels can be accepted to a certain degree.

In the solid-state imaging device disclosed in Japanese Unexamined Patent Application, First Publication No. 2013-009294, the connection section is provided corresponding to each pixel, and the photoelectric conversion element arranged in the first substrate and the signal accumulation circuit arranged in the second substrate are electrically connected by the corresponding connection section. Furthermore, in the pixel array section of the solid-state imaging device disclosed in Japanese Unexamined Patent Application, First Publication No. 2013-009294, the photoelectric conversion elements and the signal accumulation circuits configuring the adjacent pixels are adjacent to each other in the corresponding substrates, and the corresponding connections sections are adjacent to each other.

SUMMARY

According to a first aspect of the present invention, a solid-state imaging device having circuit elements configuring a plurality of pixels, wherein the circuit elements are distributed in a plurality of semiconductor substrates configured in a stacked structure has a first semiconductor substrate having a plurality of photoelectric conversion circuits forming a two-dimensional array, each of the plurality of photoelectric conversion circuits having a part of the circuit elements including a photoelectric conversion element configured to transform incident light to an electrical signal; a second semiconductor substrate having a plurality of signal processing circuits forming a two-dimensional array, each of the plurality of signal processing circuits having another part of the circuits elements configured to process the electrical signal output by the plurality of photoelectric conversion circuits, and a number of the plurality of signal processing circuits being equal to a number of the plurality of photoelectric conversion circuits; and a plurality of connection electrodes formed in a two-dimensional array between the first semiconductor substrate and the second semiconductor substrate and configured to electrically connect signal lines of the plurality of photoelectric conversion circuits and signal lines of the plurality of signal processing circuits. A pixel set is defined by including at least one of the plurality of photoelectric conversion circuits, and the photoelectric conversion circuits included in the two adjacent pixel sets are connected to the corresponding signal processing circuits via the different connection electrodes formed at separated positions so as to not be adjacent to each other.

According to a second aspect of the present invention, in the solid-state imaging device according to the first aspect, each of the plurality of pixel sets may be configured by including multiple photoelectric conversion circuits among the plurality of photoelectric conversion circuits in which the photoelectric conversion elements are adjacent to each other, and the multiple photoelectric conversion circuits included in the same pixel set may be connected to the corresponding signal processing circuits via the adjacent connection electrodes.

According to a third aspect of the present invention, in the solid-state imaging device according to the second aspect, the plurality of connection electrodes may be formed in correspondence with the plurality of pixel sets, and the multiple photoelectric conversion circuits included in the same pixel set may be connected to the corresponding signal processing circuits via one of the plurality of connection electrode.

According to a fourth aspect of the present invention, in the solid-state imaging device according to the first aspect, each of the plurality of pixel sets may be configured by including multiple photoelectric conversion circuits among the plurality of photoelectric conversion circuits in which the photoelectric conversion elements are adjacent to each other, the photoelectric conversion elements being configured to transform light having different wavelengths into the electrical signal, and the multiple photoelectric conversion circuits included in the same pixel set may be connected to the corresponding signal processing circuits via the adjacent connection electrodes.

According to a fifth aspect of the present invention, in the solid-state imaging device according to any of the first aspect to the fourth aspect, the photoelectric conversion circuits included in the adjacent pixel sets may be connected to the corresponding signal processing circuits via the different connection electrodes which are formed at separated positions in either of a row direction or a column direction adjacent to the photoelectric conversion circuits.

According to a sixth aspect of the present invention, in the solid-state imaging device according to the fifth aspect, a connection unit may be defined by including a predetermined number of the pixel sets, and each of the photoelectric conversion circuits included in the adjacent pixel sets may be connected to the corresponding signal processing circuits via the different connection electrodes which are formed at separated positions by a cycle of the connection unit.

According to a seventh aspect of the present invention, in the solid-state imaging device according to the sixth aspect, the connection units may have multiple variations in either of the row direction or the column direction adjacent to the pixel sets, and the multiple variations of the connection units may be periodically repeated in either of the row direction or the column direction adjacent to the pixel set.

According to an eighth aspect of the present invention, in the solid-state imaging device according to the seventh aspect, the connection units may be different by each row or each column in which the photoelectric conversion element included in each photoelectric conversion circuit in the first semiconductor substrate is formed.

According to a ninth aspect of the present invention, in the solid-state imaging device according to any of the first aspect to the eighth aspect, image signals according to the electrical signals processed by the signal processing circuits connected to the photoelectric conversion circuits may be output in a sequence same as a sequence in which the photoelectric conversion elements formed in the first semiconductor substrate are queued.

According to a tenth aspect of the present invention, an imaging apparatus has the solid-state imaging device according to any one of the first aspect to the eighth aspect, and an image-processing unit configured to rearrange image signals output from the solid-state imaging device in a sequence in which the photoelectric conversion elements are queued, wherein the photoelectric conversion elements are configured to transform light incident on the solid-state imaging device to electrical signals for generating image signals.

DETAILED DESCRIPTION OF THE EMBODIMENTS

Figure 1:
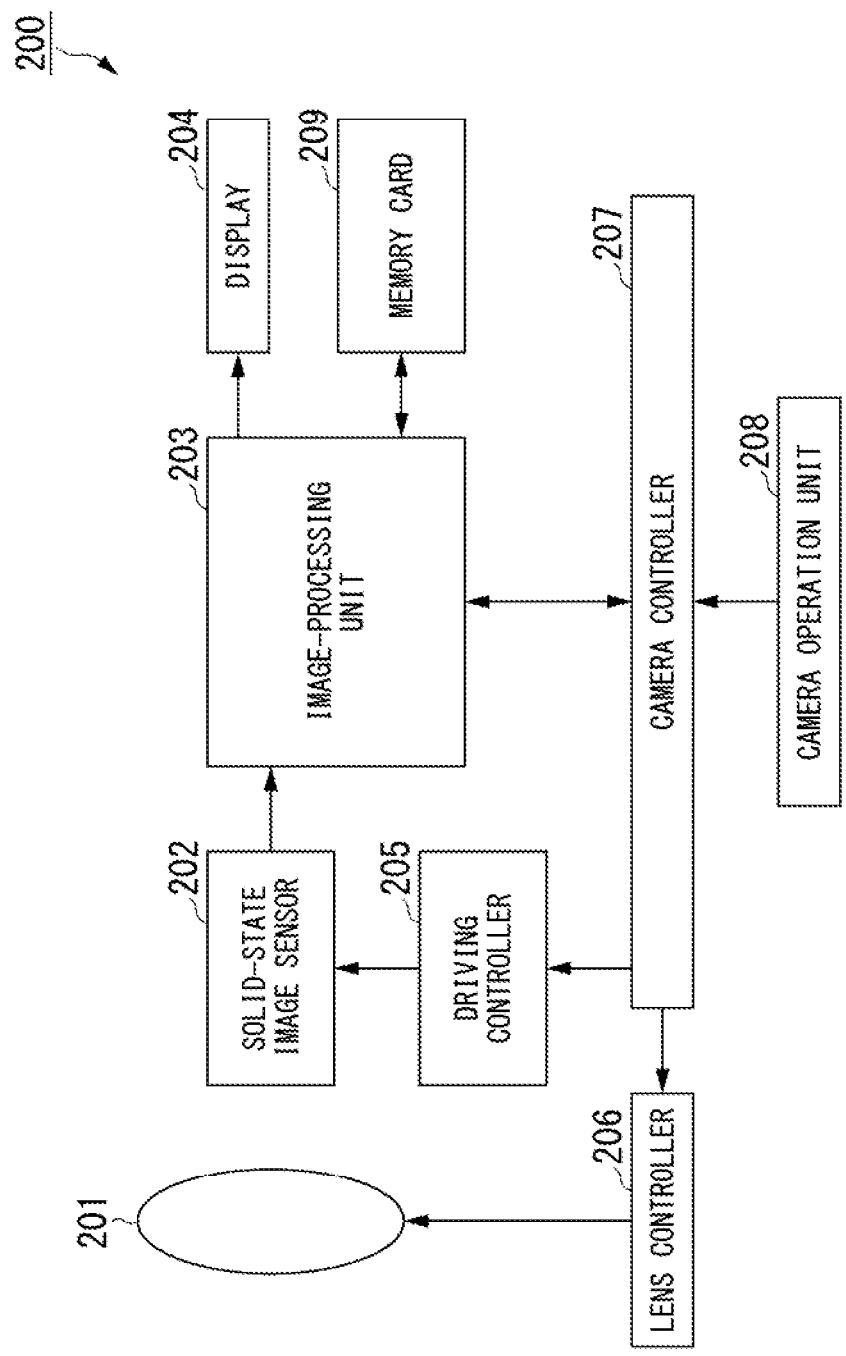
FIG. 1 is a schematic block diagram showing a configuration of an imaging apparatus according to various embodiments of the present invention.

Embodiments of the present invention will be described by referring to the enclosed figures. FIG. 1 is a schematic block diagram showing a configuration of an imaging apparatus according to various embodiments of the present invention. An imaging apparatus 200 shown in FIG. 1 has a lens 201, a solid-state imaging device 202, an image-processing unit 203, a display 204, a driving controller 205, a lens controller 206, a camera controller 207, a camera operation unit 208, and a memory card 209. The memory card 209 as a configuration element of the imaging apparatus 200 shown in FIG. 1 is an attachable and removable configuration with respect to the imaging apparatus 200, and the memory card 209 is not necessary to be a characteristic configuration of the imaging apparatus 200.

The lens 201 is a photographing lens configured to form an optical image of an object on an imaging surface of the solid-state imaging device 202, and a focus, a diaphragm, and a zoom of the lens 201 is driven under the control of the lens controller 206.

The solid-state imaging device 202 is driven under the control of the driving controller 205. The solid-state imaging device 202 is configured to transform light incident on the solid-state imaging device 202 via the lens 201 to an electrical signal, and the solid-state imaging device 202 is configured to output an imaging signal in accordance with an amount of the incident light (light quantity) to the image-processing unit 203. The solid-state imaging device 202 is configured to output a digital imaging signal indicating the optical image formed on the imaging surface thereof by the lens 201 to the image-processing unit 203. In the solid-state imaging device 202, configuration elements for realizing functions of the solid-state imaging device 202 are divided and distributed in a plurality of semiconductor substrates which are formed in a stacked structure. The configuration and the structure of the solid-state imaging device 202 will be described below in detail.

The image-processing unit 203 is configured to perform various digital image processing with respect to the image signals output from the solid-state imaging device 202. For example, the image-processing unit 203 is configured to perform the image processing for recording image data according to the image signals and the image processing for controlling the display 204 to display the image data according to the image signals. At this time, the image-processing unit 203 performs various image processing such as an amplification of the image signals, corrections such as defective pixel correction and the like, an arrangement of the image signals, a transformation of transforming the image signals into image data, and a compression of the image data. The image-processing unit 203 utilizes a memory (not shown) such as a Dynamic Random Access Memory (DRAM) as a temporary storage means for the image data during the various processing.

The display 204 is a display apparatus such as a liquid-crystal display configured to display an image according to the image data. For example, the image data is acquired due to the image processing for displaying performed by the image-processing unit 203 with respect to the image signals output from the solid-state imaging device 202, or the image data is read from the memory card 209 and processed by the image-processing unit 203 for displaying. The display 204 can display a still image while displaying an indication image for confirming the object imaged by the imaging apparatus 200, that is, a live-view image (a through-the-lens image) in real time.

The driving controller 205 is configured to control driving of the solid-state imaging device 202 in response to the control of the camera controller 207. For example, when the imaging apparatus 200 is shooting the image of the object, the driving controller 205 controls the operations of the exposure of the solid-state imaging device 202.

The lens controller 206 is configured to control driving of the lens 201 in response to the control of the camera controller 207. For example, the lens controller 206 is configured to drive a focus mechanism equipped in the lens 201 to change a focal position thereof so as to make the optical image of the object to be focused and formed on the imaging surface of the solid-state imaging device 202. The lens controller 206 is configured to drive a diaphragm mechanism equipped in the lens 201 to change the brightness of the optical image of the object which is formed on the imaging surface of the solid-state imaging device 202. The lens controller 206 is configured to drive a zoom mechanism equipped in the lens 201 to change a size of the optical image of the object which is formed on the imaging surface of the solid-state imaging device 202.

The camera controller 207 is a controller configured to perform an overall control of the imaging apparatus 200. Operations of the camera controller 207 are defined by programs stored in a memory (not shown) such as a Read Only Memory or a Flash Memory equipped in the imaging apparatus 200. When the imaging apparatus 200 is activated, the camera controller 207 is configured to read and execute the program from the memory (not shown) so as to perform various control with respect to the configuration elements equipped in the imaging apparatus 200 according to the determined contents defined by the executed program.

The camera operation unit 208 is an operation input unit configured to receive various operations by a user of the imaging apparatus 200. The camera operation unit 208 has various operation members configured to receive the operation input from the user to the imaging apparatus 200. More specifically, the camera operation unit 208 has operation members such as a power switch configured to turn on/off the power of the imaging apparatus 200, a release button configured to instruct the imaging apparatus 200 to capture a still image, and the like. The camera operation unit 208 may further have an operation member such as a mode switch for the still image capture which is configured to switch the imaging operation (mode) of the still image capture in the imaging apparatus 200 between a single mode for capturing a single still image and a consecutive mode for consecutively capturing a plurality of still images. The camera operation unit 208 is configured to output the information indicating the operations of the imaging apparatus 200 by the user to the camera controller 207. Accordingly, the camera controller 207 controls the various configuration elements equipped in the imaging apparatus 200 in response to the operations by the user.

The memory card 209 is a recording medium configured to accommodate (store) the image data which is acquired due to the image processing for recording performed by the image-processing unit 203 with respect to the image signals output from the solid-state imaging device 202. The memory card 209 is an attachable/removable recording medium formed from a semiconductor memory and the like. The memory card 209 is configured to perform the record or the read of the image data in response to the control of the image-processing unit 203.

Figure 2:
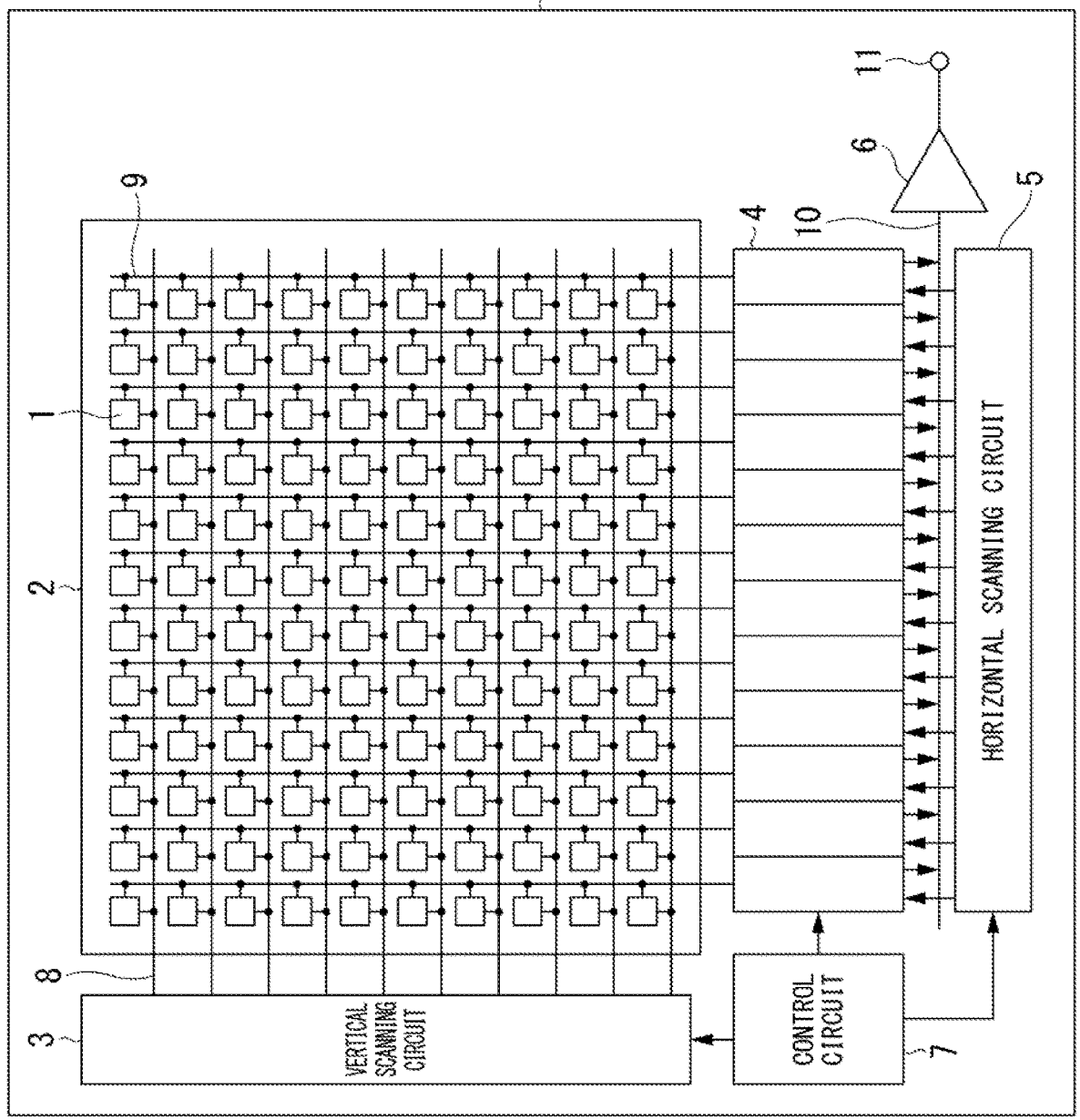
FIG. 2 is a schematic block diagram showing a configuration of a solid-state imaging device equipped in the imaging apparatus according to the embodiments of the present invention.

Next, a configuration of the solid-state imaging device 202 will be described. FIG. 2 is a schematic block diagram showing a configuration of a solid-state imaging device 202 equipped in the imaging apparatus 200 according to the embodiments of the present invention. In FIG. 2, the solid-state imaging device 202 has a pixel array section 2 having a plurality of pixels 1, a vertical scanning circuit 3, a column processing circuit 4, a horizontal read circuit 5, an output amplifier 5, and a control circuit 7. In the solid-state imaging device 202, the actual position of each configuration element is not limited to the position at which each configuration element is arranged as shown in FIG. 2.

The pixel array section 2 has the plurality of pixels 1 arranged in a two-dimensional matrix. In FIG. 2, an example of the pixel array section 2 in which the plurality of pixels 1 are arranged in 10 rows and 12 columns is shown. A configuration example of the plurality of pixels 1 in the pixel array section 2 is shown in FIG. 2; however, a number of the rows and a number of the columns of the plurality of pixels 1 arranged in the pixel array section 2 only has to be equal to or more than two.

Each of the plurality of pixels 1 arranged in the pixel array section 2 has a photoelectric conversion circuit (hereinafter "photoelectric conversion circuit PD") and a signal processing circuit. The photoelectric conversion circuit PD is configured to include a photoelectric conversion element for transforming the incident light to the electrical signals, a plurality of transistors, a plurality of capacities, and the like. The signal processing circuit is configured to include circuit elements configured to perform signal processing with respect to the electrical signals output from the photoelectric conversion circuit PD. For example, a signal holding circuit (hereinafter "memory circuit M") is configured as the signal processing circuit to include an analog memory for holding the electrical signals acquired by the photoelectric conversion by the photoelectric conversion circuit PD, a plurality of transistors, a plurality of capacities, and the like. For example, the signal processing circuit may be an analog-digital transformation circuit configured to transform the electrical signals (analog signals) acquired due to the photoelectric conversion by the photoelectric conversion circuit PD to the digital signals, or a logic circuit configured to perform predetermined processing with respect to the electrical signals (analog signals) acquired due to the photoelectric conversion by the photoelectric conversion circuit PD or the digital signals output by the analog-digital transformation circuit. In the description below, the pixel 1 will be described using the example in which the pixel 1 is configured by the photoelectric conversion circuit PD and the memory circuit M.

The pixel 1 is configured to transform the incident light to the electrical signals by the photoelectric conversion of the photoelectric conversion circuit PD and hold the electrical signals acquired by the photoelectric conversion in the memory circuit M, in response to control signals output from the vertical scanning circuit 3 and input via the control signal lines 8. Then, the pixel 1 is configured to output the electrical signals held by the memory circuit M, as the pixel signals according to the light quantity of the incident light, to the column processing circuit 4 via the corresponding vertical signal lines 9 in response to the control signals output from the vertical scanning circuit 3.

The vertical scanning circuit 3 is configured to control driving of the pixels 1 inside the pixel array section 2 by each row and output the pixel signals, according to the electrical signals acquired due to the photoelectric conversion performed in each pixel 1 with respect to the incident light, to the column processing circuit 4 via the corresponding vertical signal lines 9. The vertical scanning circuit 3 is configured to generate driving signals for controlling driving of each pixel 1 in the pixel array section 2. Then, the vertical scanning circuit 3 is configured to output the generated driving signals via the control signal lines 8 arranged by each row of the pixels 1 in the pixel array section 2 in sequence so as to control driving of each pixel 1 in the pixel array section 2 by each row.

The column processing circuit 4 is arranged by each column of the pixels 1 in the pixel array section 2, and the column processing circuit 4 is configured to perform predetermined various signal processing (hereinafter "column processing") with respect to the pixel signals output from the pixels 1 in the corresponding column and output to the corresponding vertical signal lines 9 in response to the control from the control circuit 7. For example, the column circuit 4 is configured to perform signal processing with respect to the analog signals such as the amplification processing so as to amplify the pixel signals, or the Correlated Double Sampling (CDS) processing so as to remove noise from the pixel signals, or the analog-digital transformation processing so as to transform the pixel signals (analog signals) to the digital signals and the like. The column processing unit 4 is configured to output the pixel signals after the column processing to the output amplifier 6 via the horizontal signal line 10 in response to the control signals input from the horizontal read circuit 5.

The horizontal read circuit 5 is configured to select the column processing circuit 4 by each column of the pixels 1 arranged in the pixel array section 2 and cause the selected column processing circuit 4 to output (read out) the pixel signals after the column processing to the horizontal signal line 10, in response to the control from the control circuit 7. The horizontal read circuit 5 is configured to generate selection signals for selecting the column processing circuits 4. Then, the horizontal read circuit 5 is configured to output the generated selection signals to the column processing circuits 4 in a sequence of the columns of the pixels 1 in which the pixel signals are each output to the outside of the solid-state imaging device 202. In the solid-state imaging device 202, the horizontal read circuit 5 is configured to select the column processing circuits and output the pixel signals to the horizontal signal line 10 in a sequence such that the pixel signals (digital signals) according to the light quantity of the light incident on the photoelectric conversion elements equipped in the pixels 1 in the pixel array section 2 are output as the image signals via the output amplifier 6.

The output amplifier 6 is an output circuit configured to output the pixel signals from the column processing circuit 4, which are output (read out) by the horizontal read circuit 5 and output to the horizontal signal line 10, as the image signals to the outside of the solid-state imaging device 202. The output amplifier 6 is configured to perform signal processing with respect to the pixel signals after the column processing which are output by the horizontal read circuit 5 to the horizontal signal line 10 by each column of the pixels 1 in the pixel array section 2 and output the processed signals as the image signals to the outside of the solid-state imaging device 202 via an output terminal 11.

The control circuit 7 is configured to control the configuration elements equipped in the solid-state imaging device 202 such as the vertical scanning circuit 3, the column processing circuit 4, and the horizontal read circuit 5. The control circuit 7 is configured to generate signals such as a clock signal used as a reference when the configuration elements equipped in the solid-state imaging device 202 are operating, or a control signal for controlling the operations of the configuration elements and the like. The control circuit 7 is configured to output each of the generated signals to the corresponding configuration elements.

As descried above, the configuration elements equipped in the solid-state imaging device 202, that is, the pixel array section 2, the vertical scanning circuit 3, the column processing circuit 4, the horizontal read circuit 5, the output amplifier 6, and the control circuit 7 are divided and distributed in a plurality of semiconductor substrates. Then, the solid-state imaging device 202 is configured to realize the functions described above due to the stacked structure by stacking the plurality of semiconductor substrates in which the configuration elements of the solid-state imaging device 202 are divided and distributed.

Figure 3:
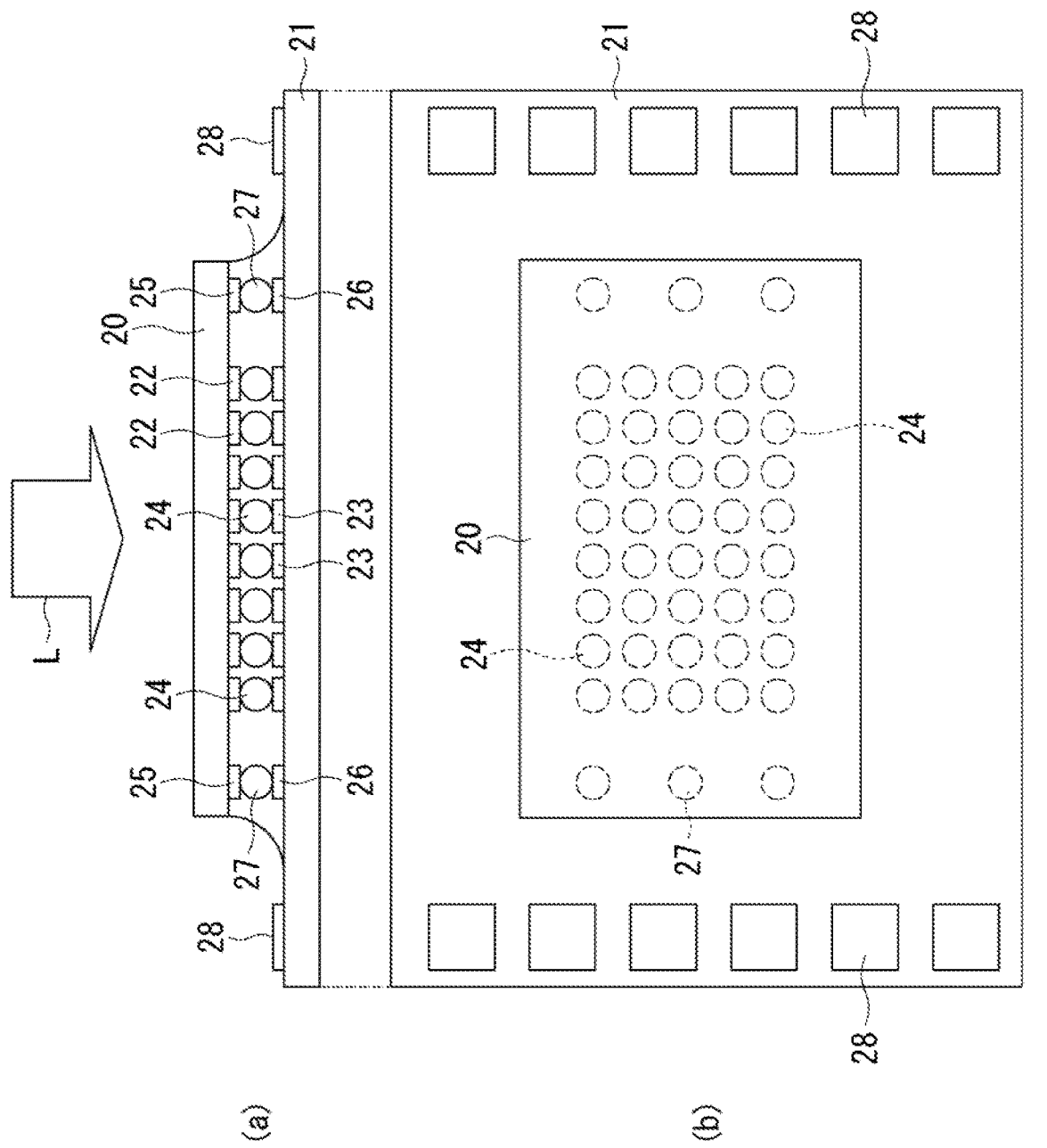
FIG. 3 is a schematic view showing a structure example of the solid-state imaging device equipped in the imaging apparatus according to the embodiments of the present invention.

Next, the structure of the solid-state imaging device 202 will be described. FIG. 3 is a schematic view showing a structure example of the solid-state imaging device 202 equipped in the imaging apparatus 200 according to the embodiments of the present invention. In FIG. 3, an example of the solid-state imaging device 202 having a structure of stacking two semiconductor substrates (a first semiconductor substrate 20 and a second semiconductor substrate 21) is shown. A cross-sectional structure of the solid-state imaging device 202 is shown in the part (a) of FIG. 3, and a planar structure of the solid-state imaging device 202 is shown in the part (b) of FIG. 3.

Each of the configuration elements of the solid-state imaging device 202 is formed in either of the first semiconductor substrate 20 on which the light L is incident or the second semiconductor substrate 21 that is stacked on a surface of the first semiconductor substrate 20 opposite to the surface of the first semiconductor substrate 20 on which the light L is incident. In FIG. 3, an example of dividing and forming the circuit elements (photoelectric conversion circuit PD, memory circuit M, and the like) configuring each of the plurality of pixels 1 in the pixel array section 2 of the solid-state imaging device 202 in either of the first semiconductor substrate 20 and the second semiconductor substrate 21 is shown. At this time, in the solid-state imaging device 202, signal lines of the circuit elements for configuring the plurality of pixels 1 formed on the semiconductor substrates are electrically connected to each other by connection electrodes. For example, micro-bumps made (formed) by the vapor deposition method or the plating method are used as the connection electrodes. In the solid-state imaging device 202, the circuit elements of the pixel 1 formed in the first semiconductor substrate 20 and the circuit elements of the pixel 1 formed in the second semiconductor substrate 21 exchange electrical signals with each other via the connection electrodes.

At least the photoelectric conversion circuit PD among the circuit elements configuring the pixel 1 is formed in the first semiconductor substrate 20. At this time, the photoelectric conversion elements configuring the photoelectric conversion circuit PD are formed in a principal surface (a surface having a larger surface area than that of a lateral surface) on which the light L is incident between the two principal surfaces. Accordingly, the light L is incident on the photoelectric conversion elements. Between the two principal surfaces of the first semiconductor substrate 20, various micro-pads 22 are formed on the principal surface on the opposite side of the principal surface on which the light L is incident, wherein the micro-pads 22 are formed as the electrodes for connecting the signal lines between the first semiconductor substrate 20 and the second semiconductor substrate 21. The micro-pads 22 are formed corresponding to each pixel 1, or a plurality of pixels 1.

At least the memory circuit M among the circuit elements configuring the pixel 1 is formed in the second semiconductor substrate 21. Between the two principal surfaces of the second semiconductor substrate 21, various micro-pads 23 are formed on the principal surface facing the first semiconductor substrate 20, wherein the micro-pads 23 are formed as the electrodes for connecting the signal lines between the first semiconductor substrate 20 and the second semiconductor substrate 21. The micro-pads 23 are formed at positions corresponding to the micro-pads 22. That is, the micro-pads 23 are formed corresponding to each pixel 1, or a plurality of pixels 1.

In the solid-state, imaging device 202, micro-bumps 24 are formed between the micro-pads 22 formed in the first semiconductor substrate 20 and the micro-pads 23 formed in the second semiconductor substrate 21. During the manufacture process of the solid-state imaging device 202, the first semiconductor substrate 20 and the second semiconductor substrate 21 are integrally configured such that the micro-pads 22 and the micro-pads 23 are configured to overlap and face each other, and the micro-pads 22 and the micro-pads 23 are connected by the micro-bumps 24 formed therebetween. The space between the first semiconductor substrate 20 and the second semiconductor substrate 21 may be filled by insulating member such as the adhesive agent and the like.

In the solid-state imaging device 202, the micro-pads 22, the micro-bumps 24, and the micro-pads 23 are configured to form the electrodes for connection (hereinafter "connection electrodes") of the first semiconductor substrate 20 and the second semiconductor substrate 21. Accordingly, in the solid-state imaging device 202, the signal lines of the pixels 1 formed in the first semiconductor substrate 20 and the signal lines of the pixels 1 formed in the second semiconductor substrate 21 are electrically connected. More specifically, the electrical signals generated due to the photoelectric conversion of the photoelectric conversion circuit PD formed in the first semiconductor substrate 20 with respect to the incident light L are output to the second semiconductor substrate 21 via the connection electrodes configured by the micro-pads 22, the micro-bumps 24, and the micro-pads 23, and the electrical signals are held by the memory circuit M formed in the second semiconductor substrate 21.

Between the two principal surfaces of the first semiconductor substrate 20, in the principal surface on the opposite side of the principal surface on which the light L is incident, micro-pads 25 having the same structure as that of the micro-pads 22 are formed in the periphery of the pixel array section 2. On the other hand, between the two principal surfaces of the second semiconductor substrate 21, in the principal surface on the opposite side of the principal surface facing the first semiconductor substrate 20, micro-pads 26 having the same structure as that of the micro-pads 23 are formed in the positions corresponding to the positions of the micro-pads 25 formed in the first semiconductor substrate 20 (positions in the periphery of the pixel array section 2). Micro-bumps 27 having the same structure as that of the micro-bumps 24 are formed between the micro-pads 25 formed in the first semiconductor substrate 20 and the micro-pads 26 formed in the second semiconductor substrate 21. Power supply voltages and the like for operating the circuit elements of the pixels 1 formed in the first semiconductor substrate 20 and the circuit elements of the pixels 1 formed in the second semiconductor substrate 21 are supplied from the first semiconductor substrate 20 to the second semiconductor substrate 21 or from the second semiconductor substrate 21 to the first semiconductor substrate 20 via the connection electrodes configured by the micro-pads 25, the micro-bumps 27, and the micro-pads 26.

In either of the principal surface between the two principal surfaces in the second semiconductor substrate 21, wire bonding pads such as pads 28 are formed to be used as the interface between the first semiconductor substrate 20 and the second semiconductor substrate 21, wherein the pads 28 are formed to be a different type relative to the signal lines connecting the first semiconductor substrate 20 and the second semiconductor substrate 21. In the structure example of the solid-state imaging device 202 shown in FIG. 3, the pads 28 are formed in the principal surface facing the first semiconductor substrate 20 between the two principal surfaces of the second semiconductor substrate 21. Signal lines for exchanging the electrical signals with the external configuration elements of the solid-state imaging device 202 are connected to the pads 28. For example, the signal lines of the output terminal 11 of the output amplifier 6 configured to output the image signals to the image-processing unit 203 as the external configuration element of the solid-state imaging device 202 are connected to the pads 28. In a case in which the solid-state imaging device 202 is assembled (packaged) into a ceramic package and the like, the pads 28 are formed as the terminals to which the wirings for exchanging the electrical signals between the external configuration elements of the package and the solid-state imaging device 202 are connected. The pads 28 and the package are electrically connected by the wirings formed according to the wire boding method. The electrical signals output by the solid-state imaging device 202 are output to the external configuration elements via the corresponding pads 28 and the wirings. The electrical signals input from the external configuration elements are input to each of the configuration elements in the solid-state imaging device 202 via the corresponding pads 28 and the wirings.

In the example shown in FIG. 3, the connection structure of connecting the signal lines by the two micro-pads and the micro-bumps formed between the micro-pads is shown as the structure of the connection electrodes connecting the signal lines between the first semiconductor substrate 20 and the second semiconductor substrate 21. However, the structure of the connection electrodes is not limited to the configuration shown in FIG. 3. For example, without forming the micro-bumps as the configuration of the connection electrodes, the structure of connecting the signal lines between the first semiconductor substrate 20 and the second semiconductor substrate 21 may be configured by directly bonding (aligning and adhering) the micro-pads formed on the surface of the first semiconductor substrate 20 and the micro-pads formed on the surface of the second semiconductor substrate 21.

Instead of the pads 28, a Through-Silicon-Via (TSV) electrode penetrating the second semiconductor substrate 21 may be formed as the electrode for exchanging the electrical signals with the external configuration elements. In the example shown in FIG. 3, the structure of the solid-state imaging device 202 is described that the surface area of the principal surface of the first semiconductor substrate 20 is different from that of the principal surface of the second semiconductor substrate 21; however, in the solid-state imaging device 202, a structure may be configured that the surface area of the principal surface of the first semiconductor substrate 20 is the same as that of the principal surface of the second semiconductor substrate 21. In this case, the TSV electrodes formed to penetrate the first semiconductor substrate 20 may be used as the electrodes (for example, the wire-bonding pads) for exchanging the electrical signals between the external configuration elements and the solid-state imaging device 202 instead of the pads 28.

In the description of FIG. 3, the case in which the circuit elements configuring the pixels 1 arranged in the pixel array section 2 are divided and distributed in the first semiconductor substrate 20 and the second semiconductor substrate 21 is described. Similarly, the configuration elements of the solid-state imaging device 202 excluding the pixels 1, that is, each of the pixel array section 2, the vertical scanning circuit 3, the column processing circuit 4, the horizontal read circuit 5, the output amplifier 6, and the control circuit 7 may be divided and distributed in the first semiconductor substrate 20 and the second semiconductor substrate 21 in the same way as that of the pixels 1. At this time, the configuration elements excluding the pixels 1 may be formed in either of the first semiconductor substrate 20 or the second semiconductor substrate 21 by each configuration unit thereof, or similar with the pixels 1, the circuit elements configuring each of the configuration elements excluding the pixels 1 may be divided and distributed in both of the first semiconductor substrate 20 and the second semiconductor substrate 21. In this case, the signal lines of each of the configuration elements and the circuit elements are electrically connected between the first semiconductor substrate 20 and the second semiconductor substrate 21 by the connection electrodes.

Figure 4:
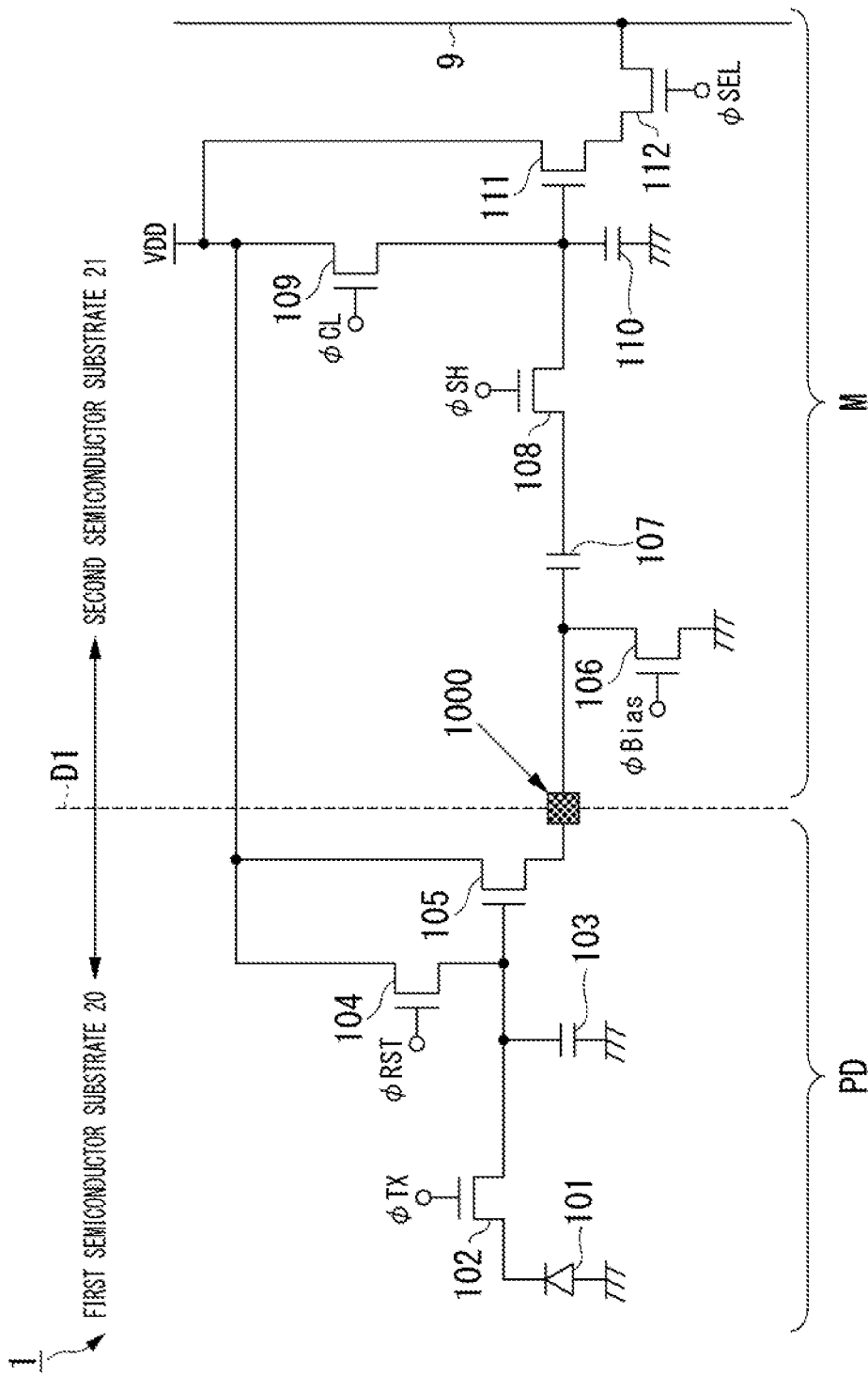
FIG. 4 is a circuit diagram showing a configuration example of a pixel in the solid-state imaging device equipped in the imaging apparatus according to the embodiments of the present invention.

Next, the circuit configuration of the pixel 1 will be described. FIG. 4 is a circuit diagram showing a configuration example of the pixel 1 in the solid-state imaging device 202 equipped in the imaging apparatus 200 according to the embodiments of the present invention. In FIG. 4, a single pixel 1 is shown. The pixel 1 is configured to transform the incident light to the electrical signal and output the electrical signal to the vertical signal line 9 as the pixel signal. The pixel 1 has a photoelectric conversion element 101, a transmission transistor 102, a floating diffusion (FD) 103, a FD-reset transistor 104, a first amplifying transistor 105, a load transistor 106, a clamp capacitor 107, a sample transistor 108, an analog-memory-reset transistor 109, an analog memory 110, a second amplifying transistor 111, and a selection transistor 112.

A first terminal of the photoelectric conversion element 101 is grounded. A drain terminal of the transmission transistor 102 is connected to a second terminal of the photoelectric conversion element 101. A gate terminal of the transmission transistor 102 is connected by a transmission pulse φTX which is a control signal output from the vertical scanning circuit 3. A first terminal of the FD 103 is connected to a source terminal of the transmission transistor 102. A second terminal of the FD 103 is grounded. A drain terminal of the FD-reset transistor 104 is connected to the power voltage VDD. A source terminal of the FD-reset transistor 104 is connected to the source terminal of the transmission transistor 102. A gate terminal of the FD-reset transistor 104 is connected by a FD-reset pulse φRST which is a control signal output from the vertical scanning circuit 3.

A drain terminal of the first amplifying transistor 105 is connected to the power voltage VDD. A gate terminal as the input of the first amplifying transistor 105 is connected to the source terminal of the transmission transistor 102. A drain terminal of the load transistor 106 is connected to the source terminal of the first amplifying transistor 105. A source terminal of the load transistor 106 is grounded. A gate terminal of the load transistor 106 is connected by a current control pulse φBias which is a control signal output from the vertical scanning circuit 3.

A first terminal of the clamp capacitor 107 is connected to the source terminal of the first amplifying transistor 105 and the drain terminal of the load transistor 106. A drain terminal of the sample transistor 108 is connected to a second terminal of the clamp capacitor 107. A gate terminal of the sample transistor 108 is connected by a sample pulse φSH which is a control signal output from the vertical scanning circuit 3.

A drain terminal of the analog-memory-reset transistor 109 is connected to the power voltage VDD. A source terminal of the analog-memory-reset transistor 109 is connected to the source terminal of the sample transistor 108. A gate terminal of the analog-memory-reset transistor 109 is connected by a clamp-and-memory-reset pulse φCL which is a control signal output from the vertical scanning circuit 3.

A first terminal of the analog memory 110 is connected to the source terminal of the sample transistor 108. A second terminal of the analog memory 110 is grounded. A drain terminal of the second amplifying transistor 111 is connected to the power voltage VDD. A gate terminal of the second amplifying transistor 111 as the input is connected to the source terminal of the sample transistor 108. A drain terminal of the selection transistor 112 is connected to the source terminal of the second amplifying transistor 111. A source terminal of the selection transistor 112 is connected to the vertical signal line 9. A gate terminal of the selection transistor 112 is connected by a selection pulse φSEL which is a control signal output from the vertical scanning circuit 3.

In the circuit configuration of the pixel 1, the actual position of each circuit element is not limited to the position at which each circuit element is arranged as shown in FIG. 4. Each of the transistors configuring the pixel 1 may have a reverse polarity. That is, in each transistor described above, the source terminal and the drain terminal may be reversed.

As shown above, each circuit element of the pixel 1 is divided and distributed in the first semiconductor substrate 20 and the second semiconductor substrate 21. In FIG. 4, a boundary line D1 between the first semiconductor substrate 20 and the second semiconductor substrate 21 is shown as a broken line. In the circuit configuration of the pixel 1 shown in FIG. 4, a case of forming the photoelectric conversion circuit PD from the photoelectric conversion element 101, the transmission transistor 102, the FD 103, the FD-reset transistor 104, and the first amplifying transistor 105 in the first semiconductor substrate 20 is shown. In the circuit configuration of the pixel 1 shown in FIG. 4, a case of forming the memory circuit M from the load transistor 106, the clamp capacitor 107, the sample transistor 108, the analog-memory-reset transistor 109, the analog memory 110, the second amplifying transistor 111, and the selection transistor 112 in the second semiconductor substrate 21 is shown.

As shown in FIG. 4, in the pixel 1, the first semiconductor substrate 20 and the second semiconductor 21 are connected by the connection electrode 1000 formed from the micro-pads 22, the micro-bumps 24, and the micro-pads 23 (see FIG. 3). In the circuit configuration shown in FIG. 4, the source terminal of the first amplifying transistor 105 configuring the photoelectric conversion circuit PD in the first semiconductor substrate 20 is connected to the drain terminal of the load transistor 106 and the first terminal of the clamp capacitor 107 configuring the memory circuit M in the second semiconductor substrate 21 via the connection electrode 1000. In the pixel 1, the first amplifying transistor 105 configuring the photoelectric conversion circuit PD and the load transistor 106 and the clamp capacitor 107 configuring the memory circuit M are configured to exchange electrical signals with each other via the connection electrode 1000.

For example, the photoelectric conversion element 101 is a photoelectric conversion element such as a photodiode configured to perform the photoelectric conversion with respect to the incident light to form (generate) the signal charge, and the photoelectric conversion element 101 is configured to hold and store the formed (generated) signal charge.

The transmission transistor 102 is configured to transmit the stored signal charge by the photoelectric conversion element 101 to the gate terminal of the first amplifying transistor 105 in response to the ON/OFF control by the transmission pulse φTX output from the vertical scanning circuit 3. At this time, the signal charge transmitted by the transmission transistor 102 is stored in the FD 103.

The FD 103 a capacitor accompanied to a node connected to the gate terminal of the first amplifying transistor 105, and the FD 103 is configured to temporarily hold and store the signal charge transmitted by the transmission transistor 102. In the circuit configuration shown in FIG. 4, the FD 103 is shown by a signature of a capacitor.

The FD-reset transistor 104 is configured to reset the signal charge held and stored in the FD 103 in response to the ON/OFF control of the FD-reset pulse φRST output from the vertical scanning circuit 3. The signal charge formed (generated), held, and stored by the photoelectric conversion element 101 can be reset by simultaneously controlling the FD-reset transistor 104 and the transmission transistor 102 to be turned ON. Reset of the FD 103 and the photoelectric conversion element 101 is to control the electric charge amount of the signal charge stored in the FD 103 and the photoelectric conversion element 101 and to set the state (electric potential) of the FD 103 and the photoelectric conversion element 101 at a reference state (reference electric potential, reset level). In the circuit configuration of the pixel 1 shown in FIG. 4, the state (electric potential) of the FD 103 and the photoelectric conversion element 101 is reset to the electric potential of the power voltage VDD.

The first amplifying transistor 105 is configured to amplify a signal according to the signal charge stored in the FD 103 to generate an amplified signal and output the amplified signal from the source terminal thereof. Accordingly, the amplified signal according to the signal charge of the photoelectric conversion element 101 is output (read) to the second semiconductor substrate 21 via the connection electrode 1000.

The load transistor 106 is configured to operate as a load of the first amplifying transistor 105 outputting the amplified signal in response to the ON/OFF control by the current control pulse φBias output from the vertical scanning circuit 3. The load transistor 106 is configured to supply the current for driving the first amplifying transistor 105 outputting the amplified signal to the first amplifying transistor 105. In the pixel 1, a source follower circuit is formed by the first amplifying transistor 105 and the load transistor 106.

The clamp capacitor 107 is a capacitor configured to clamp (fix) the voltage level of the amplified signal output from the first amplifying transistor 105.

The sample transistor 108 is configured to sample-hold the voltage level at the second terminal of the clamp capacitor 107 (the voltage level according to the amplified signal output by the first amplifying transistor 105) and make the analog memory 110 to hold and store the sample-held voltage level in response to the ON/OFF control according to the sample-hold pulse φSH output from the vertical scanning circuit 3.

The analog-memory-reset transistor 109 is configured to reset the voltage level of the clamp capacitor 107 and the analog memory 110 in response to the ON/OFF control of the clamp-and-memory-reset pulse φCL output from the vertical scanning circuit 3. It is possible to reset the voltage level of the second terminal of the clamp capacitor 107 by simultaneously controlling the analog-memory-reset transistor 109 and the sample transistor 108 to be turned ON. The reset of the analog memory 110 and the clamp capacitor 107 means to control the electric charge amount according to the sample-held and stored in the analog memory 110 and the clamp capacitor 107 and to set the state (electric potential) of the analog memory 110 and the clamp capacitor 107 to a reference state (reference electric potential, reset level). In the circuit configuration of the pixel 1 as shown in FIG. 4, the state (electric potential) of the analog memory 110 and the clamp capacitor 107 is reset to the electric potential of the power voltage VDD. Accordingly, the analog memory 110 and the clamp capacitor 107 hold the electric potential of the power voltage VDD.

The analog memory 110 is a capacitor configured to hold and store the signal of the voltage level according to the amplified signal which is output from the first amplifying transistor 105 and sample-held by the sample transistor 108. The pixel 1 is configured to perform a noise removal processing inside the pixel 1 itself so as to remove the noise component due to the leak current (dark current) by utilizing the configurations of the load transistor 106, the clamp capacitor 107, the sample transistor 108, the analog-memory-reset transistor 109, and the analog memory 110. Then, the analog memory 110 is configured to held and store the signal being processed by the noise removal processing in the pixel 1.

The capacity of the analog memory 110 is determined to be larger than that of the FD 103. A capacitor configured to generate a less leak current (dark current) per a unit area, such as a capacitor having a Metal-Insulator-Metal (MIM) structure, a capacitor having a Poly Silicon-Insulator-Poly Silicon (PIP) structure, and a capacitor having a Metal Oxide Semiconductor (MOS) structure is preferable to be used as the analog memory 110. Thus, the noise resistance of the pixel 1 can be improved so as to achieve a high-quality signal.

The second amplifying transistor 111 is configured to output an amplified signal generated by amplifying the voltage of the gate terminal, that is, the signal stored in the analog memory 110 and from which the noise is removed (hereinafter "noise removal signal") from the source terminal. In the pixel 1, a source follower circuit is configured by the second amplifying transistor 111 and a current source (not shown) as a load which is connected to the vertical signal line 9.

The selection transistor 112 is configured to output the amplified signal output from the second amplifying transistor 111 to the vertical signal line 9 as the pixel signal output by the pixel 1 in response to the selection of the pixel 1 due to the ON/OFF control of the selection pulse φSEL output from the vertical scanning circuit 3. Accordingly, the amplified signal (noise removal signal) according to the signal charge of the photoelectric element 101 is output (read) to the vertical signal line 9 as the pixel signal.

According to the pixel 1 having such a configuration, the amplified signal according to the signal charge which is generated due to the photoelectric conversion of the photoelectric conversion element 101 with respect to the incident light is read to the second semiconductor substrate 21 via the connection electrode 1000, and in the second semiconductor substrate 21, the signal whose noise component is removed is held and stored in the analog memory 110. Then, the pixel 1 is configured to output (read) the amplified signal (noise removal signal) according to the signal stored in the analog memory 110 to the vertical signal line 9 as the pixel signal in a sequence. In the solid-state imaging device 202, a plurality of the pixels 1 having such a configuration are arranged in a two-dimensional matrix in the pixel array section 2.

The arrangement of each circuit element configuring the pixel 1 in the semiconductor substrate is not limited to the configuration of the pixel 1 shown in FIG. 4. In the solid-state imaging device 202, it is only to arrange the photoelectric conversion element 101 in the first semiconductor substrate 20 and arrange the analog memory 110 in the second semiconductor substrate 21, and the other circuit elements may be arranged in either of the first semiconductor substrate 20 or the second semiconductor substrate 21.

In the circuit configuration of the pixel 1 shown in FIG. 4, the case in which the connection electrode 1000 is arranged in the path between the source terminal of the first amplifying transistor 105 in the first semiconductor substrate 20 and the drain terminal of the load transistor 106 and the first terminal of the clamp capacitor 107 in the second semiconductor substrate 21 is shown. However, the configuration of the connection electrode 1000 is not limited to the configuration of the pixel 1 shown in FIG. 4. The connection electrode 1000 can be arranged at any position in the path electrically connecting the second terminal of the photoelectric conversion element 101 and the first terminal of the analog memory 110.

With respect to the solid-state imaging device 202, during the manufacture of the solid-state imaging device 202, even if poor connections occur in a plurality of adjacent connection electrodes 1000, the first semiconductor substrate 20 and the second semiconductor 21 are connected with each other so as to prevent the plurality of adjacent pixels 1 from becoming defective pixels. For example, the poor connections of the connection electrodes 1000 can be considered as a short circuit (short) or an unconnection (open) occurs in the plurality of adjacent connection electrodes 1000 due to the shape abnormalities occurred in the micro-pads 22, the micro-bumps 24, and the micro-pads 25 configuring the connection electrode 1000, or the contamination of the foreign substances to the positions at which the connection electrodes 1000 are formed.

(First Embodiment)

Figure 5:
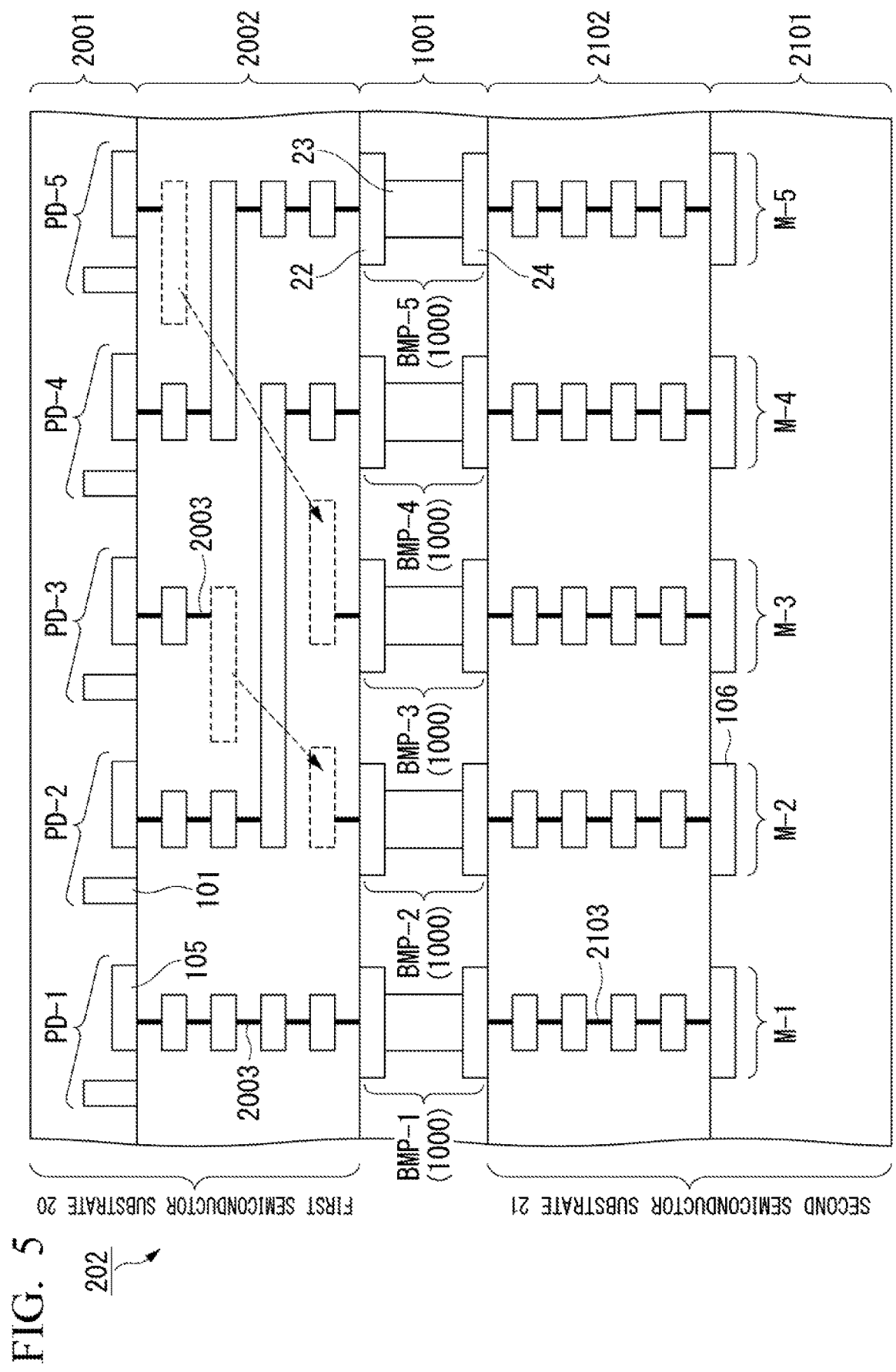
FIG. 5 is a schematic view showing a cross-sectional structure example of a pixel array section of the solid-state imaging device according to a first embodiment of the present invention.

Next, the connection of the first semiconductor substrate 20 and the second semiconductor substrate 21 in the solid-state imaging device 202 will be described. FIG. 5 is a schematic view showing a cross-sectional structure example of a pixel array section 2 of the solid-state imaging device 202 according to a first embodiment of the present invention. In FIG. 5, the cross-sectional structure of the area formed by five pixels 1 arranged in the pixel array section 2 in the solid-state imaging device 202 according to the first embodiment is shown. As shown in FIG. 5, the five photoelectric conversion circuits PD formed in the first semiconductor substrate 20, the five memory circuits M formed in the second semiconductor substrate 21, and the five connection electrodes 1000 (hereinafter "connection electrodes BMP") configuring the five pixels 1 are shown. In the cross-sectional structure of the solid-state imaging device 202, the actual configuration of the layers and the ratio of the thickness of the layers configuring the solid-state imaging device 202 and each semiconductor substrate are not limited to the configuration of the layers and the ratio of the thickness of the layers as shown in FIG. 5.

In the description below, in order to distinguish the photoelectric conversion circuit PD, the memory circuit M, and the connection electrode BMP configuring each of the five pixels 1, a number indicating the arranged sequence of each configuration element will be affixed to the numeral sign designated to each configuration element after a symbol "-". More specifically, in FIG. 5, since the five pixels 1 are arranged in sequence, a number from 1 to 5 is affixed to the corresponding configuration element in the sequence from the left side so as to indicate the photoelectric conversion circuits PD as "photoelectric conversion circuit PD-1" to "photoelectric conversion circuit PD-5", indicate the connection electrodes BMP as "connection electrodes BMP-1" to "connection electrodes BMP-5", and indicate the memory circuits M as "memory circuit M-1" to "memory circuit M-5".

The first semiconductor substrate 20 is formed by a semiconductor layer (hereinafter "first semiconductor layer") 2001 and a wiring layer (hereinafter "first wiring layer") 2002. The first semiconductor layer 2001 is formed by each circuit element configuring the photoelectric conversion circuit PD. In FIG. 5, it is shown that the photoelectric conversion element 101 and the first amplifying transistor 105 configuring each photoelectric conversion circuit PD are formed in the first semiconductor layer 2001 is shown. Also, metal wirings 2003 configured to connect each circuit element configuring the photoelectric conversion circuit PD are formed in the first wiring layer 2002. In FIG. 5, it is shown that each metal wiring 2003 configured to connect the first amplifying transistor 105 and the corresponding connection electrodes BMP is formed in the first wiring layer 2002. Also, in FIG. 5, the arrow head mark in broken line indicates that the metal wirings 2003 are connected thereto in an inward direction of the first semiconductor substrate 20 (not shown in FIG. 5).

The second semiconductor substrate 21 is formed by a semiconductor layer (hereinafter "second semiconductor layer") 2101 and a wiring layer (hereinafter "second wiring layer") 2102. The second semiconductor substrate 21 may be configured to have a support substrate configured to support the solid-state imaging device 202 by stacking the support substrate on the surface of the second semiconductor layer 2101 opposite to the surface thereof on which the second wiring layer 2102 is formed. Each circuit element configuring the memory circuit M is formed in the second semiconductor layer 2101. In FIG. 5, it is shown that the load transistor 106 configuring each memory circuit m is formed in the second semiconductor layer 2101. Metal wirings 2103 configured to connect each circuit element configuring the memory circuit M are formed in the second wiring layer 2102. In FIG. 5, it is shown the each metal wiring 2103 configured to connect the load transistor 106 and the corresponding connection electrodes BMP is formed in the second wiring layer 2102.

The first semiconductor substrate 20 and the second semiconductor substrate 21 are bonded (aligned and adhered) by bonding the first wiring layer 2002 and the second wiring layer 2102 facing each other via a connection layer 1001. In the connection layer 1001, the connection electrodes BMP are formed and the wirings of the first wiring layer 2002 and the second wiring layer 2102 are connected by the corresponding connection electrodes BMP. More specifically, the metal wirings 2003 formed in the first wiring layer 2002 of the first semiconductor substrate 20 and the metal wirings 2103 formed in the second wiring layer 2102 of the second semiconductor substrate 21 are connected by the corresponding connection electrodes BMP.

In the solid-state imaging device 202, in order to prevent the plurality of adjacent pixels 1 from becoming defective pixels even if the poor connections occur in the plurality of adjacent connection electrodes BMP, the metal wirings 2003 are formed in the first wiring layer 2002 so as to avoid connecting the adjacent photoelectric conversion circuits PD to the memory circuits M by the adjacent connection electrodes BMP. In other words, in the solid-state imaging device 202, the metal wirings 2003 are formed in the first wiring layer 2002 so as to connect the adjacent photoelectric conversion circuits PD to the memory circuits M by the connection electrodes BMP which are not adjacent to each other and arranged in separated positions. In an example of the cross-sectional structure of the solid-state imaging device 202 as shown in FIG. 5, the metal wirings 2003 are formed in the first wiring layer 2002 such that the photoelectric conversion circuit PD-1 is connected to the memory circuit M-1 via the connection electrode BMP-1 and the photoelectric conversion circuit PD-2 is connected to the memory circuit M-4 via the connection electrode BMP-4. Also, in the example of the cross-sectional structure of the solid-state imaging device 202 as shown in FIG. 5, the metal wirings 2003 are formed in the first wiring layer 2002 such that the photoelectric conversion circuit PD-3 is connected to the memory circuit M-2 via the connection electrode BMP-2, the photoelectric conversion circuit PD-4 is connected to the memory circuit M-5 via the connection electrode BMP-5, and the photoelectric conversion circuit PD-5 is connected to the memory circuit M-3 via the connection electrode BMP-3.

In the solid-state imaging device 202, the pixel 1 is configured by the photoelectric conversion circuit PD and the memory circuit M connected by the connection electrode BMP. In the example of the cross-sectional structure of the solid-state imaging device 202 as shown in FIG. 5, the pixel 1 is configured by the photoelectric conversion circuit PD-1 and the memory circuit M-1 connected by the connection electrode BMP-1, and a pixel is configured by the photoelectric conversion circuit PD-2 and the memory circuit M-4 connected by the connection electrode BMP-4. Also, in the example of the cross-sectional structure of the solid-state imaging device 202 as shown in FIG. 5, the pixel 1 is configured by each of the photoelectric conversion circuit PD-3 and the memory circuit M-2 connected by the connection electrode BMP-2, the photoelectric conversion circuit PD-4 and the memory circuit M-5 connected by the connection electrode BMP-5, and the photoelectric conversion circuit PD-5 and the memory circuit M-3 connected by the connection electrode BMP-3. In this way, in the solid-state imaging device 202, the photoelectric conversion circuit PD and the memory circuit M configuring the pixel 1 are not limited to be arranged in the positions facing each other in the first semiconductor substrate 20 and the second semiconductor substrate 21. In order to make the description easy to understand, in the description regarding the position of the pixel 1 shown below, a case in which the position of the photoelectric conversion circuit PD between the photoelectric conversion circuit PD and the memory circuit M configuring the pixel 1 is treated as the position at which the pixel 1 is arranged will be described.

Figure 6:
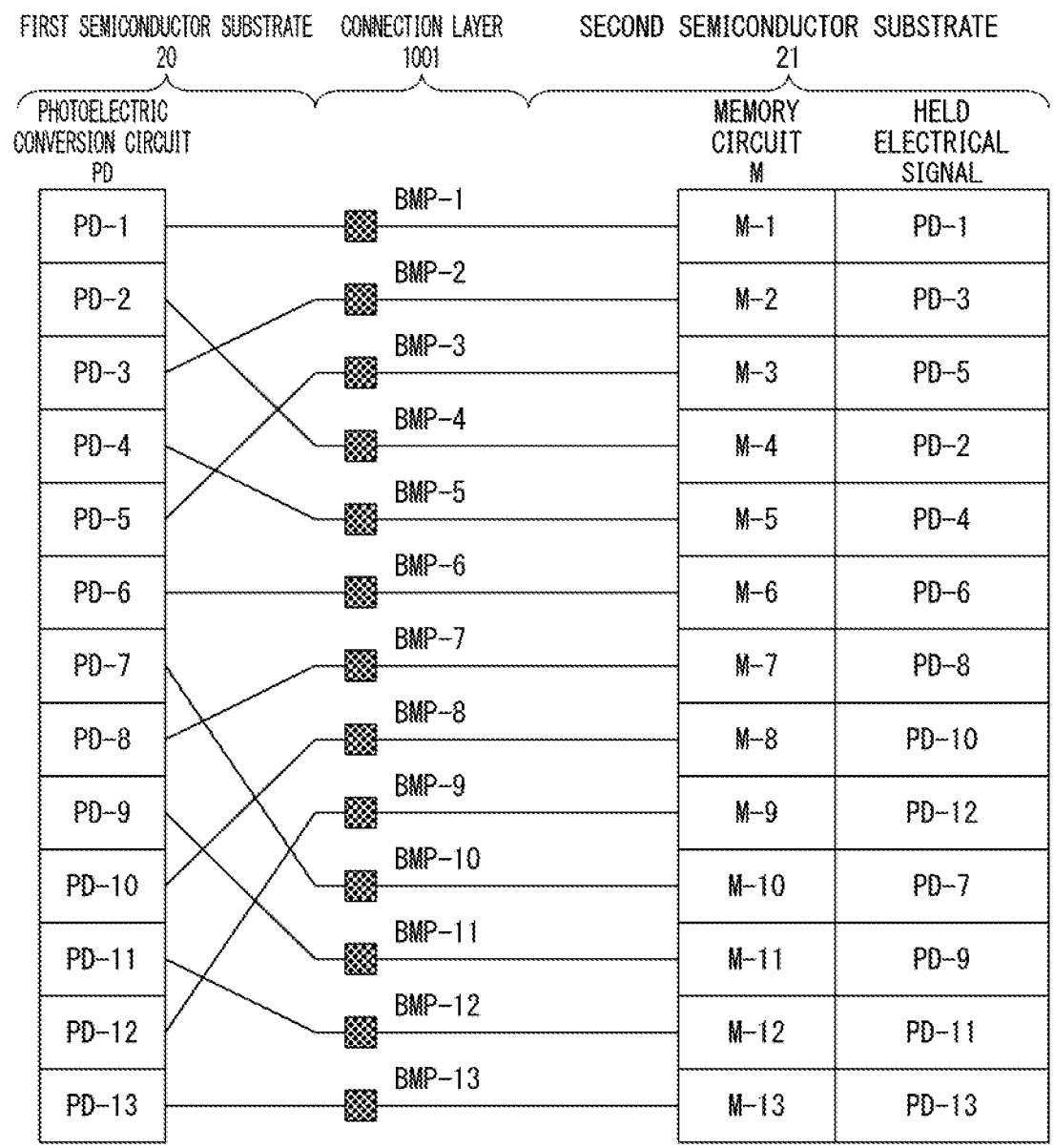
FIG. 6 is a view showing a connection relationship example between a photoelectric conversion circuit configured in a first semiconductor substrate and a memory circuit configured in a second semiconductor substrate in the solid-state imaging device according to the first embodiment of the present invention.

FIG. 6 is a view showing an example of the connection relationship between the photoelectric conversion circuit PD formed in the first semiconductor substrate 20 and the memory circuit M formed in the second semiconductor substrate 21 in the solid-state imaging device 202 according to the first embodiment of the present invention. FIG. 6 is provided to show the connection electrode BMP through which the photoelectric conversion circuit PD is connected to the memory circuit M, in the solid-state imaging device 202. Also, FIG. 6 is provided to show the photoelectric conversion circuit PD from which the electrical signals held by the memory circuit M are output, in the solid-state imaging device 202.

As described above, in the solid-state imaging device 202, the plurality of pixels 1 arranged in the two-dimensional matrix are arranged in the pixel array section 2. In order to make the description shown below easy to understand, the connection relationship between the photoelectric conversion circuit PD and the memory circuit M will be described by focusing on the thirteen pixels 1 arranged in the same row in the pixel array section 2. Additionally, in the pixel array section 2, the connection relationship between the photoelectric conversion circuit PD and the memory circuit M regarding the plurality of pixels 1 arranged in the same column can be considered in the same way as the description shown below.

In the description below, in order to distinguish the photoelectric conversion circuit PD, the memory circuit M, and the connection electrode BMP configuring each of the thirteen pixels 1, as the same manner shown in FIG. 5, the number indicating the arranged sequence of each configuration element will be affixed to the numeral sign designated to each configuration element after a symbol "-". In FIG. 6, since the thirteen pixels 1 are arranged in sequence, a number from 1 to 13 is affixed to the corresponding configuration element in the sequence same as the arranged sequence of the thirteen pixels 1 after the symbol "-" in order to distinguish each of the thirteen pixels 1. More specifically, the pixel 1 having the uppermost photoelectric conversion circuit PD-1 in FIG. 6 (leftmost in FIG. 5) is shown as "pixel 1-1", and the pixel 1 having the photoelectric conversion circuit PD-2 as the second from the top in FIG. 6 (the second from the left in FIG. 5) is shown as "pixel 1-2".

In the example of the connection relationship shown in FIG. 6, in the same way as the example of the cross-sectional structure shown in FIG. 5, the photoelectric conversion circuit PD-1 is connected to the memory circuit M-1 via the connection electrode BMP-1. Accordingly, the electrical signals output by the photoelectric conversion circuit PD-1 are held by the memory circuit M-1. More specifically, the amplified signals according to the signal charge generated by the photoelectric conversion with respect to the incident light L performed by the photoelectric conversion element 101 configuring the photoelectric conversion circuit PD-1 formed in the first semiconductor substrate 20 are read to the second semiconductor substrate 21 via the connection electrode BMP-1, then the amplified signals are held and stored in the analog memory 110 after removing the noise component of the amplified signals by the memory circuit M-1 formed in the second semiconductor substrate 21.

In the example of the connection relationship shown in FIG. 6, similar as the example of the cross-sectional structure shown in FIG. 5, the photoelectric conversion circuit PD-2 is connected to the memory circuit M-4 via the connection electrode BMP-4. Accordingly, the electrical signals output from the photoelectric conversion circuit PD-2 are held by the memory circuit M-4. More specifically, the amplified signals according to the signal charge generated by the photoelectric conversion with respect to the incident light L performed by the photoelectric conversion element 101 configuring the photoelectric conversion circuit PD-2 formed in the first semiconductor substrate 20 are read to the second semiconductor substrate 21 via the connection electrode BMP-4, then the amplified signals are held and stored in the analog memory 110 after removing the noise component of the amplified signals by the memory circuit M-4 formed in the second semiconductor substrate 21.

In the example of the connection relationship shown in FIG. 6, similar as the example of the cross-sectional structure shown in FIG. 5, the photoelectric conversion circuit PD-3 is connected to the memory circuit M-2 via the connection electrode BMP-2, the photoelectric conversion circuit PD-4 is connected to the memory circuit M-5 via the connection electrode BMP-5, and the photoelectric conversion circuit PD-5 is connected to the memory circuit M-3 via the connection electrode BMP-3. Accordingly, the electrical signals output from the photoelectric conversion circuit PD-3, the photoelectric conversion circuit PD-4, and the photoelectric conversion circuit PD-5 are held by the memory circuit M-2, the memory circuit M-5, and the memory circuit M-3.

In the solid-state imaging device 202, each of the five pairs of the connection relationship between the photoelectric conversion circuit PD and the memory circuit M is regarded as a unit (hereinafter "connection unit"), and the connection relationship by the connection unit is repeated periodically. Accordingly, in the solid-state imaging device 202, even if the poor connection such as the short circuit (short) or the unconnection (open) occurs in the two adjacent connection electrodes BMP among the five connection electrodes BMP-1 to BMP-5, the situation in which the two adjacent pixels 1 become defective pixels is avoided. For example, in a situation when the poor connection occurs in the adjacent connection electrode BMP-2 and the connection electrode BMP-3, two of the pixel 1-3 and the pixel 1-5 become the defective pixels. In other words, even if in the situation when the poor connection occurs in the adjacent connection electrode BMP-2 and the connection electrode BMP-3, the pixel 1-1, the pixel 1-2, the pixel 1-4, and the pixel 1-6 do not become the defective pixels. Accordingly, the image signal in which two of the pixel 1-3 and the pixel 1-5 are defective pixels 1 are output from the solid-state imaging device 202 to the image-processing unit 203, and the image-processing unit 203 can generate (interpolate) the image signals of the defective pixel 1-3 and the defective pixel 1-5 by the image processing of the defective pixel correction using the image signals in the periphery thereof. More specifically, the image-processing unit 203 can generate (interpolate) the image signal of the pixel 1-3 using the image signal of the pixel 1-2 and the image signal of the pixel 1-4, and the image-processing unit 203 can generate (interpolate) the image signal of the pixel 1-5 using the image signal of the pixel 1-4 and the image signal of the pixel 1-6.

In the solid-state imaging device 202, the connection relationship of the photoelectric conversion circuit PD and the memory circuit M changed in the connection unit is not limited to the five connection relationships between the photoelectric conversion circuit PD and the memory circuit M shown as above. For example, according to the number of the adjacent connection electrodes BMP in which the poor connection is possible to occur during the manufacture of the solid-state imaging device 202, the connection between the photoelectric conversion circuit PD and the memory circuit M may be suitably determined to a different connection (connection relationship). Also, multiple connection relationships may be applied.

The connection unit repeated in the solid-state imaging device 202 is not limited to a single type and may be multiple types. In the example of the connection relationship shown in FIG. 6, an example of applying a connection unit by the seven pixels 1 including the pixel 1-6 to the pixel 1-12 different from a connection unit applied to the five pixels 1 including the pixel 1-1 to the pixel 1-5 is shown. More specifically, in the example of the connection relationship shown in FIG. 6, the connection unit is determined that the photoelectric conversion circuit PD-6 and the memory circuit M-6 are connected via the connection electrode BMP-6, the photoelectric conversion circuit PD-7 and the memory circuit M-10 are connected via the connection electrode BMP-10, the photoelectric conversion circuit PD-8 and the memory circuit M-7 are connected via the connection electrode BMP-7, the photoelectric conversion circuit PD-9 and the memory circuit M-11 are connected via the connection electrode BMP-11, the photoelectric conversion circuit PD-10 and the memory circuit M-8 are connected via the connection electrode BMP-8, the photoelectric conversion circuit PD-11 and the memory circuit M-12 are connected via the connection electrode BMP-12, and the photoelectric conversion circuit PD-12 and the memory circuit M-9 are connected via the connection electrode BMP-9.

Accordingly, the electrical signals output by the photoelectric conversion circuit PD-6 are held by the memory circuit M-6, the electrical signals output by the photoelectric conversion circuit PD-7 are held by the memory circuit M-10, the electrical signals output by the photoelectric conversion circuit PD-8 are held by the memory circuit M-7, the electrical signals output by the photoelectric conversion circuit PD-9 are held by the memory circuit M-11, the electrical signals output by the photoelectric conversion circuit PD-10 are held by the memory circuit M-8, the electrical signals output by the photoelectric conversion circuit PD-11 are held by the memory circuit M-12, and the electrical signals output by the photoelectric conversion circuit PD-12 are held by the memory circuit M-9. As described above, the solid-state imaging device 202 may be configured to have the multiple connection units repeated periodically.

As shown in FIG. 6, in the case in which the connection unit by the seven pixels 1 including the pixel 1-6 to the pixel 1-12 are applied to the solid-state imaging device 202, even if the poor connection such as the short circuit (short) or the unconnection (open) occurs in the adjacent three connection electrodes BMP among the electrode BMP-6 to the electrode BMP-12 of the solid-state imaging device 202, the situation in which the two adjacent pixels 1 become the defective pixels is avoided. Accordingly, the image-processing unit 203 can generate (interpolate) the image signal of the defective pixel 1 by the image processing of the defective pixel correction using the image signals of the pixels 1 in the periphery thereof.

As shown in FIG. 6, in the solid-state imaging device 202, the electrical signals output from each of the photoelectric conversion circuits PD and held by each of the memory circuits M are not in the same sequence as the sequence in which the photoelectric conversion circuits PD are arranged in the first semiconductor substrate 20. In other words, when the solid-state imaging device 202 performs the column processing with respect to the amplified signals (noise removal signals) held by the memory circuits M and output (read) the processed amplified signals to the vertical signal line 9 as the pixel signals in the sequence as it is now, the pixel signals input to the image-processing unit 203 have a sequence different from the sequence of the pixels 1 arranged in the pixel array section 2 of the solid-state imaging device 202. Accordingly, in the imaging apparatus 200 having the solid-state imaging device 202, the image-processing unit 203 is configured to perform an image-processing of rearranging the image signals output from the solid-state imaging device 202 into the sequence same as the sequence of the pixels 1 arranged in the pixel array section 2 of the solid-state imaging device 202. Regarding the image-processing of rearranging the image signals in the image-processing unit 203, if the sequence of the image signals output from the solid-state imaging device 202 is known in advance, it is easy to perform such image-processing of rearranging the image signals by using the conventional technology.

The same function of the rearrangement image-processing performed by the image-processing unit 203 may be implemented in the solid-state imaging device 202. For example, the solid-state imaging device 202 may have a rearrangement circuit (not shown) configured to perform the same rearrangement image-processing by the image-processing unit 203. In this case, in the imaging apparatus 200 having the solid-state imaging device 202, since the image signals input to the image-processing unit 203 have been rearranged by the rearrangement circuit (not shown) so as to be in the same sequence as that of the pixels 1 arranged in the pixel array section 2 of the solid-state imaging device 202, the image-processing unit 203 may not perform the rearrangement image-processing. Also, the rearrangement image-processing in the solid-state imaging device 202 may be implemented by changing the sequence of selecting the column processing circuits 4 to the sequence of the pixels 1 by the horizontal read circuit 5, when the pixel signals generated by performing the column processing with respect to the amplified signals (noise removal signal) held by the memory circuits M are output (read) to the horizontal signal line 10. At this time, changing the sequence of selecting the column processing circuits 4 by the horizontal read circuit 5 can be easily performed since the photoelectric conversion circuit PD corresponding to each of the memory circuit M is known in advance.

According to the first embodiment of the present invention, in the solid-state imaging device (solid-state imaging device 202) formed by stacking the plurality of semiconductor substrates, the circuit elements configuring the pixels (pixels 1) are divided and distributed in the plurality of semiconductor substrates. The solid-state imaging device has the first semiconductor substrate (first semiconductor substrate 20), the second semiconductor substrate (second semiconductor substrate 21), and the plurality of connection electrodes (connection electrodes 1000, electrodes BMP). The first semiconductor substrate has the plurality of photoelectric conversion circuits (photoelectric conversion circuits PD) forming a two-dimensional array, wherein each of the plurality of photoelectric conversion circuits has a part of the circuit elements (a plurality of transistors, capacitors, and the like) including the photoelectric conversion element (photoelectric conversion element 101) configured to transform incident light to an electrical signal. The second semiconductor substrate has the plurality of signal processing circuits (for example, the memory circuits M configured by the analog memory, the plurality of transistors, capacitors, and the like) forming a two-dimensional array, wherein each of the plurality of signal processing circuits has another part of the circuits elements of the pixels 1 configured to process the electrical signal output by the plurality of photoelectric conversion circuits PD, and a number of the plurality of signal processing circuits is equal to a number of the plurality of photoelectric conversion circuits. The plurality of connection electrodes are formed in a two-dimensional array between the first semiconductor substrate and the second semiconductor substrate, wherein the plurality of connection electrodes are configured to electrically connect the signal lines of the plurality of photoelectric conversion circuits PD and the signal lines of the plurality of signal processing circuits. A pixel set (pixel 1) is defined by having at least one of the plurality of photoelectric conversion circuits PD. The photoelectric conversion circuits included in the two adjacent pixel sets (pixels 1) are connected to the corresponding signal processing circuits (memory circuits M) via the different connection electrodes BMP formed at separated positions so as to not be adjacent to each other.

According to the first embodiment of the present invention, in the solid-state imaging device 202, each of the photoelectric conversion circuits PD included in the adjacent pixel sets (pixels 1) is connected to each of the signal processing circuit (memory circuit M) by the different connection electrodes which are formed at separated positions in either of the row direction or the column direction adjacent to the photoelectric conversion circuit.

According to the first embodiment of the present invention, in the solid-state imaging device 202, a connection unit is defined by including a predetermined number of the pixel sets (pixels 1), and each of the photoelectric conversion circuits PD included in the adjacent pixel sets (pixels 1) is connected to the corresponding signal processing circuit (memory circuit M) via the different connection electrodes BMP which are formed at separated positions by a cycle of the connection unit.

According to the first embodiment of the present invention, in the solid-state imaging device 202, the connection units have multiple variations in either of the row direction or the column direction adjacent to the pixel sets (pixels 1), and the multiple variations of the connection units are periodically repeated in either of the row direction or the column direction adjacent to the pixel sets (pixels 1).

According to the first embodiment of the present invention, in the solid-state imaging device 202, image signals according to the electrical signals processed by the signal processing circuits (memory circuits M) connected to the photoelectric conversion circuits PD are output in a sequence same as a sequence in which the photoelectric conversion elements 101 formed in the first semiconductor substrate 20 are queued.

According to the first embodiment of the present invention, an imaging apparatus (imaging apparatus 200) is configured to have the solid-state imaging device (solid-state imaging device 202), and an image-processing unit (image-processing unit 203) configured to rearrange the image signals output from the solid-state imaging device in a sequence in which the photoelectric conversion elements (photoelectric conversion elements 101) are queued, the photoelectric conversion elements being configured to transform light incident on the solid-state imaging device 202 to electrical signals for generating the image signals.

As described above, according to the solid-state imaging device 202 according to the first embodiment, in the first semiconductor substrate 20 in which the photoelectric conversion circuits PD are formed, the position of the connection electrode 1000 corresponding to each photoelectric conversion circuit PD is changed such that the adjacent photoelectric conversion circuits PD are connected to the memory circuits M via the connection electrodes 1000 (connection electrodes BMP) formed at separated positions so as to not to be adjacent. Accordingly, in the solid-state imaging device 202 according to the first embodiment, even if poor connection such as the short circuit (short) or the unconnection (open) occurs in the plurality of connection electrodes 1000 adjacent to each other, the adjacent pixels 1 are prevented from becoming defective pixels. In other words, in the solid-state imaging device 202 according to the first embodiment, defects of the pixels 1 due to the poor connection of the plurality of connection electrodes 1000 adjacent to each other are distributed so as to reduce the possibility of the continuing defects occurred in the plurality of pixels 1. Accordingly, in the imaging apparatus 200 having the solid-state imaging device 202 according to the first embodiment, it is possible to prevent the lowering of the precision of the defective pixel correction so as to prevent the lowering of the image quality. For example, in the solid-state imaging device 202 according to the first embodiment, even if poor connection such as the short circuit (short) or the unconnection (open) occurs in the adjacent two connection electrodes 1000, the two adjacent pixels 1 are prevented from becoming defective pixels. Accordingly, in the imaging apparatus 200 having the solid-state imaging device 202 according to the first embodiment, it is possible to generate (interpolate) the image signal of the defective pixel 1 without lowering the precision of the defective pixel correction so as to capture the image while preventing the lowering of the image quality.

(Second Embodiment)

Figure 7:
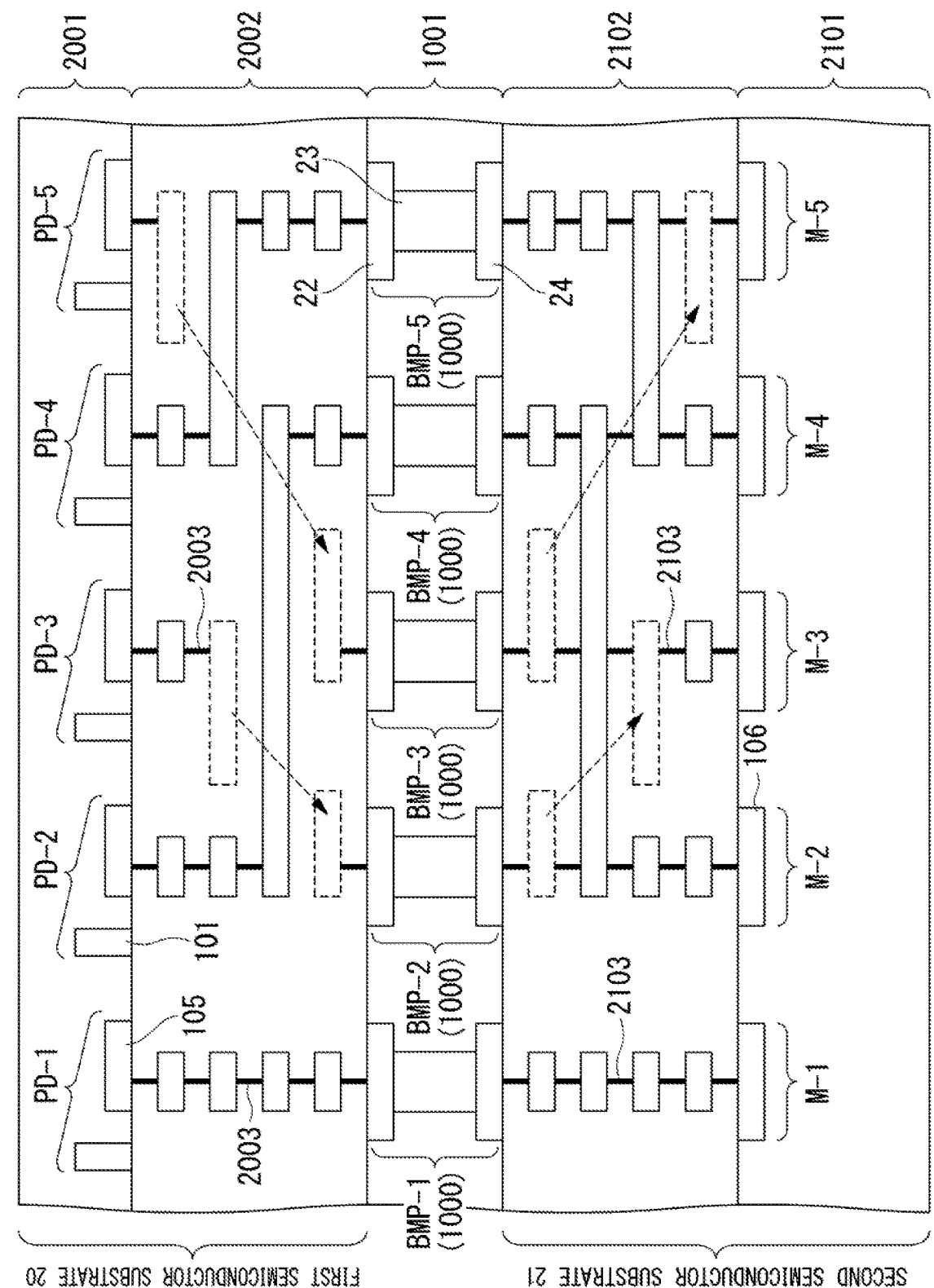
FIG. 7 is a schematic view showing a cross-sectional structure example of a pixel array section of the solid-state imaging device according to a second embodiment of the present invention.

Next, another connection of the first semiconductor substrate 20 and the second semiconductor substrate 21 in the solid-state imaging device 202 will be described. In the following description, the solid-state imaging device 202 according to the second embodiment will be identified as a solid-state imaging device 212. FIG. 7 is a schematic view showing a cross-sectional structure example of the pixel array section 2 of the solid-state imaging device 202 (solid-state imaging device 212) according to the second embodiment of the present invention. In FIG. 7, in the same way as the cross-sectional structure example of the solid-state imaging device 202 according to the first embodiment shown in FIG. 5, the cross-sectional structure example of the region in which five pixels 1 are formed in the pixel array section 2 of the solid-state imaging device 212 is shown. In FIG. 7, in the same way as the cross-sectional structure example of the solid-state imaging device 202 according to the first embodiment shown in FIG. 5, the five photoelectric conversion circuits PD formed in the first semiconductor substrate 20, the five memory circuits M formed in the second semiconductor substrate 21, and the five connection electrodes 1000 (connection electrodes BMP) for configuring the five pixels 1 are shown. In the cross-sectional structure of the solid-state imaging device 212 shown in FIG. 7, in the same way as the cross-sectional structure example of the solid-state imaging device 202 according to the first embodiment shown in FIG. 5, with regard to the solid-state imaging device 212 and each semiconductor substrate, actual configurations of the layers and the ratio of the thickness of the layers are not limited thereto.

In the description below, in the same way as the first embodiment, the photoelectric conversion circuits PD, the memory circuits M, and the connection electrodes BMP configuring each of the five pixels 1 are distinguished with each other by affixing a number from 1 to 5 indicating the arranged sequence of the five pixels after a symbol "-" to the numeral sign designated to each configuration element of the pixel 1.

In the solid-state imaging device 212, in the same way as the solid-state imaging device 202 according to the first embodiment, even if the poor connection occurs in the plurality of connection electrodes BMP adjacent to each other, the first semiconductor substrate 20 and the second semiconductor substrate 21 are formed so as to prevent the plurality of pixels 1 adjacent to each other from becoming defective pixels.

In the solid-state imaging device 212, the first semiconductor substrate 20 is formed by the first semiconductor layer 2001 and the first wiring layer 2002. The first semiconductor substrate 20 in the solid-state imaging device 212 is same as the first semiconductor substrate 20 in the solid-state imaging device 202 according to the first embodiment shown in FIG. 5. Accordingly, detailed descriptions of the first semiconductor substrate 20 will be omitted.

In the solid-state imaging device 212, the second semiconductor substrate 21 is formed by the second semiconductor layer 2101 and the second wiring layer 2102. In the same way as the first semiconductor substrate 20 in the solid-state imaging device 202 according to the first embodiment shown in FIG. 5, in the solid-state imaging device 212, a support substrate configured to support the solid-state imaging device 212 may be formed and stacked to the second semiconductor substrate 21. The second semiconductor substrate 21 in the solid-state imaging device 212 is the same as the second semiconductor substrate 21 of the solid-state imaging device 202 according to the first embodiment as shown in FIG. 5.

However, with respect to the second semiconductor substrate 21 in the solid-state imaging device 212, the wiring configuration of the metal wirings 2103 formed in the second wiring layer 2102 is different from that of the second semiconductor substrate 21 in the solid-state imaging device 202 according to the first embodiment shown in FIG. 5. In the second wiring layer 2102 of the solid-state imaging device 212, each metal wiring 2103 configured to connect the connection electrode BMP and the corresponding load transistor 106 is formed for restoring the connection relationships between the adjacent photoelectric conversion circuits PD or the adjacent connecting electrodes BMP whose connection relationship are changed by the metal wirings 2003 formed in the first wiring layer 2002 of the first semiconductor substrate 20. In other words, the metal wirings 2103 in the second wiring layer 2102 are formed so as to connect the signals output from the photoelectric conversion circuits PD in a sequence different from that of the photoelectric conversion circuits PD arranged in the first semiconductor substrate 20 to the memory circuits M which are rearranged in the same sequence with that of the photoelectric conversion circuits PD. More specifically, in the solid-state imaging device 212, the metal wirings 2103 in the second wiring layer 2102 are formed so as to hold and store the amplified signals according to the signal charge of the photoelectric conversion elements 101 from the adjacent photoelectric conversion circuits PD in the analog memory 110, wherein the amplified signals are output (read) to the second semiconductor substrate 21 via the separated connection electrodes BMP, and the amplified signals are processed by the adjacent memory circuits M for removing the noise component. In FIG. 7, a state is shown that each metal wiring 2103 for connecting the connection electrode BMP and the corresponding load transistor 106 is formed in the second wiring layer 2102. In FIG. 7, the arrow head mark in broken line shown in the second wiring layer 2102 indicates that the metal wirings 2103 are connected thereto in an inward direction of the second semiconductor substrate 21 (not shown in FIG. 7).

In the cross-sectional structure example of the solid-state imaging device 212 shown in FIG. 7, the metal wirings 2103 in the second wiring layer 2102 is formed such that the photoelectric conversion circuit PD-1 is connected to the memory circuit M-1 via the connection electrode BMP-1, and the photoelectric conversion circuit PD-2 is connected to the memory circuit M-2 via the connection electrode BMP-4. Also, In the cross-sectional structure example of the solid-state imaging device 212 shown in FIG. 7, the metal wirings 2103 in the second wiring layer 2102 is formed such that the photoelectric conversion circuit PD-3 is connected to the memory circuit M-3 via the connection electrode BMP-2, the photoelectric conversion circuit PD-4 is connected to the memory circuit M-4 via the connection electrode BMP-5, and the photoelectric conversion circuit PD-5 is connected to the memory circuit M-5 via the connection electrode BMP-3.

In the solid-state imaging device 212, in the same way as the solid-state imaging device 202 according to the first embodiment, the first wiring layer 2002 and the second wiring layer 2102 facing each other are bonded (aligned and adhered) via the connection layer 1001. The connection layer 1001 of the solid-state imaging device 212 is the same as the connection layer 1001 of the solid-state imaging device 202 according to the first embodiment shown in FIG. 5. Thus, a detailed description of the connection layer 1001 will be omitted.

Accordingly, in the solid-state imaging device 212, a single pixel 1 is configured by the photoelectric conversion circuit PD and the memory circuit M formed at the positions facing each other in the first semiconductor substrate 20 and the second semiconductor substrate 21. In the cross-sectional structure example of the solid-state imaging device 212 shown in FIG. 7, one pixel 1 is formed by the photoelectric conversion circuit PD-1 and the memory circuit M-1 connected by the connection electrode BMP-1, and another pixel 1 is formed by the photoelectric conversion circuit PD-2 and the memory circuit M-2 connected by the connection electrode BMP-4. Also, in the cross-sectional structure example of the solid-state imaging device 212 shown in FIG. 7, one pixel 1 is formed by the photoelectric conversion circuit PD-3 and the memory circuit M-3 connected by the connection electrode BMP-2, another pixel 1 is formed by the photoelectric conversion circuit PD-4 and the memory circuit M-4 connected by the connection electrode BMP-5, and a further pixel 1 is formed by the photoelectric conversion circuit PD-5 and the memory circuit M-5 connected by the connection electrode BMP-3. In the following description regarding the arranged position of the pixel 1, between the photoelectric conversion circuit PD and the memory circuit M configuring the pixel 1, the position at which the photoelectric conversion circuit PD is arranged will be described as the position at which the pixel 1 is arranged.

Figure 8:
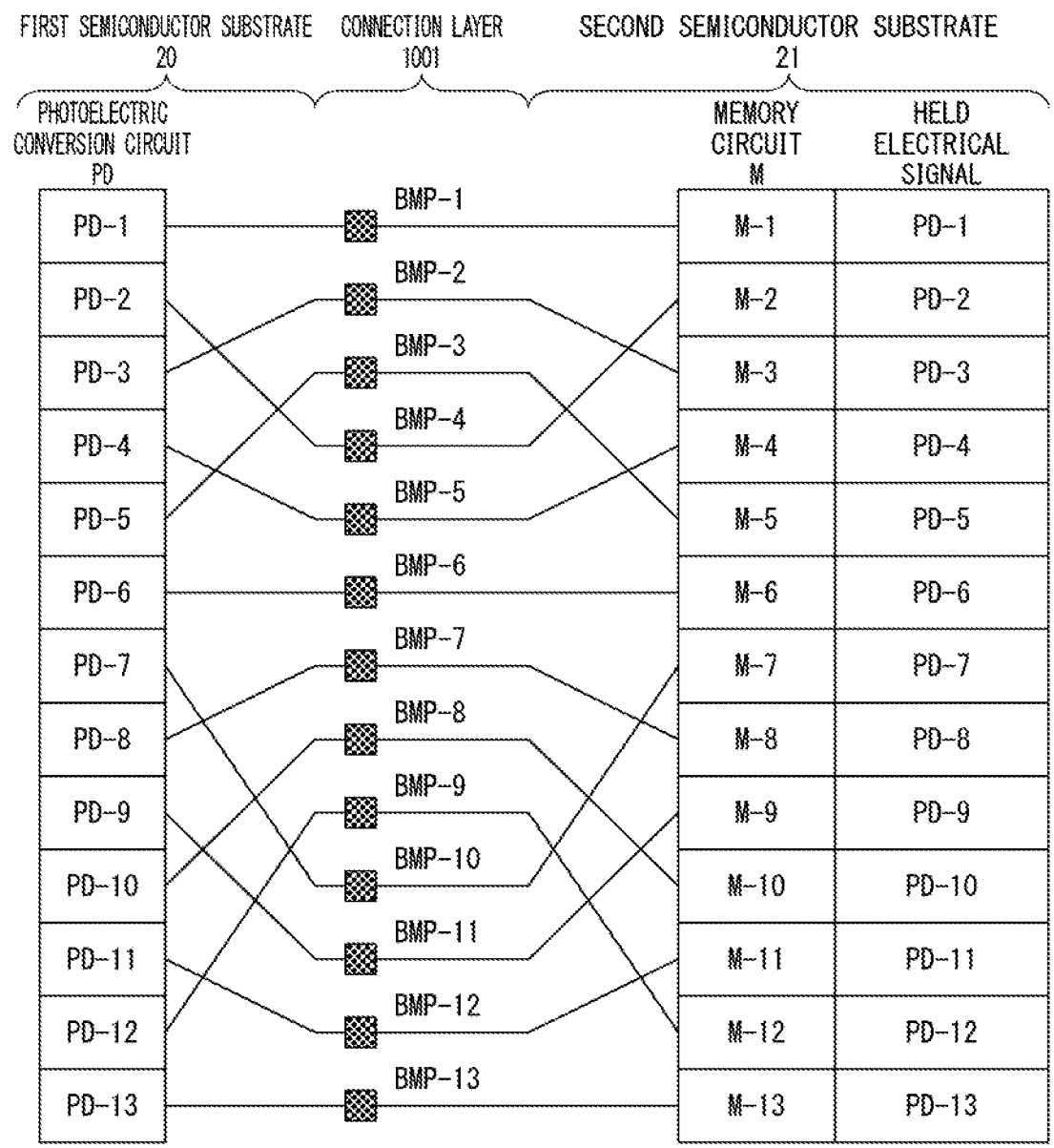
FIG. 8 is a view showing a connection relationship example between a photoelectric conversion circuit configured in a first semiconductor substrate and a memory circuit configured in a second semiconductor substrate in the solid-state imaging device according to the second embodiment of the present invention.

FIG. 8 is a view showing a connection relationship example between the photoelectric conversion circuit PD formed in the first semiconductor substrate 20 and the memory circuit M formed in the second semiconductor substrate 21 in the solid-state imaging device 212 according to the second embodiment. In the same way as the connection relationship example of the solid-state imaging device 202 according to the first embodiment shown in FIG. 6, FIG. 8 is provided to show the connection electrode BMP through which the photoelectric conversion circuit PD is connected to the memory circuit M, in the solid-state imaging device 212. Also, in the same way as the connection relationship example of the solid-state imaging device 202 according to the first embodiment shown in FIG. 6, FIG. 8 is provided to show the photoelectric conversion circuits PD from which the electrical signals held by the memory circuit M are output, in the solid-state imaging device 212.

With regard to the description of FIG. 8, in the same way as the first embodiment, in order to make the description easy to understand, the connection relationship between the photoelectric conversion circuit PD and the memory circuit M will be described by focusing on the thirteen pixels 1 arranged in the same row in the pixel array section 2. Additionally, in the solid-state imaging device 212, the connection relationship between the photoelectric conversion circuit PD and the memory circuit M of the plurality of pixels 1 arranged in the same column in the pixel array section 2 can be considered in the same way as the description shown below.

In the description below, in order to distinguish the thirteen pixels 1, and the photoelectric conversion circuit PD, the memory circuit M, and the connection electrode BMP configuring each of the thirteen pixels 1, in the same way as the first embodiment, a number from 1 to 13 indicating the sequence of the arranged thirteen pixels 1 will be affixed to the numeral sign designated to each configuration element of the pixel 1 and the numeral sign of the pixel 1 itself after a symbol "-".

In the example of the connection relationship shown in FIG. 8, in the same way as the example of the cross-sectional structure shown in FIG. 7, the photoelectric conversion circuit PD-1 is connected to the memory circuit M-1 via the connection electrode BMP-1. Accordingly, the electrical signals output by the photoelectric conversion circuit PD-1 are held by the memory circuit M-1. More specifically, the amplified signals according to the signal charge generated by the photoelectric conversion with respect to the incident light L performed by the photoelectric conversion element 101 configuring the photoelectric conversion circuit PD-1 formed in the first semiconductor substrate 20 are read to the second semiconductor substrate 21 via the connection electrode BMP-1, then the amplified signals are held and stored in the analog memory 110 after removing the noise component of the amplified signals by the memory circuit M-1 formed in the second semiconductor substrate 21.

In the example of the connection relationship shown in FIG. 8, similar as the example of the cross-sectional structure shown in FIG. 7, the photoelectric conversion circuit PD-2 is connected to the memory circuit M-2 via the connection electrode BMP-4. Accordingly, the electrical signals output from the photoelectric conversion circuit PD-2 are held by the memory circuit M-2. More specifically, the amplified signals according to the signal charge generated by the photoelectric conversion with respect to the incident light L performed by the photoelectric conversion element 101 configuring the photoelectric conversion circuit PD-2 formed in the first semiconductor substrate 20 are read to the second semiconductor substrate 21 via the connection electrode BMP-4, then the amplified signals are held and stored in the analog memory 110 after removing the noise component of the amplified signals by the memory circuit M-2 formed in the second semiconductor substrate 21.

In the example of the connection relationship shown in FIG. 8, similar as the example of the cross-sectional structure shown in FIG. 7, the photoelectric conversion circuit PD-3 is connected to the memory circuit M-3 via the connection electrode BMP-2, the photoelectric conversion circuit PD-4 is connected to the memory circuit M-4 via the connection electrode BMP-5, and the photoelectric conversion circuit PD-5 is connected to the memory circuit M-5 via the connection electrode BMP-3. Accordingly, the electrical signals output from the photoelectric conversion circuit PD-3, the photoelectric conversion circuit PD-4, and the photoelectric conversion circuit PD-5 are held by the memory circuit M-3, the memory circuit M-4, and the memory circuit M-5.

In the solid-state imaging device 212, in the same way as the solid-state imaging device 202 according to the first embodiment, the connection relationships between the five photoelectric conversion circuits PD and the memory circuits M described above are periodically repeated as the connection unit. Accordingly, in the solid-state imaging device 212, in the same way as the solid-state imaging device 202 according to the first embodiment, even if the poor connection such as the short circuit (short) or the unconnection (open) occurs in the two adjacent connection electrodes BMP among the five connection electrodes BMP-1 to BMP-5, the situation in which the two adjacent pixels 1 become defective pixels is avoided. The image-processing of the defective pixel correction performed by the image-processing unit 203 when the poor connection occurs in the adjacent connection electrodes BMP in the solid-state imaging device 212 is the same as that of the solid-state imaging device 202 according to the first embodiment. Thus, in the solid-state imaging device 212, detailed description indicating a specific example of the image-processing of the defective pixel correction performed by the image-processing unit 203 will be omitted.

In the solid-state imaging device 212, the connection relationship between the photoelectric conversion circuit PD and the memory circuit M changed in the connection unit is not limited to the connection relationship described above. In the same way as the solid-state imaging device 202 according to the first embodiment, for example, according to the estimated number of the adjacent connection electrodes BMP in which the poor connection is possible to occur during the manufacture of the solid-state imaging device 212, the connection relationship may be suitably determined to a different one. Also, multiple connection relationships may be applied.

The connection unit repeated in the solid-state imaging device 212 is not limited to a single type and may be multiple types, in the same way as the solid-state imaging device 202 according to the first embodiment. In the example of the connection relationship applied to the solid-state imaging device 212 shown in FIG. 8, an example of applying the connection unit by the seven pixels 1 including the pixel 1-6 to the pixel 1-12 different from the connection unit applied to the five pixels 1 including the pixel 1-1 to the pixel 1-5 is shown. More specifically, in the example of the connection relationship shown in FIG. 8, the connection unit is determined that the photoelectric conversion circuit PD-6 and the memory circuit M-6 are connected via the connection electrode BMP-6, the photoelectric conversion circuit PD-7 and the memory circuit M-7 are connected via the connection electrode BMP-10, the photoelectric conversion circuit PD-8 and the memory circuit M-8 are connected via the connection electrode BMP-7, the photoelectric conversion circuit PD-9 and the memory circuit M-9 are connected via the connection electrode BMP-11, the photoelectric conversion circuit PD-10 and the memory circuit M-10 are connected via the connection electrode BMP-8, the photoelectric conversion circuit PD-11 and the memory circuit M-11 are connected via the connection electrode BMP-12, and the photoelectric conversion circuit PD-12 and the memory circuit M-12 are connected via the connection electrode BMP-9. Accordingly, the electrical signals output by the photoelectric conversion circuit PD-6 are held by the memory circuit M-6, the electrical signals output by the photoelectric conversion circuit PD-7 are held by the memory circuit M-7, the electrical signals output by the photoelectric conversion circuit PD-8 are held by the memory circuit M-8, the electrical signals output by the photoelectric conversion circuit PD-9 are held by the memory circuit M-9, the electrical signals output by the photoelectric conversion circuit PD-10 are held by the memory circuit M-10, the electrical signals output by the photoelectric conversion circuit PD-11 are held by the memory circuit M-11, and the electrical signals output by the photoelectric conversion circuit PD-12 are held by the memory circuit M-12. As described above, the solid-state imaging device 212 may be configured to have the multiple connection units repeated periodically in the same way as the solid-state imaging device 202 according to the first embodiment.

As shown in FIG. 8, in the case in which the connection unit by the seven pixels 1 including the pixel 1-6 to the pixel 1-12 are applied to the solid-state imaging device 212, even if the poor connection such as the short circuit (short) or the unconnection (open) occurs in the adjacent three connection electrodes BMP among the electrode BMP-6 to the electrode BMP-12 of the solid-state imaging device 212, in the same way as the solid-state imaging device 202 according to the first embodiment, the situation in which the two adjacent pixels 1 become the defective pixels is avoided. Accordingly, the image-processing unit 203 can generate (interpolate) the image signal of the defective pixel 1 by the image processing of the defective pixel correction using the image signals of the pixels 1 in the periphery thereof, in the same way as the solid-state imaging device 202 according to the first embodiment.

As shown in FIG. 6, the solid-state imaging device 212 is different from the solid-state imaging device 202 according to the first embodiment in that the electrical signals output from the photoelectric conversion circuits P and held by the memory circuits M are in a sequence same as the sequence of the photoelectric conversion circuits M arranged in the first semiconductor substrate 20. Accordingly, in the imaging apparatus 200 having the solid-state imaging device 212, the image-processing unit 203 may not perform the rearrangement image-processing with respect to the image signals output from the solid-state imaging device 212.

As described above, according to the solid-state imaging device 212 according to the second embodiment, in the same way as the solid-state imaging device 202 according to the first embodiment, in the first semiconductor substrate 20 in which the photoelectric conversion circuits PD are formed, the position of the connection electrode 1000 corresponding to each photoelectric conversion circuit PD is changed such that the adjacent photoelectric conversion circuits PD are connected to the memory circuits M via the connection electrodes 1000 (connection electrodes BMP) formed at separated positions so as to not to be adjacent. Accordingly, in the solid-state imaging device 212 according to the second embodiment, in the same way as the solid-state imaging device 202 according to the first embodiment, even if poor connection such as the short circuit (short) or the unconnection (open) occurs in the plurality of connection electrodes BMP adjacent to each other, defects of the pixels 1 due to the poor connection of the plurality of connection electrodes 1000 adjacent to each other are distributed so as to reduce the possibility of the continuing defects occurred in the plurality of pixels 1. Accordingly, in the imaging apparatus 200 having the solid-state imaging device 212 according to the second embodiment, in the same way as the solid-state imaging device 202 according to the first embodiment, it is possible to prevent the lowering of the precision of the defective pixel correction so as to prevent the lowering of the image quality. For example, in the solid-state imaging device 212 according to the second embodiment, even if poor connection such as the short circuit (short) or the unconnection (open) occurs in the adjacent two connection electrodes 1000, the two adjacent pixels 1 are prevented from becoming the defective pixels. Accordingly, in the imaging apparatus 200 having the solid-state imaging device 212 according to the second embodiment, in the same way as the solid-state imaging device 202 according to the first embodiment, it is possible to generate (interpolate) the image signal of the defective pixel 1 without lowering the precision of the defective pixel correction so as to capture the image while preventing the lowering of the image quality.

In the solid-state imaging device 212 according to the second embodiment, in the second semiconductor substrate 21 in which the memory circuits M are formed, the positions of the connection electrodes 1000 corresponding to the memory circuits M are changed (restored to the original) such that the adjacent photoelectric conversion circuits PD connected by the separated connection electrodes 1000 (connection electrodes BMP) are connected with the adjacent memory circuits M. Accordingly, in the solid-state imaging device 212 according to the second embodiment, the electrical signals output from the photoelectric conversion circuits PD and held by the memory circuits M formed in the second semiconductor substrate 21 are in the sequence same as that of the photoelectric conversion circuits arranged in the first semiconductor substrate 20. Accordingly, the imaging apparatus 200 having the solid-state imaging device 212 according to the second embodiment may not perform the rearrangement image-processing with respect to the image signals.

In general solid-state imaging devices, color filters in response to the wavelength (color) of the light can be stick on the surface of the solid-state imaging device on which the light is incident for capturing color images.

(Third Embodiment)

Next, the solid-state imaging device 202 having a color filter adhered thereto according to a third embodiment will be described. In the description below, the solid-state imaging device according to the third embodiment will be regarded as a "solid-state imaging device 222". The connection between the first semiconductor substrate 20 and the second semiconductor substrate 21 in the solid-state imaging device 222 is the same as the example of the cross-sectional structure shown in FIG. 5 and FIG. 7 except that the color filter is adhered thereto at the position of each photoelectric conversion element 101 configuring the photoelectric conversion circuit PD in the principal surface of the first semiconductor substrate 20 on which the light L is incident. Accordingly, detailed description of the cross-sectional structure of the solid-state imaging device 222 will be omitted. The connection relationship between the photoelectric conversion circuit PD and the memory circuit M in the solid-state imaging device 222 will be described. In the description below, the case of adhering the color filter to the solid-state imaging device 202 according to the first embodiment shown in FIG. 5 will be described.

In the solid-state imaging device 222, as described above, the plurality of pixels 1 are disposed in the two-dimensional matrix in the pixel array section 2 and the color filter is adhered to each pixel 1. In the general solid-state imaging device, the color filters adhered to the pixel include a color filter configured to transmit the light in the red (R) wavelength band (hereinafter "R-filter"), a color filter configured to transmit the light in the green (G) wavelength band (hereinafter "G-filter"), and a color filter configured to transmit the light in the blue (B) wavelength band (hereinafter "B-filter"). In the general solid-state imaging device, the color filter configured to transmit each wavelength band is adhered to a RGB Bayer array, for example. In the description below, in order to distinguish the pixel 1 to which the R-filter is adhered, the pixel 1 to which the G-filter is adhered, and the pixel 1 to which the B-filter is adhered in the solid-state imaging device 222, a symbol "R" indicating the R-filter, a symbol "G" indicating the G-filter, and a symbol "B" indicating the B-filter are affixed to the number sign designated to each pixel 1. More specifically, the pixel 1 to which the R-filter is adhered is shown as "pixel 1R", the pixel 1 to which the G-filter is adhered is shown as "pixel 1G", and the pixel 1 to which the B-filter is adhered is shown as "pixel 1B".

In the solid-state imaging device to which the color filter is adhered, the image signals used during the defective pixel correction image-processing are the image, signals of the pixel to which the color filter with the same color is adhered. Accordingly, in the solid-state imaging device 222, the image signals used during the defective pixel correction image-processing are the image signals of the pixel 1 to which the color filter with the same color is adhered. In the general solid-state imaging device, in the case that the color filter is adhered to the RGB Bayer array, when three continuous pixels become the defective pixels, the pixels to which the color filter with the same color is adhered become the continuous defective pixels. Thus, in the solid-state imaging device 222, the plurality of adjacent pixels 1 to which the color filter with different color is adhered arranged in the same row or the same column are regarded as a set (hereinafter "pixel set"). Additionally, in the solid-state imaging device 222, the single pixel 1 is configured by the photoelectric conversion circuit PD and the memory circuit M. Further, the pixel 1 is not always formed in the opposite position in the first semiconductor substrate 20 and the second semiconductor substrate 21. Accordingly, the pixel set it a set of the plurality of photoelectric conversion circuits PD which are adjacent to each other and arranged in the same row or the same column, wherein the plurality of photoelectric conversion circuits are adhered by the color filters having different colors.

The pixel set may be configured by the plurality of pixels 1 adjacent to each other in the row direction or the column direction and the plurality of pixels 1 adjacent to each other in the oblique direction. For example, in the RGB Bayer array, the pixel set may be configured by 4 pixels 1 including one pixel 1G, the pixel 1R and the pixel 1B adjacent to the pixel 1G in the row direction and the column direction, and another pixel 1G adjacent to the pixel 1G in the oblique direction, that is, a set of 4 pixels 1 arranged in a 2 pixels×2 pixels array.

In the solid-state imaging device 222, the connection between the photoelectric conversion circuit PD and the memory circuit M is changed by a unit of the pixel set (unit of the set configured by the plurality of pixels 1) in consideration of regarding the pixel set as the pixel 1 in the description of the connection relationship according to the first embodiment and the second embodiment. In other words, in the solid-state imaging device 222, the positions of the connection electrodes BMP corresponding to each photoelectric conversion circuit PD are changed such that the photoelectric conversion circuits PD and the memory circuits M configuring each pixel 1 included in the adjacent pixel sets are not connected via the adjacent connection electrodes BMP. The connection unit in the solid-state imaging device 222 is determined by each pixel set.

Figure 9:
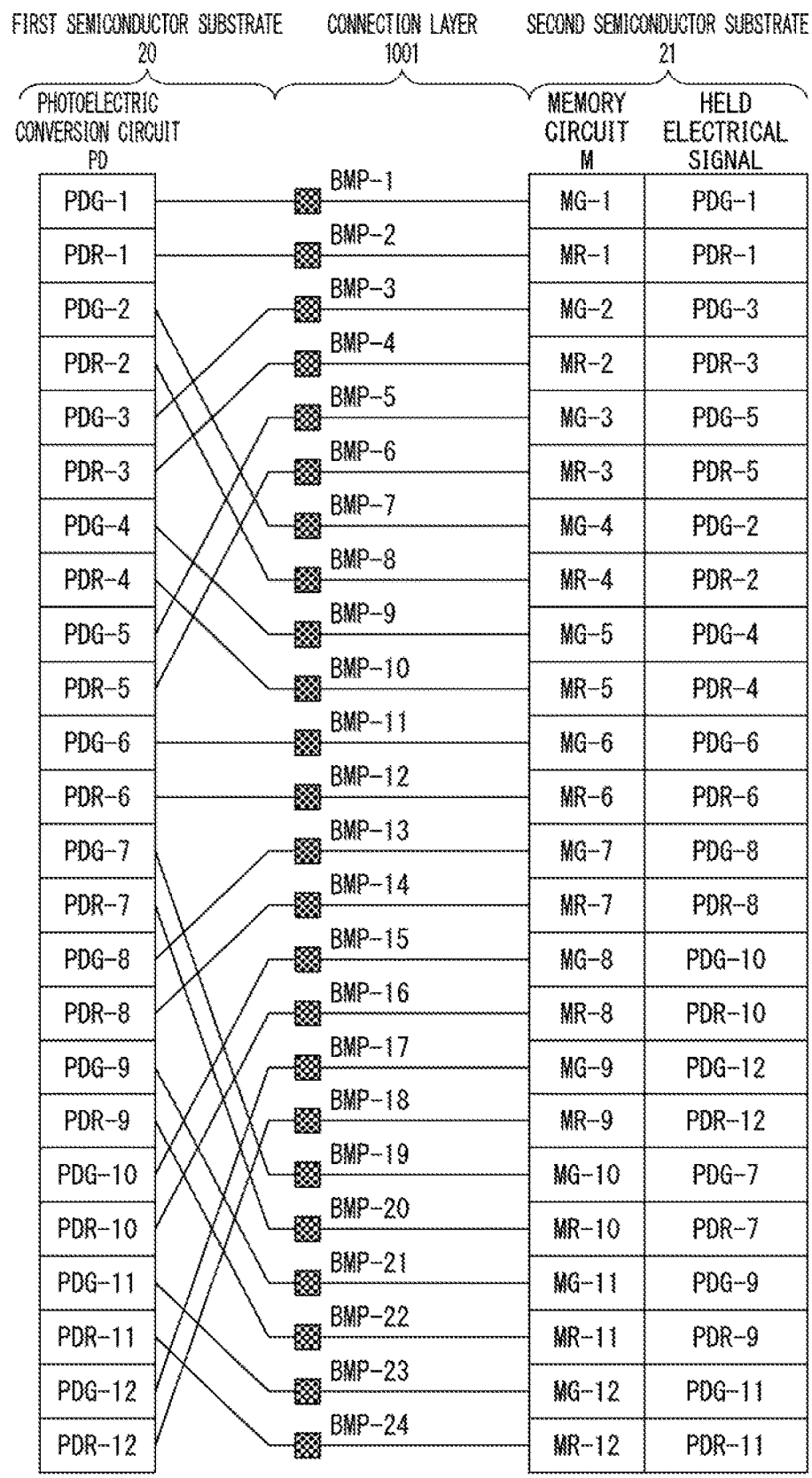
FIG. 9 is a view showing a connection relationship example between a photoelectric conversion circuit configured in a first semiconductor substrate and a memory circuit configured in a second semiconductor substrate in the solid-state imaging device according to a third embodiment of the present invention.

FIG. 9 is a view showing the connection relationship example of the photoelectric conversion circuit PD formed in the first semiconductor substrate 20 and the memory circuit M formed in the second semiconductor substrate 21 in the solid-state imaging device 202 (solid-state imaging device 222) according to the third embodiment of the present invention. In the same way as the connection relationship example of the solid-state imaging device 202 according to the first embodiment shown in FIG. 6, FIG. 9 is provided to show the connection electrode BMP through which the photoelectric conversion circuit PD is connected to the memory circuit M, in the solid-state imaging device 222. Also, in the same way as the connection relationship example of the solid-state imaging device 202 according to the first embodiment shown in FIG. 6, FIG. 9 is provided to show the photoelectric conversion circuits PD from which the electrical signals held by the memory circuit Mare output, in the solid-state imaging device 222.

In the description below, in order to make the description easy to understand, in the pixel array section 2 to which the color filters arranged in the RGB Bayer array are adhered, the connection relationship in the case of configuring one pixel set by the two adjacent pixels 1 to which the color filters with different colors are adhered will be described. More specifically, in the solid-state imaging device 222, the two pixels 1 including the pixel 1G and the pixel 1R arranged in the same row is regarded as one pixel set, and the connection relationship between the photoelectric conversion circuit PD and the memory circuit M is described by focusing on the 24 pixels 1 including the 12 pixels 1G and the 12 pixels 1R, that is, 12 pixel sets arranged in the same row. In the solid-state imaging device 222, the connection relationship of the photoelectric conversion circuit PD and the memory circuit M in the pixel 1 included in the plurality of pixels set arranged in the same column in the same pixel array section 2 can be considered in the same manner as the description shown below.

In the description below, in order to distinguish each of the 12 pixel sets, a number from 1 to 12 indicating the arranged sequence of the 12 pixel sets is affixed to the numeral sign designated to each pixel set after a symbol "-". More specifically, in FIG. 9, the uppermost pixel set is indicated as "pixel set-1" and pixel set as the second from the top is indicated as "pixel set-2". Also, the number from 1 to 12 indicating the arranged sequence of the 12 pixel sets is affixed to the numeral sign designated to the pixels 1 included in the same pixel set and each configuration element of the pixels 1 included in the same pixel set after a symbol "-" so as to distinguish each of the pixels 1 included in the 12 pixel sets and each of the photoelectric conversion circuits PD, the memory circuits M, and the connection electrodes BMP configuring the pixels 1. More specifically, in FIG. 9, the pixel 1G and the pixel 1R included in the uppermost pixel set are indicated as "pixel 1G-1" and the "pixel 1R-1" respectively. Thus, the photoelectric conversion circuit PD and the memory circuit M configuring the pixel 1G-1 are indicated as the "photoelectric conversion circuit PDG-1" and the "memory circuit MG-1" respectively, and the photoelectric conversion circuit PD and the memory circuit M configuring the pixel 1R-1 are indicated as the "photoelectric conversion circuit PDR-1" and the "memory circuit MR-1" respectively. In FIG. 9, the pixel 1G and the pixel 1R included in the pixel set as the second from the top are indicated as "pixel 1G-2" and the "pixel 1R-2" respectively. Thus, the photoelectric conversion circuit PD and the memory circuit M configuring the pixel 1G-2 are indicated as the "photoelectric conversion circuit PDG-2" and the "memory circuit MG-2" respectively, and the photoelectric conversion circuit PD and the memory circuit M configuring the pixel 1R-2 are indicated as the "photoelectric conversion circuit PDR-2" and the "memory circuit MR-2" respectively. With regard to the connection electrodes BMP, a number from 1 to 24 indicating the arranged sequence of the 24 connection electrodes BMP is affixed thereto after the symbol "-" so as to distinguish the 24 connection electrodes BMP. That is, the connection electrodes BMP are indicated as the "connection electrodes BMP-1" to the "connection electrodes BMP-241".

In the connection relationship example shown in FIG. 9, the photoelectric conversion circuit PDG-1 configuring the pixel 1G-1 included in the pixel set-1 is connected to the memory circuit MG-1 via the connection electrode BMP-1, and the photoelectric conversion circuit PDR-1 configuring the pixel 1R-1 included in the pixel set-1 is connected to the memory circuit MR-1 via the connection electrode BMP-2. Accordingly, the electrical signals output by the photoelectric conversion circuit PDG-1 are held by the memory circuit MG-1, and the electrical signals output by the photoelectric conversion circuit PDR-1 are held by the memory circuit MR-1. More specifically, the amplified signals according to the signal charge generated by the photoelectric conversion with respect to the incident light L performed by the photoelectric conversion element 101 configuring the photoelectric conversion circuit PDG-1 formed in the first semiconductor substrate 20 are read to the second semiconductor substrate 21 via the connection electrode BMP-1, then the amplified signals are held and stored in the analog memory 110 after removing the noise component of the amplified signals by the memory circuit MG-1 formed in the second semiconductor substrate 21. The amplified signals according to the signal charge generated by the photoelectric conversion with respect to the incident light L performed by the photoelectric conversion element 101 configuring the photoelectric conversion circuit PDR-1 formed in the first semiconductor substrate 20 are read to the second semiconductor substrate 21 via the connection electrode BMP-2, then the amplified signals are held and stored in the analog memory 110 after removing the noise component of the amplified signals by the memory circuit MR-1 formed in the second semiconductor substrate 21.

In the example of the connection relationship shown in FIG. 9, the photoelectric conversion circuit PDG-2 configuring the pixel 1G-2 included in the pixel set-2 is connected to the memory circuit MG-4 via the connection electrode BMP-7, and the photoelectric conversion circuit PDR-2 configuring the pixel 1R-2 included in the pixel set-2 is connected to the memory circuit MR-4 via the connection electrode BMP-8. Accordingly, the electrical signals output from the photoelectric conversion circuit PDG-2 are held by the memory circuit MG-4, and the electrical signals output from the photoelectric conversion circuit PDR-2 are held by the memory circuit MR-4. More specifically, the amplified signals according to the signal charge generated by the photoelectric conversion with respect to the incident light L performed by the photoelectric conversion element 101 configuring the photoelectric conversion circuit PDG-2 formed in the first semiconductor substrate 20 are read to the second semiconductor substrate 21 via the connection electrode BMP-7, then the amplified signals are held and stored in the analog memory 110 after removing the noise component of the amplified signals by the memory circuit MG-4 formed in the second semiconductor substrate 21. Also, the amplified signals according to the signal charge generated by the photoelectric conversion with respect to the incident light L performed by the photoelectric conversion element 101 configuring the photoelectric conversion circuit PDR-2 formed in the first semiconductor substrate 20 are read to the second semiconductor substrate 21 via the connection electrode BMP-8, then the amplified signals are held and stored in the analog memory 110 after removing the noise component of the amplified signals by the memory circuit MR-4 formed in the second semiconductor substrate 21.

Similarly, in the example of the connection relationship shown in FIG. 9, the photoelectric conversion circuit PDG-3 configuring the pixel 1G-3 included in the pixel set-3 is connected to the memory circuit MG-2 via the connection electrode BMP-3, and the photoelectric conversion circuit PDR-3 configuring the pixel 1R-3 included in the pixel set-3 is connected to the memory circuit MR-2 via the connection electrode BMP-4. Accordingly, the electrical signals output from the photoelectric conversion circuit PDG-3 and the photoelectric conversion circuit PDR-3 are held by the memory circuit MG-2 and the memory circuit MR-2, respectively. Similarly, in the example of the connection relationship shown in FIG. 9, the photoelectric conversion circuit PDG-4 configuring the pixel 1G-4 included in the pixel set-4 is connected to the memory circuit MG-5 via the connection electrode BMP-9, and the photoelectric conversion circuit PDR-4 configuring the pixel 1R-4 included in the pixel set-4 is connected to the memory circuit MR-5 via the connection electrode BMP-10. Accordingly, the electrical signals output from the photoelectric conversion circuit PDG-4 and the photoelectric conversion circuit PDR-4 are held by the memory circuit MG-5 and the memory circuit MR-5, respectively. Similarly, in the example of the connection relationship shown in FIG. 9, the photoelectric conversion circuit PDG-5 configuring the pixel 1G-5 included in the pixel set-5 is connected to the memory circuit MG-3 via the connection electrode BMP-5, and the photoelectric conversion circuit PDR-5 configuring the pixel 1R-5 included in the pixel set-5 is connected to the memory circuit MR-3 via the connection electrode BMP-6. Accordingly, the electrical signals output from the photoelectric conversion circuit PDG-5 and the photoelectric conversion circuit PDR-5 are held by the memory circuit MG-3 and the memory circuit MR-3, respectively.

In the solid-state imaging device 222, in the same way as the solid-state imaging device 202 according to the first embodiment, the connection relationship between the photoelectric conversion circuit PD and the memory circuit M configuring each pixel 1 included in the five pixel sets described above is repeated periodically as the connection unit.

Accordingly, in the solid-state imaging device 222, even if the poor connections such as the short circuit (short) or the unconnection (open) that are considered to be the factor leading to the continuous defective pixels in the general solid-state imaging device occur in any three adjacent connection electrodes BMP among the connection electrodes BMP-1 to BMP-10, the situation in which the two adjacent pixels 1 adhered by the color filters with the same color included in the adjacent two pixel sets become defective pixels is avoided. For example, in a situation when the poor connection occurs in three adjacent connection electrodes BMP-4 to BMP-6, three pixels 1 including the pixel 1R-3, the pixel 1G-5, and the pixel 1R-5 become the defective pixels. However, in this situation, neither of the pixel 1R-2 and the pixel 1R-4, which are used in the defective pixel correction image-processing when the pixel 1R-3 is the defective pixel, is the defective pixel. Accordingly, the solid-state imaging device 222 can output the image signal indicating the pixel 1R-3 as the defective pixel to the image-processing unit 203, and the image-processing unit 203 can generate (interpolate) the image signal of the pixel 1R-3 using the image signal of the pixel 1R-2 and the image signal of the pixel 1R-4. Similarly, neither of the pixel 1G-4 and the pixel 1G-6 which are used in the defective pixel correction image-processing when the pixel 1G-5 is the defective pixel is the defective pixel, and neither of the pixel 1R-4 and the pixel 1R-6 which are used in the defective pixel correction image-processing when the pixel 1R-5 is the defective pixel is the defective pixel. Accordingly, the solid-state imaging device 222 can output the image signals indicating the pixel 1G-5 and the pixel 1R-5 as the defective pixels to the image-processing unit 203, and the image-processing unit 203 can generate (interpolate) the image signal of the pixel 1G-5 and the image signal of the pixel 1R-5 using the image signal of the pixel 1G-4 and the image signal of the pixel 1G-6, and the image signal of the pixel 1R-4 and the image signal of the pixel 1R-6.

In the solid-state imaging device 222, the connection relationship of the photoelectric conversion circuit PD and the memory circuit M changed in the connection unit is not limited to the connection relationships shown as above. For example, in the same way as the solid-state imaging device 202 according to the first embodiment, according to the number of the adjacent connection electrodes in which the poor connection is possible to occur during the manufacture of the solid-state imaging device 222, the connection relationship may be suitably determined to a different connection relationship. Also, multiple connection relationships may be applied. In this case, in the solid-state imaging device 222, the connection relationship between the photoelectric conversion circuit PD and the memory circuit M is changed by the unit of the pixel set.

The connection unit repeated in the solid-state imaging device 202 is not limited to a single type and may be multiple types in the same way as the solid-state imaging device 202 according to the first embodiment. In the example of the connection relationship shown in FIG. 9, an example of applying a connection unit by the seven pixel sets including the pixel set-6 to the pixel set-12 different from a connection unit applied to the five pixel sets including the pixel set-1 to the pixel set-5 in the solid-state imaging device 222 is shown. More specifically, in the example of the connection relationship shown in FIG. 9, the photoelectric conversion circuit PDG-6 and the memory circuit MG-6 configuring the pixel 1G-6 included in the pixel set-6 are connected via the connection electrode BMP-11, and the photoelectric conversion circuit PDR-6 and the memory circuit MR-6 configuring the pixel 1R-6 are connected via the connection electrode BMP-12. In the example of the connection relationship shown in FIG. 9, the photoelectric conversion circuit PDG-7 and the memory circuit MG-10 configuring the pixel 1G-7 included in the pixel set-7 are connected via the connection electrode BMP-19, and the photoelectric conversion circuit PDR-7 and the memory circuit MR-10 configuring the pixel 1R-7 are connected via the connection electrode BMP-20. In the example of the connection relationship shown in FIG. 9, the photoelectric conversion circuit PDG-8 and the memory circuit MG-7 configuring the pixel 1G-8 included in the pixel set-8 are connected via the connection electrode BMP-13, and the photoelectric conversion circuit PDR-8 and the memory circuit MR-7 configuring the pixel 1R-8 are connected via the connection electrode BMP-14. In the example of the connection relationship shown in FIG. 9, the photoelectric conversion circuit PDG-9 and the memory circuit MG-11 configuring the pixel 1G-9 included in the pixel set-9 are connected via the connection electrode BMP-21, and the photoelectric conversion circuit PDR-9 and the memory circuit MR-11 configuring the pixel 1R-9 are connected via the connection electrode BMP-22. In the example of the connection relationship shown in FIG. 9, the photoelectric conversion circuit PDG-10 and the memory circuit MG-8 configuring the pixel 1G-10 included in the pixel set-10 are connected via the connection electrode BMP-15, and the photoelectric conversion circuit PDR-10 and the memory circuit MR-8 configuring the pixel 1R-10 are connected via the connection electrode BMP-16. In the example of the connection relationship shown in FIG. 9, the photoelectric conversion circuit PDG-11 and the memory circuit MG-12 configuring the pixel 1G-11 included in the pixel set-11 are connected via the connection electrode BMP-23, and the photoelectric conversion circuit PDR-11 and the memory circuit MR-12 configuring the pixel 1R-11 are connected via the connection electrode BMP-24. In the example of the connection relationship shown in FIG. 9, the photoelectric conversion circuit PDG-12 and the memory circuit MG-9 configuring the pixel 1G-12 included in the pixel set-12 are connected via the connection electrode BMP-17, and the photoelectric conversion circuit PDR-12 and the memory circuit MR-9 configuring the pixel 1R-12 are connected via the connection electrode BMP-18. In the example of the connection relationship shown in FIG. 9, the connection unit configured to connect each photoelectric conversion circuit PD and each corresponding memory circuit M is applied to the solid-state imaging device 222. Accordingly, the electrical signals output by each photoelectric conversion circuit PD are held by each corresponding memory circuit M. In this way, in the same way as the solid-state imaging device 202 according to the first embodiment, in the solid-state imaging device 222, the multiple connection units described above may be periodically repeated as described above.

As shown in FIG. 9, in the case in which the connection unit by the seven pixel sets including the pixel set-6 to the pixel set-12 is applied, to the solid-state imaging device 222, even if the poor connection such as the short circuit (short) or the unconnection (open) occurs in the adjacent five connection electrodes, BMP among the electrode BMP-11 to the electrode BMP-24 of the solid-state imaging device 222, the situation in which the two adjacent pixels 1 become the defective pixels is avoided. Accordingly, the image-processing unit 203 can generate (interpolate) the image signal of the defective pixel 1 by the image processing of the defective pixel correction using the image signals of the pixels 1 in the periphery thereof.

In the solid-state imaging device 222, as shown in FIG. 9, the electrical signals output from each of the photoelectric conversion circuits PD and held by each of the memory circuits M are not in the same sequence as the arranged sequence in which the photoelectric conversion circuits PD are arranged in the first semiconductor substrate 20. Accordingly, in the imaging apparatus 200 having the solid-state imaging device 222, in the same way as the imaging apparatus 200 having the solid-state imaging device 202, the image-processing unit 203 is configured to perform a rearrangement image-processing for rearranging the image signals output from the solid-state imaging device 222 into the same of the pixels 1 arranged in the pixel array section 2 of the solid-state imaging device 222. In the same way as the solid-state imaging device 202 according to the first embodiment, the solid-state imaging device 222 may have the same function as the rearrangement image-processing performed by the image-processing unit 203. Accordingly, the image signals input to the image-processing unit 203 are in the same sequence as that of the pixels 1 arranged in the pixel array section 2 of the solid-state imaging device 222 such that in the imaging apparatus 200 having the solid-state imaging device 222, the image-processing unit 203 may not perform the rearrangement image-processing.

In the solid-state imaging device 222, the wiring configuration of the metal wirings 2103 formed in the second wiring layer 2102 of the second semiconductor substrate 21 may be determined according to the same idea as that of the solid-state imaging device 212 according to the second embodiment. In this case, in the same way as the imaging apparatus 200 having the solid-state imaging device 212 according to the second embodiment, the image-processing unit 203 may not perform the rearrangement image-processing with respect to the image signals output from the solid-state imaging device 222.

In the solid-state imaging device having the color filters adhered thereto while being arranged in the RGB Bayer array, the combinations of the color filters adhered to the pixels 1 arranged in the adjacent row are different from each other. More specifically, in the solid-state imaging device having the color filters adhered thereto while being arranged in the RGB Bayer array, when the pixels 1 arranged in a specific row are the pixel 1G and the pixel 1R, the pixels 1 arranged in the adjacent row are the pixel 1B and the pixel 1G. In this case, in the solid-state imaging device 222, the connection relationship between the photoelectric conversion circuit PD and the memory circuit M is changed by the unit of the pixel set configured by 4 pixels (4 pixels arranged in the 2 pixels×2 pixels form) including 2 adjacent pixels in the row direction and 2 adjacent pixels in the column direction.

Figure 10:
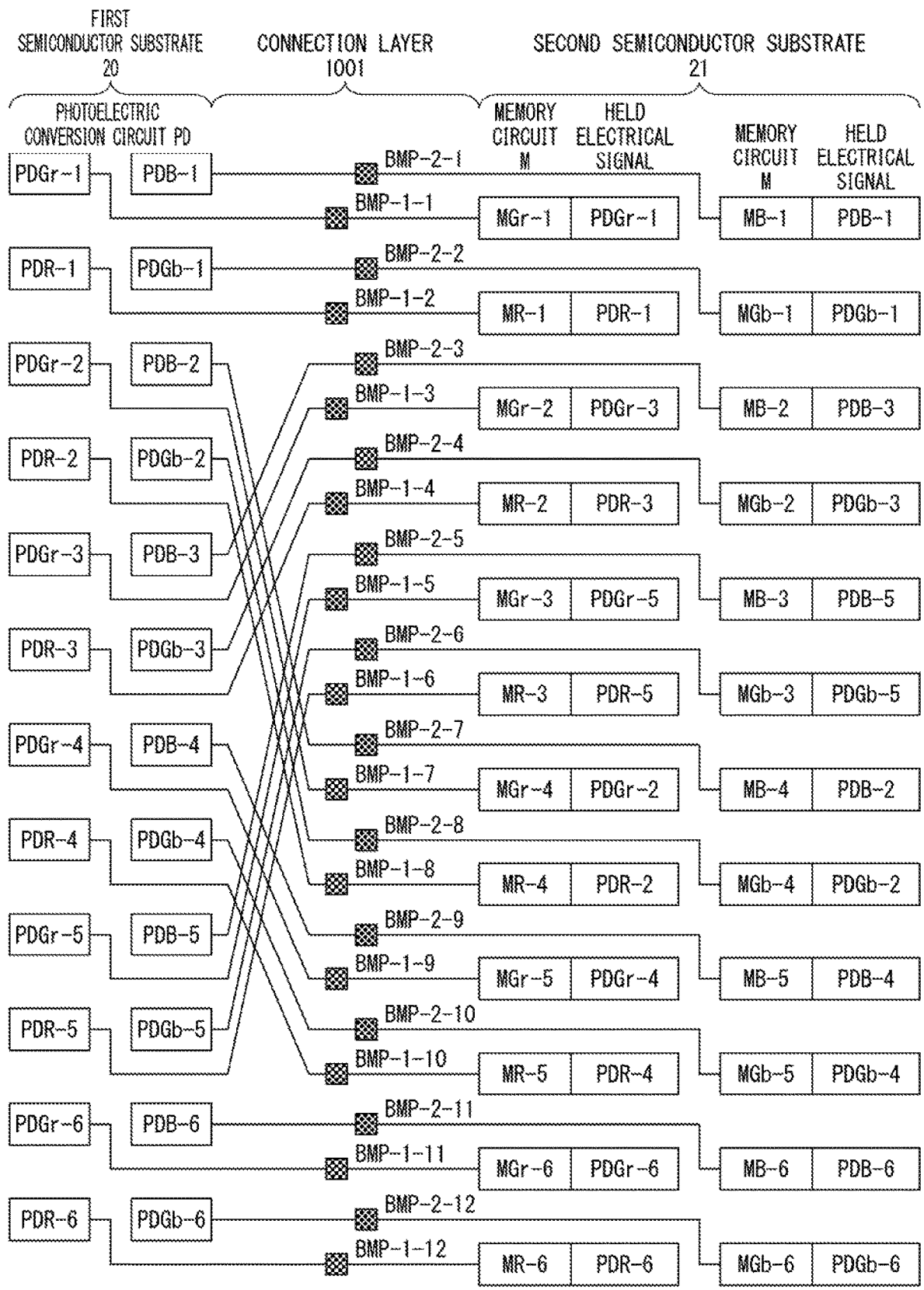
FIG. 10 is a view showing another connection relationship example between the photoelectric conversion circuit configured in the first semiconductor substrate and the memory circuit configured in the second semiconductor substrate in the solid-state imaging device according to the third embodiment of the present invention.

FIG. 10 is a view showing another example of the connection relationship between the photoelectric conversion circuit PD formed in the first semiconductor substrate 20 and the memory circuit m formed in the second semiconductor substrate 21 in the solid-state imaging device 202 according to the third embodiment of the present invention. In the description below, the solid-state imaging device 202 (solid-state imaging device 222) having 4 pixels arranged in the 2 pixels×2 pixels form as one pixel set according to the third embodiment will be regarded as a solid-state imaging device 232. In the same way as the connection relationship example of the solid-state imaging device 222 shown in FIG. 9, FIG. 10 is provided to show the connection electrode BMP through which the photoelectric conversion circuit PD is connected to the memory circuit M and the photoelectric conversion circuit PD from which the electrical signals held by the memory circuit M are output, in the solid-state imaging device 232.

In the description shown below, in order to make the description easy to understand, in the pixel array section 2 adhered by the color filters arranged in the RGB Bayer array, the connection relationship will be described by focusing on the case of the pixel set configured by 4 pixels 1 arranged in the 2 pixels×2 pixels form in two adjacent rows, wherein the 4 pixels 1 are adhered by the color filters with different colors. More specifically, in the solid-state imaging device 232, the pixel set is configured by 4 pixels 1 including the pixel 1G and the pixel 1R arranged in one row and the pixel 1B and the pixel 1G arranged in another row. In the solid-state imaging device 232, the connection relationship between the photoelectric conversion circuit PD and the memory circuit M will be described by focusing on the 6 pixel sets across two rows including 12 pixels 1G, 6 pixels 1R, and 6 pixels 1B. In the solid-state imaging device 232, the connection relationship between the photoelectric conversion circuit PD and the memory circuit M in the pixels 1 included in the plurality of pixel sets across two columns in the pixel array section 2 can be considered in the same way as the description shown below.

In the description below, in the solid-state imaging device 232, the pixel 1G arranged in the row in which two pixels 1 including the pixel 1G and the pixel 1R is indicated as the pixel 1Gr, and the pixel 1G arranged in the row in which two pixels 1 including the pixel 1G and the pixel 1B is indicated as the pixel 1Gb. Also, in the description below, in the same way as the connection relationship example shown in FIG. 9, a number from 1 to 6 showing the arranged sequence of the 6 pixel sets is affixed after the symbol "-" so as to distinguish the 6 pixel sets, the pixels 1 included in the same pixel set, and the photoelectric conversion circuit PD, the memory circuit M, and the connection electrode BMP configuring each pixel 1. With regard to the connection electrodes BMP, since the 24 connection electrodes BMP are arranged across two rows, a number of 1 or 2 indicating the row in which the connection electrode BMP is arranged is affixed thereto after the symbol "-", and further a number from 1 to 12 indicating the arranged sequence thereof is affixed thereto after the symbol "-" so as to distinguish the row and the arranged sequence of the 24 connection electrodes. More specifically, assuming that the row in which the two pixels including the pixel 1G and the pixel 1R are arranged is indicated as the first row and the row in which the two pixels including the pixel 1G and the pixel 1B are arranged is indicated as the second row, the connection electrodes BMP can be indicated by their arranged sequence such as the connection electrode BMP-1-1 to the connection electrode BMP-1-12 and the connection electrode BMP-2-1 to the connection electrode BMP-2-12.

In the connection relationship example shown in FIG. 10, in the pixel set-1, the photoelectric conversion circuit PDGr-1 configuring the pixel 1Gr-1 is connected to the memory circuit MGr-1 via the connection electrode BMP-1-1, the photoelectric conversion circuit PDR-1 configuring the pixel 1R-1 is connected to the memory circuit MR-1 via the connection electrode BMP-1-2, the photoelectric conversion circuit PDB-1 configuring the pixel 1B-1 is connected to the memory circuit MB-1 via the connection electrode BMP-2-1, and the photoelectric conversion circuit PDGb-1 configuring the pixel 1Gb-1 is connected to the memory circuit MGb-1 via the connection electrode BMP-2-2. Accordingly, the electrical signals output from the photoelectric conversion circuit PDGr-1, the electrical signals output from the photoelectric conversion circuit PDR-1, the electrical signals output from the photoelectric conversion circuit PDB-1, and the electrical signals output from the photoelectric conversion circuit PDGb-1 are held by the memory circuit MGr-1, the memory circuit MR-1, the memory circuit MB-1, and the memory circuit MGb-1, respectively. More specifically, the amplified signals according to the signal charge generated by the photoelectric conversion with respect to the incident light L performed by the photoelectric conversion element 101 configuring the photoelectric conversion circuit PDGr-1 formed in the first semiconductor substrate 20 are read to the second semiconductor substrate 21 via the connection electrode BMP-1-1, then the amplified signals are held and stored in the analog memory 110 after removing the noise component of the amplified signals by the memory circuit MGr-1 formed in the second semiconductor substrate 21. The amplified signals according to the signal charge generated by the photoelectric conversion with respect to the incident light L performed by the photoelectric conversion element 101 configuring the photoelectric conversion circuit PDR-1 formed in the first semiconductor substrate 20 are read to the second semiconductor substrate 21 via the connection electrode BMP-1-2, then the amplified signals are held and stored in the analog memory 110 after removing the noise component of the amplified signals by the memory circuit MR-1 formed in the second semiconductor substrate 21. The amplified signals according to the signal charge generated by the photoelectric conversion with respect to the incident light L performed by the photoelectric conversion element 101 configuring the photoelectric conversion circuit PDB-1 formed in the first semiconductor substrate 20 are read to the second semiconductor substrate 21 via the connection electrode BMP-2-1, then the amplified signals are held and stored in the analog memory 110 after removing the noise component of the amplified signals by the memory circuit MB-1 formed in the second semiconductor substrate 21. The amplified signals according to the signal charge generated by the photoelectric conversion with respect to the incident light L performed by the photoelectric conversion element 101 configuring the photoelectric conversion circuit PDGb-1 formed in the first semiconductor substrate 20 are read to the second semiconductor substrate 21 via the connection electrode BMP-2-2, then the amplified signals are held and stored in the analog memory 110 after removing the noise component of the amplified signals by the memory circuit MGb-1 formed in the second semiconductor substrate 21.

In the connection relationship example shown in FIG. 10, in the pixel set-2, the photoelectric conversion circuit PDGr-2 configuring the pixel 1Gr-2 is connected to the memory circuit MGr-4 via the connection electrode BMP-1-7, the photoelectric conversion circuit PDR-2 configuring the pixel 1R-2 is connected to the memory circuit MR-4 via the connection electrode BMP-1-8, the photoelectric conversion circuit PDB-2 configuring the pixel 1B-2 is connected to the memory circuit MB-4 via the connection electrode BMP-2-7, and the photoelectric conversion circuit PDGb-2 configuring the pixel 1Gb-2 is connected to the memory circuit MGb-4 via the connection electrode BMP-2-8. Accordingly, the electrical signals output from the photoelectric conversion circuit PDGr-2, the electrical signals output from the photoelectric conversion circuit PDR-2, the electrical signals output from the photoelectric conversion circuit PDB-2, and the electrical signals output from the photoelectric conversion circuit PDGb-2 are held in the memory circuit MGr-4, the memory circuit MR-4, the memory circuit MB-4, and the memory circuit MGb-4, respectively. More specifically, the amplified signals according to the signal charge generated by the photoelectric conversion with respect to the incident light L performed by the photoelectric conversion element 101 configuring the photoelectric conversion circuit PDGr-2 formed in the first semiconductor substrate 20 are read to the second semiconductor substrate 21 via the connection electrode BMP-1-7, then the amplified signals are held and stored in the analog memory 110 after removing the noise component of the amplified signals by the memory circuit MGr-4 formed in the second semiconductor substrate 21. The amplified signals according to the signal charge generated by the photoelectric conversion with respect to the incident light L performed by the photoelectric conversion element 101 configuring the photoelectric conversion circuit PDR-2 formed in the first semiconductor substrate 20 are read to the second semiconductor substrate 21 via the connection electrode BMP-1-8, then the amplified signals are held and stored in the analog memory 110 after removing the noise component of the amplified signals by the memory circuit MR-4 formed in the second semiconductor substrate 21. The amplified signals according to the signal charge generated by the photoelectric conversion with respect to the incident light L performed by the photoelectric conversion element 101 configuring the photoelectric conversion circuit PDB-2 formed in the first semiconductor substrate 20 are read to the second semiconductor substrate 21 via the connection electrode BMP-2-7, then the amplified signals are held and stored in the analog memory 110 after removing the noise component of the amplified signals by the memory circuit MB-4 formed in the second semiconductor substrate 21. The amplified signals according to the signal charge generated by the photoelectric conversion with respect to the incident light L performed by the photoelectric conversion element 101 configuring the photoelectric conversion circuit PDGb-2 formed in the first semiconductor substrate 20 are read to the second semiconductor substrate 21 via the connection electrode BMP-2-8, then the amplified signals are held and stored in the analog memory 110 after removing the noise component of the amplified signals by the memory circuit MGb-4 formed in the second semiconductor substrate 21.

Similarly, in the connection relationship example shown in FIG. 10, in the pixel set-3, the photoelectric conversion circuit PDGr-3 configuring the pixel 1Gr-3 is connected to the memory circuit MGr-2 via the connection electrode BMP-1-3, the photoelectric conversion circuit PDR-3 configuring the pixel 1R-3 is connected to the memory circuit MR-2 via the connection electrode BMP-1-4, the photoelectric conversion circuit PDB-3 configuring the pixel 1B-3 is connected to the memory circuit MB-2 via the connection electrode BMP-2-3, and the photoelectric conversion circuit PDGb-3 configuring the pixel 1Gb-3 is connected to the memory circuit MGb-2 via the connection electrode BMP-2-4. In the connection relationship example shown in FIG. 10, in the pixel set-4, the photoelectric conversion circuit PDGr-4 configuring the pixel 1Gr-4 is connected to the memory circuit MGr-5 via the connection electrode BMP-1-9, the photoelectric conversion circuit PDR-4 configuring the pixel 1R-4 is connected to the memory circuit MR-5 via the connection electrode BMP-1-10, the photoelectric conversion circuit PDB-4 configuring the pixel 1B-4 is connected to the memory circuit MB-5 via the connection electrode BMP-2-9, and the photoelectric conversion circuit PDGb-4 configuring the pixel 1Gb-4 is connected to the memory circuit MGb-5 via the connection electrode BMP-2-10. In the connection relationship example shown in FIG. 10, in the pixel set-5, the photoelectric conversion circuit PDGr-5 configuring the pixel 1Gr-5 is connected to the memory circuit MGr-3 via the connection electrode BMP-1-5, the photoelectric conversion circuit PDR-5 configuring the pixel 1R-5 is connected to the memory circuit MR-3 via the connection electrode BMP-1-6, the photoelectric conversion circuit PDB-5 configuring the pixel 1B-5 is connected to the memory circuit MB-3 via the connection electrode BMP-2-5, and the photoelectric conversion circuit PDGb-5 configuring the pixel 1Gb-5 is connected to the memory circuit MGb-3 via the connection electrode BMP-2-6. Accordingly, the electrical signals output from each photoelectrical conversion circuit PD are held by the connected memory circuit M.

In the manner as the connection relationship example shown in FIG. 10, in the same way as the connection relationship example shown in FIG. 9, the connection relationship between the photoelectric conversion circuit PD and the memory circuit M configuring each pixel 1 included in the five pixel sets shown above is regarded as the connection unit and the connection unit is periodically repeated. Accordingly, in the connection relationship example shown in FIG. 10, in the same way as the connection relationship example shown in FIG. 9, even if the poor connection such as the short circuit (short) or the unconnection (open) occurs in any adjacent three connection electrodes BMP, the situation in which the pixels 1 to which the color filters with the same color are adhered included in the two adjacent pixel sets become the defective pixels are avoided.

In the connection relationship example shown in FIG. 10, in the same way as the connection relationship example shown in FIG. 9, the connection relationship between the photoelectric conversion circuit PD and the memory circuit M is not limited to the connection relationships shown as above, and the connection unit is not limited to be one type. In the connection relationship example shown in FIG. 10, in the same way as the connection relationship example shown in FIG. 9, the electrical signals output from each photoelectric conversion circuit PD and held by each corresponding memory circuit M are not arranged in the sequence in the same way as the arranged sequence of the photoelectric conversion circuit PD arranged in the first semiconductor substrate 20; however, the electrical signals can be arranged in the arranged sequence of the pixels 1 in the pixel array section 2 by the rearrangement image-processing by the image-processing unit 203. The solid-state imaging device 232 having the connection relationship example shown in FIG. 10 may have the same function as the rearrangement image-processing of the image-processing unit 203 such that the image-processing unit 203 may not perform the rearrangement image-processing. Further, in the solid-state imaging device 232 having the connection relationship example shown in FIG. 10, due to the wiring configuration of the metal wirings 2103 formed in the second wiring layer 2102 of the second semiconductor substrate 21, the image-processing unit 203 may not perform the rearrangement image-processing.

According to the third embodiment of the present invention, in the solid-state imaging device (solid-state imaging device 232), the pixel set is configured by including the plurality of photoelectric conversion circuits (the photoelectric conversion circuit PDR, the photoelectric conversion circuit PDG, and the photoelectric conversion circuit PDB) having the photoelectric conversion elements (photoelectric conversion element 101: pixel 1) which are adjacent to each other and configure to transform the light of different wavelength bands (for example, the light of the wavelength bands of red (R), green (G), and blue (B)) into the electrical signals. In the solid-state imaging device (solid-state imaging device 232), the photoelectric conversion circuits included in the same pixel set are connected to the corresponding signal processing circuits (for example, the analog memory, and the memory circuit M including the plurality of transistors and the plurality of capacitors) by the adjacent connection electrodes (connection electrodes 1000=connection electrodes BMP).

As described above, with regard to the adjacent pixel sets in the solid-state imaging device 222 (solid-state imaging device 232) to which the color filters are adhered according to the third embodiment, the positions of the connection electrodes 1000 configured to connect each of the photoelectric conversion circuits PD and the memory circuits M in the adjacent pixel sets are changed by the unit of the pixel set (the unit configured by the plurality of pixels 1) such that the photoelectric conversion circuit PD and the memory circuit M configuring each pixel 1 included in the pixel sets are connected via the separated connection electrodes 1000 (connection electrodes BMP). Accordingly, in the solid-state imaging device 202 (solid-state imaging device 232) according to the third embodiment, even if the poor connection such as the short circuit (short) or the unconnection (open) occurs in the plurality of adjacent connection electrodes 1000, the situation in which the two adjacent pixels 1 to which the color filters with the same color are adhered included in the two adjacent two pixel sets become the defective pixels are avoided. In other words, in the solid-state imaging device 202 (solid-state imaging device 232) to which the color filters are adhered according to the third embodiment, in the same way as the solid-state imaging device 202 according to the first embodiment and the solid-state imaging device 212 according to the second embodiment, defects of the pixels 1 to which the color filters with the same color due to the poor connection of the plurality of adjacent connection electrodes 1000 are distributed so as to reduce the possibility of the continuing defective pixels. Accordingly, in the imaging apparatus 200 having the solid-state imaging device 222 (the solid-state imaging device 232) according to the third embodiment, in the same way as the solid-state imaging device 202 according to the first embodiment and the solid-state imaging device 212 according to the second embodiment, it is possible to prevent the lowering of the precision of the defective pixel correction so as to prevent the lowering of the image quality. For example, in the solid-state imaging device 232 according to the third embodiment, even if poor connection such as the short circuit (short) or the unconnection (open) occurs in the adjacent three connection electrodes 1000, the two adjacent pixels 1 are prevented from becoming the defective pixels. Accordingly, in the imaging apparatus 200 having the solid-state imaging device 232 according to the third embodiment, it is possible to generate (interpolate) the image signal of the defective pixel 1 without lowering the precision of the defective pixel correction so as to capture the image while preventing the lowering of the image quality.

With regard to the solid-state imaging device 232 to which the color filters are adhered according to the third embodiment, it is described that the pixel set is configured by two adjacent pixels 1 or four adjacent pixels 1 to which the color filters with the different colors are adhered. However, in the same way as the solid-state imaging device 202 according to the first embodiment and the solid-state imaging device 212 according to the second embodiment, in the solid-state imaging device to which neither color filter is adhered, the pixel set may be configured by the plurality of adjacent pixels 1. In this case, the same effect can be achieved as that of the solid-state imaging device 232 according to the third embodiment.

In the solid-state imaging device having the stacked structure formed by stacking the plurality of semiconductor substrates, in order to reduce the poor connection such as the short circuit (short) or the unconnection (open), a configuration of sharing one connection electrode with the plurality of pixels is considerable. In this case, the plurality of pixels 1 sharing the connection electrode can be regarded in the same way as the pixel set according to the third embodiment and the connection relationship in the solid-state imaging device according to the first embodiment and the second embodiment can be applied thereto.

(Fourth Embodiment)

Figure 11:
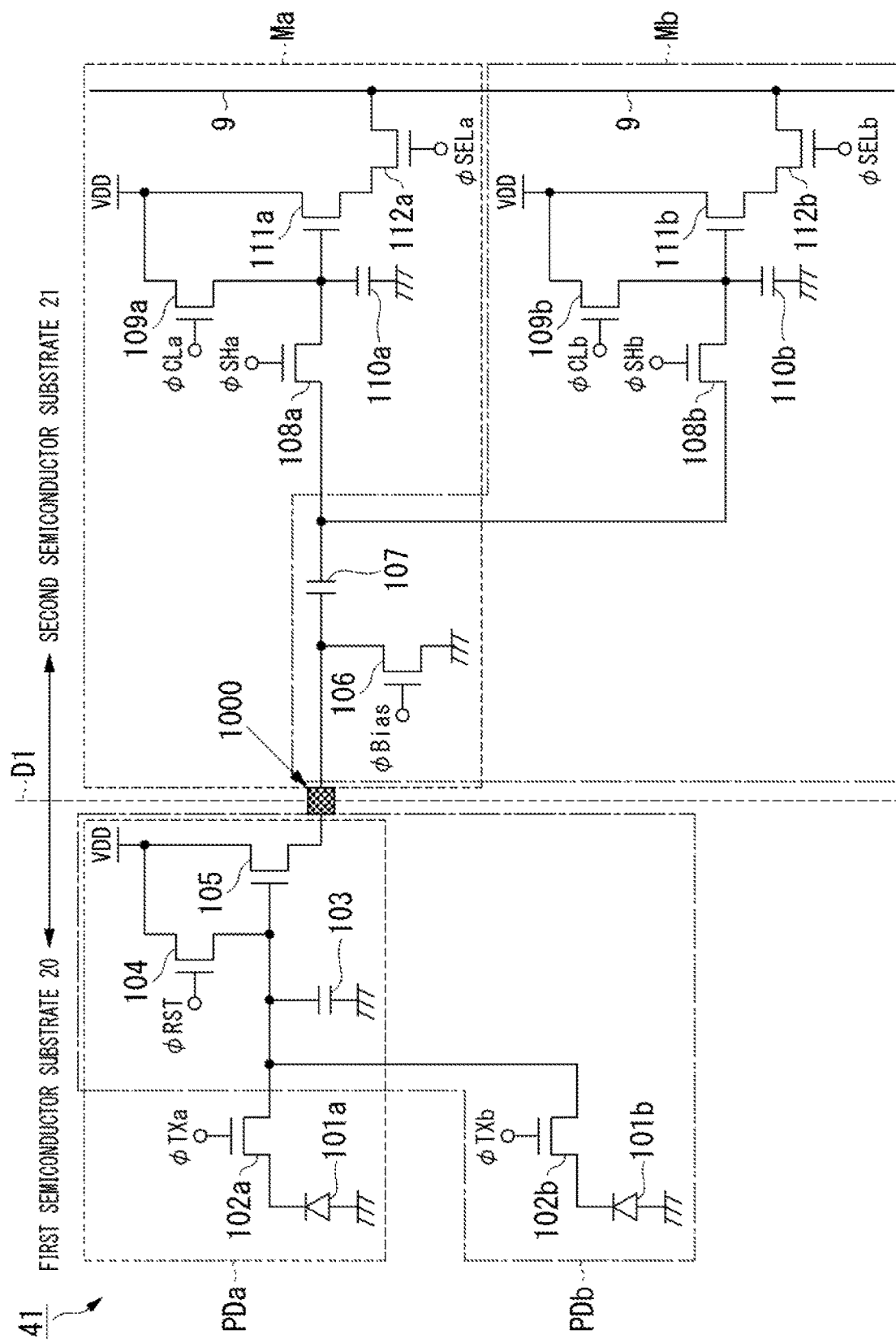
FIG. 11 is a circuit diagram showing a configuration example of a pixel in a solid-state imaging device according to a fourth embodiment of the present invention.

Next, the solid-state imaging device 202 configured by sharing the connection electrode with the plurality of pixels 1 according to the fourth embodiment will be described. In the description below, the solid-state imaging device 202 according to the fourth embodiment is indicated as a solid-state imaging device 242. FIG. 11 is the circuit diagram showing a pixel configuration example in the solid-state imaging device 202 (solid-state imaging device 242) according to the fourth embodiment of the present invention. In FIG. 11, a configuration of the pixel (hereinafter pixel 41) configured by sharing one connection electrode 1000 with two pixels 1 is shown. In the same way as the pixel 1, the pixel 41 is configured to simultaneously transform the light incident on the two pixels 1 to the electrical signals, and the pixel 41 is configured to sequentially output the pixel signals corresponding to the amounts of the incident light on each pixel 1 in response to the control from the vertical scanning circuit 3 to the vertical signal line 9.

As described above, the pixel 41 is configured by sharing one connection electrode 1000 with the two pixels 1. Accordingly, the pixel 41 is configured to have two sets of the photoelectric conversion circuit PD and the memory circuit M configuring the pixel 1. In the description below, the first pixel 1 between the two pixels 1 is indicated as "pixel 1*a*" and the second pixel 1 is indicated as "pixel 1*b*". In the description below, the photoelectric conversion circuit PD configuring the pixel 1*a* is indicated as "photoelectric conversion circuit PDa", and the memory circuit configuring the pixel 1*a* is indicated as "memory circuit Ma". In the description below, the photoelectric conversion circuit PD configuring the pixel 1*b* is indicated as "photoelectric conversion circuit PDb", and the memory circuit configuring the pixel 1*b* is indicated as "memory circuit Mb". Further, in the description below, among the circuit elements configuring the pixel 41, the symbol "a" indicating the circuit element configuring the first pixel 1*a* and the symbol "b" indicating the circuit element configuring the second pixel 1*b* are affixed to the numeral signs designated to the circuit elements of the pixel 1*a* and the pixel 1*b* respectively. Among the circuit elements configuring the pixel 41, the common circuit elements of the pixel 1*a* and the pixel 1*b* are indicated without the symbols "a" and "b".

As shown in FIG. 11, the pixel 41 is configured to have a photoelectric conversion element 101*a*, a transmission transistor 102*a*, a photoelectric conversion element 101*b*, a transmission transistor 102*b*, the FD 103, the FD-reset transistor 104, the first amplifying transistor 105, the load transistor 106, the clamp capacitor 107, a sample transistor 108*a*, an analog-memory-reset transistor 109*a*, an analog memory 110*a*, a second amplifying transistor 111*a*, a selection transistor 112*a*, a sample transistor 108*b*, an analog-memory-reset transistor 109*b*, an analog memory 110*b*, a second amplifying transistor 111*b*, and a selection transistor 112*b*.

A first terminal of the photoelectric conversion element 101*a* is grounded. A drain terminal of the transmission transistor 102*a* is connected to a second terminal of the photoelectric conversion element 101*a*. A gate terminal of the transmission transistor 102*a* is connected by the transmission pulse φTXa which is output from the vertical scanning circuit 3. A first terminal of the photoelectric conversion element 101*b* is grounded. A drain terminal of the transmission transistor 102*b* is connected to a second terminal of the photoelectric conversion element 101*b*. A gate terminal of the transmission transistor 102b is connected by the transmission pulse φTXa which is output from the vertical scanning circuit 3. The first terminal of the FD 103 is connected to a source terminal of the transmission transistor 102a and a source terminal of the transmission transistor 102b. The second terminal of the FD 103 is grounded. The drain terminal of the FD-reset transistor 104 is connected to the power voltage VDD. The source terminal of the FD-reset transistor 104 is connected to the source terminal of the transmission transistor 102a and the source terminal of the transmission transistor 102b. The gate terminal of the FD-reset transistor 104 is connected by the FD-reset pulse φRST which is a control signal output from the vertical scanning circuit 3.

The drain terminal of the first amplifying transistor 105 is connected to the power voltage VDD. The gate terminal as the input of the first amplifying transistor 105 is connected to the source terminal of the transmission transistor 102a and the source terminal of the transmission transistor 102b. The drain terminal of the load transistor 106 is connected to the source terminal of the first amplifying transistor 105. The source terminal of the load transistor 106 is grounded. The gate terminal of the load transistor 106 is connected by the current control pulse φBias which is a control signal output from the vertical scanning circuit 3.

The first terminal of the clamp capacitor 107 is connected to the source terminal of the first amplifying transistor 105 and the drain terminal of the load transistor 106. A drain terminal of the sample transistor. 108a is connected to the second terminal of the clamp capacitor 107. A gate terminal of the sample transistor 108a is connected by the sample pulse φSHa which is a control signal output from the vertical scanning circuit 3. A drain terminal of the sample transistor 108b is connected to the second terminal of the clamp capacitor 107. A gate terminal of the sample transistor 108b is connected by the sample pulse φSHb which is a control signal output from the vertical scanning circuit 3.

A drain terminal of the analog-memory-reset transistor 109a is connected to the power voltage VDD. A source terminal of the analog-memory-reset transistor 109a is connected to the source terminal of the sample transistor 108a. A gate terminal of the analog-memory-reset transistor 109a is connected by a clamp-and-memory-reset pulse φCLa which is a control signal output from the vertical scanning circuit 3. A drain terminal of the analog-memory-reset transistor 109b is connected to the power voltage VDD. A source terminal of the analog-memory-reset transistor 109b is connected to the source terminal of the sample transistor 108b. A gate terminal of the analog-memory-reset transistor 109b is connected by a clamp-and-memory-reset pulse φCLb which is a control signal output from the vertical scanning circuit 3.

A first terminal of the analog memory 110a is connected to the source terminal of the sample transistor 108a. A second terminal of the analog memory 110a is grounded. A drain terminal of the second amplifying transistor 111a is connected to the power voltage VDD. A gate terminal of the second amplifying transistor 111a as the input is connected to the source terminal of the sample transistor 108a. A first terminal of the analog memory 110b is connected to the source terminal of the sample transistor 108b. A second terminal of the analog memory 110b is grounded. A drain terminal of the second amplifying transistor 111b is connected to the power voltage VDD. A gate terminal of the second amplifying transistor 111b as the input is connected to the source terminal of the sample transistor 108b. A drain terminal of the selection transistor 112a is connected to the source terminal of the second amplifying transistor 111a. A source terminal of the selection transistor 112a is connected to the vertical signal line 9. A gate terminal of the selection transistor 112a is connected by a selection pulse φSELa which is a control signal output from the vertical scanning circuit 3. A drain terminal of the selection transistor 112b is connected to the source terminal of the second amplifying transistor 111b. A source terminal of the selection transistor 112b is connected to the vertical signal line 9. A gate terminal of the selection transistor 112b is connected by a selection pulse φSELb which is a control signal output from the vertical scanning circuit 3.

In the circuit configuration of the pixel 41, the actual position of each circuit element is not limited to the position at which each circuit element is arranged as shown in FIG. 11. Each of the transistors configuring the pixel 41 may have a reverse polarity (the source terminal and the drain terminal may be reversed), in the same way as the configuration of the pixel 1 shown in FIG. 4.

In the pixel 41, in the same way as the pixel 1 shown in FIG. 4, each circuit element thereof is divided and distributed in the first semiconductor substrate 20 and the second semiconductor substrate 21. In FIG. 11, a boundary line D1 between the first semiconductor substrate 20 and the second semiconductor substrate 21 is shown as a broken line. In the pixel 41 shown in FIG. 11, in the same way as the pixel 1 shown in FIG. 4, the first semiconductor substrate 20 and the second semiconductor substrate 21 are connected by the connection electrode 1000. In the circuit configuration of the pixel 41 shown in FIG. 11, in the same way as the circuit configuration of the pixel 1 shown in FIG. 4, the source terminal of the first amplifying transistor 105 in the first semiconductor substrate 20 is connected to the drain terminal of the load transistor 106 and the first terminal of the clamp capacitor 107 in the second semiconductor substrate 21 via the connection electrode 1000. In the pixel 41, in the same way as the pixel 1 shown in FIG. 4, the first amplifying transistor 105, and the load transistor 106 and the clamp capacitor 107 are configured to exchange electrical signals with each other via the connection electrode 1000.

In the circuit configuration of the pixel 41 shown in FIG. 11, the photoelectric conversion element 101a, the transmission transistor 102a, the FD 103, the FD-reset transistor 104, and the first amplifying transistor 105 formed in the first semiconductor substrate 20 are configured to form the photoelectric conversion circuit PDa of the first pixel 1a. Also, in the circuit configuration of the pixel 41 shown in FIG. 11, the photoelectric conversion element 101b, the transmission transistor 102b, the FD 103, the FD-reset transistor 104, and the first amplifying transistor 105 formed in the first semiconductor substrate 20 are configured to form the photoelectric conversion circuit PDb of the second pixel 1b. In the circuit configuration of the pixel 41 shown in FIG. 11, the FD 103, the FD-reset transistor 104, and the first amplifying transistor 105 are the circuit elements shared by the photoelectric conversion circuit PDa and the photoelectric conversion circuit PDb.

In the circuit configuration of the pixel 41 shown in FIG. 11, the load transistor 106, the clamp capacitor 107, the sample transistor 108a, the analog-memory-reset transistor 109a, the analog memory 110a, the second amplifying transistor 111a, and the selection transistor 112a formed in the second semiconductor substrate 21 are configured to form the memory circuit Ma of the first pixel 1a. Also, in the circuit configuration of the pixel 41 shown in FIG. 11, the load transistor 106, the clamp capacitor 107, the sample transistor 108b, the analog-memory-reset transistor 109b, the analog memory 110b, the second amplifying transistor 111b, and the selection transistor 112b formed in the second semiconductor substrate 21 are configured to form the memory circuit Mb of the second pixel 1b. In the circuit configuration of the pixel 41 shown in FIG. 11, the load transistor 106 and the clamp capacitor 107 are the circuit elements shared by the memory circuit Ma and the memory circuit Mb.

Each circuit element configuring the pixel 41 has the same function and operation with that of the pixel 1 shown in FIG. 4. Accordingly, detailed descriptions regarding the function and operation of each circuit element configuring the pixel 41 will be omitted.

In the pixel 41 having the configuration described above, the photoelectric conversion circuit PDa and the memory circuit Ma configuring the first pixel 1a and the photoelectric conversion circuit PDb and the memory circuit Mb configuring the first pixel 1b share the single connection electrode 1000. Then, in the same way as the pixel 1 shown in FIG. 4, in the pixel 41, the photoelectric conversion element 101a and the photoelectric conversion element 101b output the amplified signals in response to the signal charge generated by the photoelectric conversion with respect to the incident light to the second semiconductor substrate 21 via the connection electrode 1000, and the amplified signals which are processed in the second semiconductor substrate 21 for removing the noise component are held and stored in the corresponding analog memory 110a and the analog memory 110b, respectively. Then, in the same way as the pixel 1 shown in FIG. 4, in the pixel 41, the amplified signals (noise removal signals) stored in the analog memory 110a and the analog memory 110b are sequentially output (read) to the vertical signal line 9 as the pixel signals. In the solid-state imaging device 242, a plurality of the pixels 41 having such a configuration are arranged in the two-dimensional matrix in the pixel array section 2.

In the same way as the pixel 1 shown in FIG. 4, in the pixel 41, the arrangement of each circuit element configuring the pixel 41 in the semiconductor substrate is not limited to the configuration of the pixel 41 shown in FIG. 11. In the solid-state imaging device 242, it is only to arrange the photoelectric conversion element 101a and the photoelectric conversion element 101b in the first semiconductor substrate 20 and arrange the analog memory 110a and the analog memory 110b in the second semiconductor substrate 21, and the other circuit elements may be arranged in either of the first semiconductor substrate 20 or the second semiconductor substrate 21.

In the same way as the pixel 1 shown in FIG. 4, in the circuit configuration of the pixel 41 shown in FIG. 11, the case in which the connection electrode 1000 is arranged in the path between the source terminal of the first amplifying transistor 105 in the first semiconductor substrate 20 and the drain terminal of the load transistor 106 and the first terminal of the clamp capacitor 107 in the second semiconductor substrate 21 is shown. However, the configuration of the connection electrode 1000 is not limited to the configuration of the pixel 41 shown in FIG. 11. The connection electrode 1000 can be arranged at any position in the path electrically from the node connected to the source terminal of the transmission transistor 102a and the source terminal of the transmission transistor 102b to the node connected to the drain terminal of the sample transistor 108a and the drain terminal of the sample transistor 108b.

In the pixel 41, the configuration of sharing the connection electrode 1000 with the two pixels of the pixel 1a and the pixel 1b is shown; however, the number of the pixels 1 sharing the connection electrode 1000 is not limited to the number of two shown in FIG. 11. For example, the pixel 41 may be configured to have 4 pixels 1 sharing the one connection electrode 1000. In this case, the four pixels 1 configuring the pixel 41 may be the four pixels 1 arranged adjacent to each other in the same row or the same column, that is, the four pixels 1 may be arranged in the 1 pixel×4 pixels form or the 4 pixels×1 pixel form. Further, the four pixels 1 configuring the one pixel 41 may be the two adjacent pixels 1 in the row direction and the two adjacent pixels 1 in the column direction, that is, the four pixels 1 may be arranged in the 2 pixels×2 pixels from.

With respect to the solid-state imaging device 242, during the manufacture of the solid-state imaging device 242, even if poor connection occurs in a plurality of adjacent connection electrodes 1000, the first semiconductor substrate 20 and the second semiconductor substrate 21 are connected with each other so as to prevent the plurality of adjacent pixels 41 from becoming the defective pixels. In the solid-state imaging device 242, it is acceptable that each of the pixel 1 in the pixel 41 becomes the defective pixel.

Next, the connection between the first semiconductor substrate 20 and the second semiconductor substrate 21 in the solid-state imaging device 242 will be described. In the description below, the connection between the first semiconductor substrate 20 and the second semiconductor substrate 21 is described by replacing the pixel 1 in the solid-state imaging device 202 according to the first embodiment shown in FIG. 5 with the pixel 41. In the solid-state imaging device 242 configured to have the plurality of pixels 1 sharing the connection electrode 1000, the pixel 41 is considered to be similar with the pixel 1 whose connection relationship is described in the first embodiment and the second embodiment. Also, in the solid-state imaging device 242, the pixel 41 can be considered to be similar with the pixel set whose connection relationship is described in the third embodiment. In the solid-state imaging device 242, the connection between the photoelectric circuit PD and the memory circuit M is changed by the unit of the pixel 41 (the unit of the plurality of pixels 1 sharing the one connection electrode 1000). In other words, in the solid-state imaging device 242, the positions of the connection electrodes BMP corresponding to each photoelectric conversion circuit PD are changed so as to prevent the photoelectric conversion circuit PD and the memory circuit M configuring each pixel 1 included in the adjacent pixels 41 being connected via the adjacent connection electrodes. The connection unit in the solid-state imaging device 242 is determined by each pixel 41.

Figure 12:
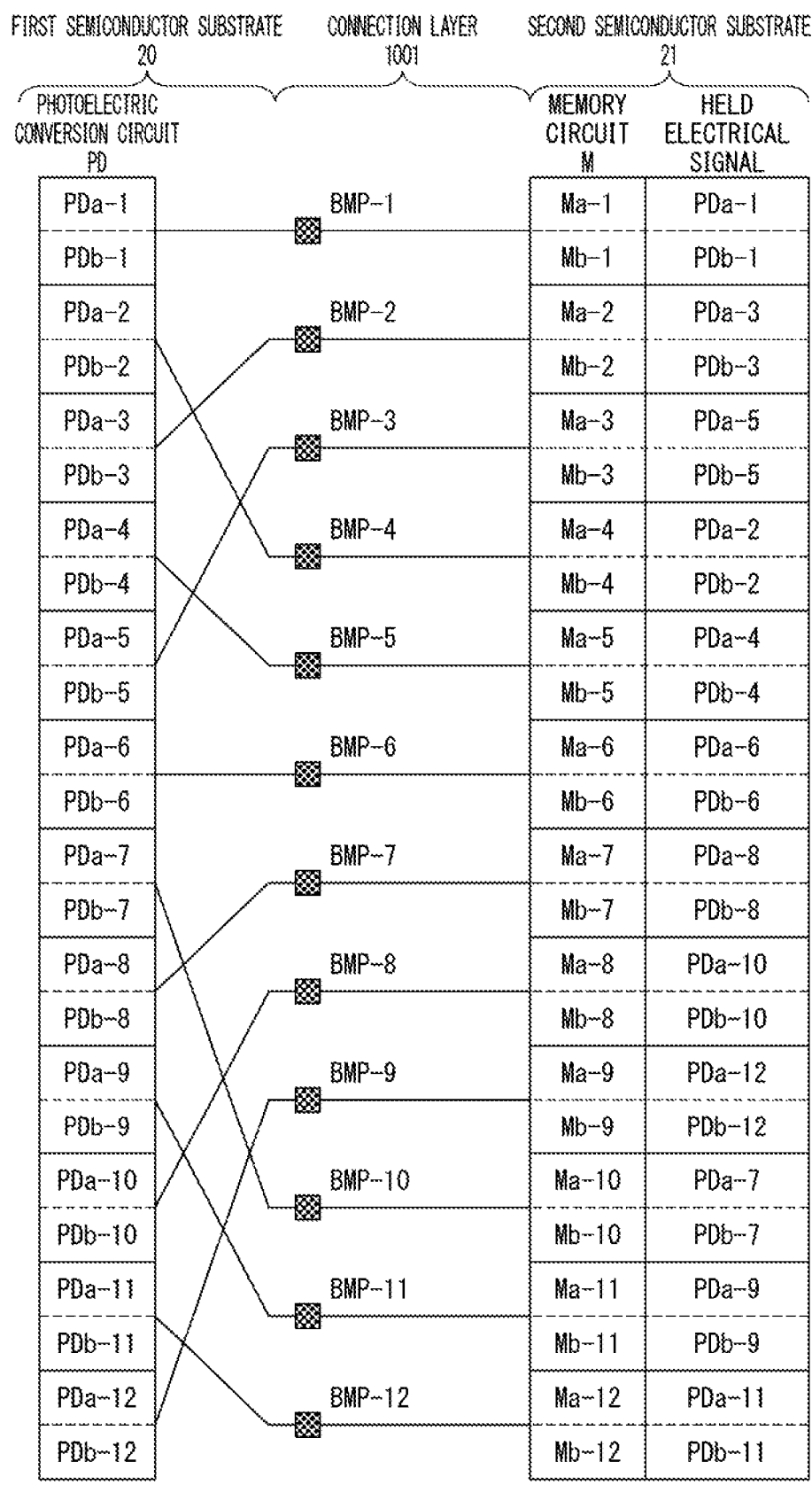
FIG. 12 is a view showing a connection relationship example between a photoelectric conversion circuit configured in a first semiconductor substrate and a memory circuit configured in a second semiconductor substrate in the solid-state imaging device according to the fourth embodiment of the present invention.

FIG. 12 is a view showing an example of the connection relationship between the photoelectric conversion circuit PD formed in the first semiconductor substrate 20 and the memory circuit M formed in the second semiconductor substrate 21 in the solid-state imaging device 202 (solid-state imaging device 242) according to the fourth embodiment of the present invention. In the same way as the example of the connection relationship of the solid-state imaging device 202 according to the first embodiment shown in FIG. 6, FIG. 12 is provided to show the connection electrode BMP through which the photoelectric conversion circuit PD is connected to the memory circuit M, in the solid-state imaging device 242. Also, in the same way as the example of the connection relationship of the solid-state imaging device 202 according to the first embodiment shown in FIG. 6, FIG. 12 is provided to show the photoelectric conversion circuit PD from which the electrical signals held by the memory circuit M are output, in the solid-state imaging device 242.

As described above, in the solid-state imaging device 242, the plurality of pixels 41 arranged in the two-dimensional matrix are arranged in the pixel array section 2. In order to make the description shown below easy to understand, the connection relationship between the photoelectric conversion circuit PD and the memory circuit M will be described by focusing on the twelve pixels 41 arranged in the same row in the pixel array section 2. Additionally, in the solid-state imaging device 242, the connection relationship between the photoelectric conversion circuit PD and the memory circuit M of the plurality of pixels 41 arranged in the same column can be considered in the same way as the description shown below.

In the description below, in the same way as the first embodiment, the number from 1 to 12 indicating the arranged sequence of the twelve pixels 41 is affixed after the symbol "-" to the numeral signs designated to the pixels 41, each configuration element configuring the pixel 1 of the pixel 41, and the connection electrode BMP. Accordingly, the twelve pixels 41, the photoelectric conversion circuit PDa, the memory circuit Ma, the photoelectric conversion circuit PDb, and the memory circuit Mb configuring each pixel 1 of the pixel 41, and the connection electrodes BMP can be distinguished.

In the example of the connection relationship shown in FIG. 12, the photoelectric conversion circuit PDa-1 configuring the pixel 1a-1 included in the pixel 41-1 and the photoelectric conversion circuit PDb-1 configuring the pixel 1b-1 included in the pixel 41-1 are connected to the memory circuit Ma-1 and the memory circuit Mb-1 via the connection electrode BMP-1. Accordingly, the electrical signals output by the photoelectric conversion circuit PDa-1 are held by the memory circuit Ma-1, and the electrical signals output by the photoelectric conversion circuit PDb-1 are held by the memory circuit Mb-1. More specifically, the amplified signals according to the signal charge generated by the photoelectric conversion with respect to the incident light L performed by the photoelectric conversion element 101a configuring the photoelectric conversion circuit PDa-1 formed in the first semiconductor substrate 20 are read to the second semiconductor substrate 21 via the connection electrode BMP-1, then the amplified signals are held and stored in the analog memory 110a after removing the noise component of the amplified signals by the memory circuit Ma-1 formed in the second semiconductor substrate 21. Also, the amplified signals according to the signal charge generated by the photoelectric conversion with respect to the incident light L performed by the photoelectric conversion element 101b configuring the photoelectric conversion circuit PDb-1 formed in the first semiconductor substrate 20 are read to the second semiconductor substrate 21 via the connection electrode BMP-1, then the amplified signals are held and stored in the analog memory 110b after removing the noise component of the amplified signals by the memory circuit Mb-1 formed in the second semiconductor substrate 21.

In the connection relationship example shown in FIG. 12, the photoelectric conversion circuit PDa-2 configuring the pixel 1a-2 included in the pixel 41-2 and the photoelectric conversion circuit PDb-2 configuring the pixel 1b-2 included in the pixel 41-2 are connected to the memory circuit Ma-4 and the memory circuit Mb-4 via the connection electrode BMP-4. Accordingly, the electrical signals output from the photoelectric conversion circuit PDa-2 are held by the memory circuit Ma-4, and the electrical signals output from the photoelectric conversion circuit PDb-2 are held by the memory circuit Mb-4. More specifically, the amplified signals according to the signal charge generated by the photoelectric conversion with respect to the incident light L performed by the photoelectric conversion element 101a configuring the photoelectric conversion circuit PDa-2 formed in the first semiconductor substrate 20 are read to the second semiconductor substrate 21 via the connection electrode BMP-4, then the amplified signals are held and stored in the analog memory 110a after removing the noise component of the amplified signals by the memory circuit Ma-4 formed in the second semiconductor substrate 21. Also, the amplified signals according to the signal charge generated by the photoelectric conversion with respect to the incident light L performed by the photoelectric conversion element 101b configuring the photoelectric conversion circuit PDb-2 formed in the first semiconductor substrate 20 are read to the second semiconductor substrate 21 via the connection electrode BMP-4, then the amplified signals are held and stored in the analog memory 110b after removing the noise component of the amplified signals by the memory circuit Mb-4 formed in the second semiconductor substrate 21.

Similarly, in the connection relationship example shown in FIG. 12, the photoelectric conversion circuit PDa-3 configuring the pixel 1a-3 included in the pixel 41-3 and the photoelectric conversion circuit PDb-3 configuring the pixel 1b-3 included in the pixel 41-3 are connected to the memory circuit Ma-2 and the memory circuit Mb-2 via the connection electrode BMP-2. Accordingly, the electrical signals output from the photoelectric conversion circuit PDa-3 are held by the memory circuit Ma-2, and the electrical signals output from the photoelectric conversion circuit PDb-3 are held by the memory circuit Mb-2. Similarly, in the connection relationship example shown in FIG. 12, the photoelectric conversion circuit PDa-4 configuring the pixel 1a-4 included in the pixel 41-4 and the photoelectric conversion circuit PDb-4 configuring the pixel 1b-4 included in the pixel 41-4 are connected to the memory circuit Ma-5 and the memory circuit Mb-5 via the connection electrode BMP-5. Accordingly, the electrical signals output from the photoelectric conversion circuit PDa-4 are held by the memory circuit Ma-5, and the electrical signals output from the photoelectric conversion circuit PDb-4 are held by the memory circuit Mb-5. Similarly, in the connection relationship example shown in FIG. 12, the photoelectric conversion circuit PDa-5 configuring the pixel 1a-5 included in the pixel 41-5 and the photoelectric conversion circuit PDb-5 configuring the pixel 1b-5 included in the pixel 41-5 are connected to the memory circuit Ma-3 and the memory circuit Mb-3 via the connection electrode BMP-3. Accordingly, the electrical signals output from the photoelectric conversion circuit PDa-5 are held by the memory circuit Ma-3, and the electrical signals output from the photoelectric conversion circuit PDb-5 are held by the memory circuit Mb-3.

In the solid-state imaging device 242, in the same way as the solid-state imaging device 202 according to the first embodiment, the connection relationship between the photoelectric conversion circuit PD and the memory circuit M configuring each pixel 1 included in the five pixels 41 described above is periodically repeated as the connection unit. Accordingly, in the solid-state imaging device 242, even if the poor connection such as the short circuit (short) or the unconnection (open) occurs in the two adjacent connection electrodes BMP among the five connection electrodes BMP-1 to BMP-5, the situation in which the two adjacent pixels 41 (unit of the pixel 41) become defective pixels is avoided. Accordingly, the image-processing unit 203 can generate (interpolate) the image signal of the defective pixel 1 by the defective pixel correction image-processing using the image signal of each pixel 1 included in the pixel 41 arranged in the periphery. The defective pixel correction image-processing performed by the image-processing unit 203 when the poor connection occurs in the adjacent connection electrodes BMP in the solid-state imaging device 242 can be considered in the same way as that of the solid-state imaging device 202 according to the first embodiment, detailed descriptions regarding the specific example of the defective pixel correction image-processing performed by the image-processing unit 203 will be omitted.

In the solid-state imaging device 242, the connection relationship of the photoelectric conversion circuit PD and the memory circuit M changed in the connection unit is not limited to the connection relationships described above. For example, in the same way as the solid-state imaging device 202 according to the first embodiment, according to the number of the adjacent connection electrodes BMP in which the poor connection is possible to occur during the manufacture of the solid-state imaging device 242, the connection between the photoelectric conversion circuit PD and the memory circuit M may be suitably determined to a different connection (connection relationship). Also, multiple connection relationships may be applied. In this case, in the solid-state imaging device 242, the connection relationship between the photoelectric conversion circuit PD and the memory circuit M is changed by the unit of the pixel 41.

The connection unit repeated in the solid-state imaging device 242 is not limited to a single type and may be multiple types, in the same way as the solid-state imaging device 202 according to the first embodiment. In the example of the connection relationship shown in FIG. 12, an example of applying a connection unit by the seven pixels 1 including the pixel 41-6 to the pixel 41-12 different from a connection unit applied to the five pixels 1 including the pixel 41-1 to the pixel 41-5 is shown. More specifically, in the example of the connection relationship shown in FIG. 12, the photoelectric conversion circuit PDa-6 configuring the pixel 1a-6 included in the pixel 41-6 and the photoelectric conversion circuit PDb-6 configuring the pixel 1b-6 are connected to the memory circuit Ma-6 and the memory circuit Mb-6 via the BMP-6. In the example of the connection relationship shown in FIG. 12, the photoelectric conversion circuit PDa-7 configuring the pixel 1a-7 included in the pixel 41-7 and the photoelectric conversion circuit PDb-7 configuring the pixel 1b-7 are connected to the memory circuit Ma-10 and the memory circuit Mb-10 via the BMP-10, respectively. In the example of the connection relationship shown in FIG. 12, the photoelectric conversion circuit PDa-8 configuring the pixel 1a-8 included in the pixel 41-8 and the photoelectric conversion circuit PDb-8 configuring the pixel 1b-8 are connected to the memory circuit Ma-7 and the memory circuit Mb-7 via the BMP-7, respectively. In the example of the connection relationship shown in FIG. 12, the photoelectric conversion circuit PDa-9 configuring the pixel 1a-9 included in the pixel 41-9 and the photoelectric conversion circuit PDb-9 configuring the pixel 1b-9 are connected to the memory circuit Ma-11 and the memory circuit Mb-11 via the BMP-11, respectively. In the example of the connection relationship shown in FIG. 12, the photoelectric conversion circuit PDa-10 configuring the pixel 1a-10 included in the pixel 41-10 and the photoelectric conversion circuit PDb-10 configuring the pixel 1b-10 are connected to the memory circuit Ma-8 and the memory circuit Mb-8 via the BMP-8, respectively. In the example of the connection relationship shown in FIG. 12, the photoelectric conversion circuit PDa-11 configuring the pixel 1a-11 included in the pixel 41-11 and the photoelectric conversion circuit PDb-11 configuring the pixel 1b-11 are connected to the memory circuit Ma-12 and the memory circuit Mb-12 via the BMP-12, respectively. In the example of the connection relationship shown in FIG. 12, the photoelectric conversion circuit PDa-12 configuring the pixel 1a-12 included in the pixel 41-12 and the photoelectric conversion circuit PDb-12 configuring the pixel 1b-12 are connected to the memory circuit Ma-9 and the memory circuit Mb-9 via the BMP-9, respectively. In the example of the connection relationship shown in FIG. 12, the connection unit for connecting each photoelectric conversion circuit PD to the corresponding memory circuit M as described above is applied to the solid-state imaging device 242. Accordingly, the electrical signals output from each photoelectric conversion circuit PD are held by the connected memory circuit M. As described above, in the same way as the solid-state imaging device 202 according to the first embodiment, the solid-state imaging device 242 may be configured to have the multiple connection units repeated periodically as described above.

Accordingly, in the solid-state imaging device 242, even if the poor connection such as the short circuit (short) or the unconnection (open) occurs in the adjacent three connection electrodes BMP among the electrode BMP-6 to the electrode BMP-12 of the solid-state imaging device 242, the situation in which the two adjacent pixels 41 (unit of pixels 41) become the defective pixels is avoided. Accordingly, the image-processing unit 203 can generate (interpolate) the image signal of the defective pixel 1 by the image processing of the defective pixel correction using the image signals of each pixel 1 included in the pixel 41 in the periphery thereof.

According to the connection relationship shown in FIG. 12, in the solid-state imaging device 242, in the same way as the connection relationship of the solid-state imaging device 202 according to the first embodiment shown in FIG. 6, the electrical signals output from each of the photoelectric conversion circuits PD and held by each of the memory circuits M are not in the same sequence as the sequence in which the photoelectric conversion circuits PD are arranged in the first semiconductor substrate 20. Accordingly, in the imaging apparatus 200 having the solid-state imaging device 242, according to the same idea as that in the imaging apparatus 200 having the solid-state imaging device 202 according to the first embodiment, the image-processing unit 203 is configured to perform the image-processing for rearranging the image signals output from the solid-state imaging device 242 into the sequence in the same way as the sequence of the pixels 1 arranged in the pixel array section 2 of the solid-state imaging device 242 by the unit of the pixel 41. Also, in the solid-state imaging device 242, by implementing the same function of the rearrangement image-processing performed by the image-processing unit 203 in the solid-state imaging device 242, in the imaging apparatus 200 having the solid-state imaging device 242, the image-processing unit 203 may not perform the rearrangement image-processing. Also, in the solid-state imaging device 242, by changing the wiring configuration of the metal wirings 2103 formed in the second wiring layer 2102 of the second semiconductor substrate 21 according to the same idea of the solid-state imaging device 21 disclosed in the second embodiment, the image-processing unit 203 may not perform the rearrangement image-processing.

According to the fourth embodiment of the present invention, in the solid-state imaging device (solid-state imaging device 242), the pixel set (pixel 41) is configured by including the plurality of photoelectric conversion circuits (photoelectric conversion circuit PDa and the photoelectric conversion circuit PDb) having the photoelectric conversion elements (photoelectric conversion element 101: pixel 1) which are adjacent to each other. In the solid-state imaging device (solid-state imaging device 242), the photoelectric conversion circuits included in the same pixel 41 are connected to the corresponding signal processing circuits (for example, the analog memory, and the memory circuit M including the plurality of transistors and the plurality of capacitors) by the adjacent connection electrodes (connection electrodes 1000=connection electrodes BMP).

According to the fourth embodiment of the present invention, the connection electrodes BMP are formed by each pixel 41, and each photoelectric conversion circuits (photoelectric conversion circuit PDa and photoelectric conversion circuit PDb) included in the same pixel 41 are connected to the corresponding signal processing circuits (memory circuit Ma and memory circuit Mb) via one connection electrode BMP.

As described above, in the solid-state imaging device 242 having the plurality of pixels sharing one connection electrode, with regard to the adjacent pixels 41, the positions of the connection electrodes 1000 configured to connect each of the photoelectric conversion circuits PD and the memory circuits M in the adjacent pixel sets are changed by the unit of the pixel 41 (the unit of the plurality of pixels 1 sharing one connection electrode 1000) such that the photoelectric conversion circuit PD and the memory circuit M configuring each pixel 1 included in the pixel 41 are connected via the separated connection electrodes 1000 (connection electrodes BMP). Accordingly, in the solid-state imaging device 242 according to the fourth embodiment, in the same way as the solid-state imaging device 202 according to the first embodiment and the solid-state imaging device 212 according to the second embodiment, even if the poor connection such as the short circuit (short) or the unconnection (open) occurs in the plurality of adjacent connection electrodes 1000, the situation in which the two adjacent pixels 1 included in the two adjacent pixels 41 become the defective pixels are avoided. Accordingly, in the solid-state imaging device 242 having the plurality of pixels 1 sharing one connection electrode according to the fourth embodiment, the same effect as that of the solid-state imaging device 202 according to the first embodiment and the solid-state imaging device 212 according to the second embodiment can be achieved. Further, according to the imaging apparatus 200 having the solid-state imaging device 242 according to the fourth embodiment, the same effect as that of the imaging apparatus 200 having the solid-state imaging device 202 according to the first embodiment or the solid-state imaging device 212 according to the second embodiment can be achieved.

With regard to the solid-state imaging device 202 according to the first embodiment to the fourth embodiment, in order to make the description easy to understand, the case in which the pixels 1 are arranged in the same row in the pixel array section 2 is described. However, as described above, in the solid-state imaging device 202, the plurality of pixels 1 in the pixel array section 2 are arranged in the two-dimensional matrix.

(Five Embodiment)

Figure 13:
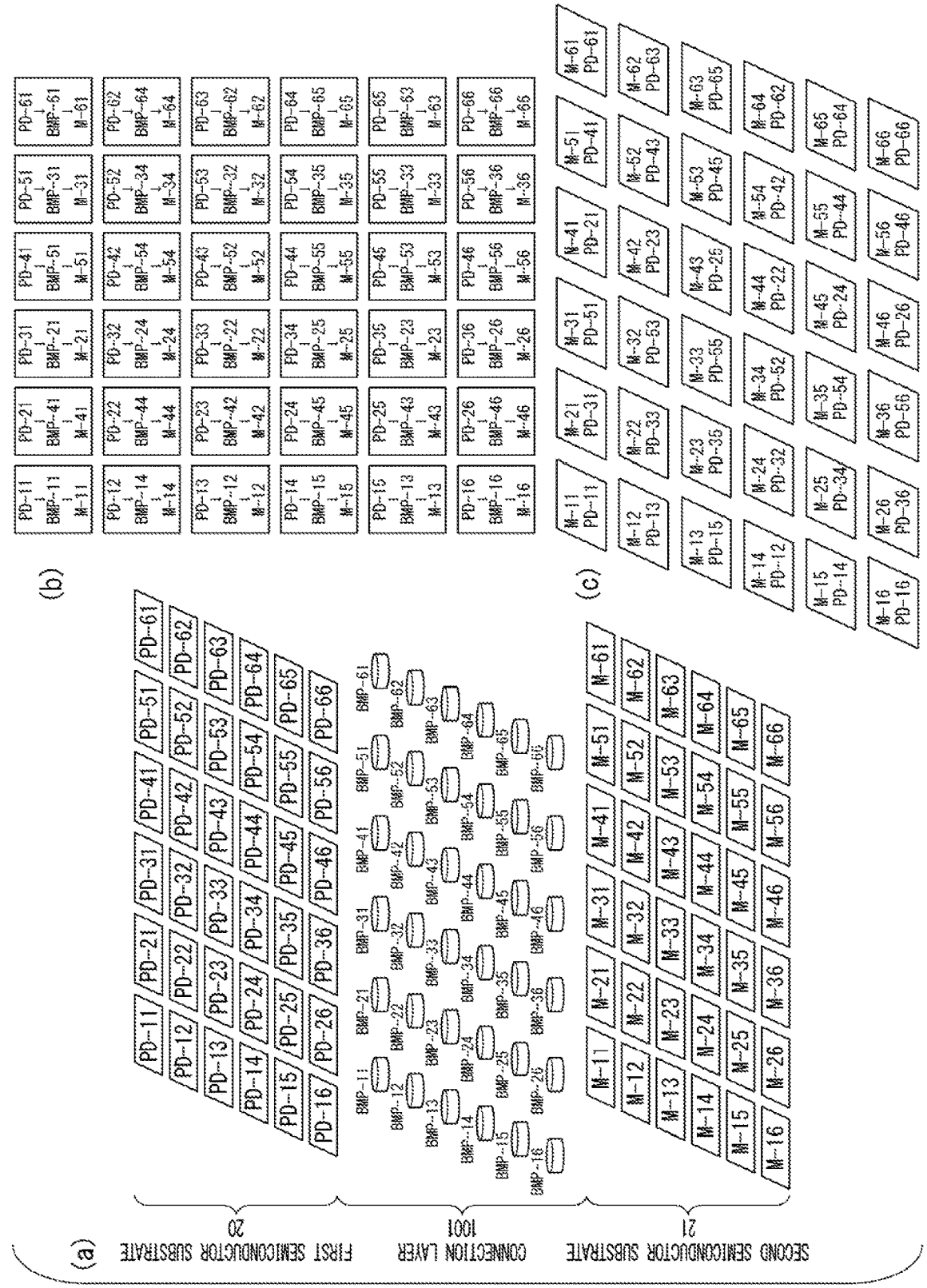
FIG. 13 is a view showing an example of a relationship among a photoelectric conversion circuit configured in a first semiconductor substrate, a memory circuit configured in a second semiconductor substrate, and connection electrodes in a solid-state imaging device according to a fifth embodiment of the present invention.

Next, the case in which the pixels 1 are arranged in a two-dimensional matrix in the solid-state imaging device 202 will be described. In the description below, the solid-state imaging device 202 according to the fifth embodiment will be described as a solid-state imaging device 252. FIG. 13 is a view showing the connection relationships of the photoelectric conversion circuits formed in the first semiconductor substrate, the memory circuits formed in the second semiconductor substrate, and the connection electrodes of solid-state imaging device 202 (solid-state imaging device 252) according to the fifth embodiment. The configuration (arrangement) of the photoelectric conversion circuits PD in the first semiconductor substrate 20, the configuration (arrangement) of the connection electrodes 1000 in the connection layer 1001, and the configuration (arrangement) of the memory circuits M in the second semiconductor substrate 21 are schematically shown in the part (a) of FIG. 13. In the part (b) of FIG. 13, the connection relationships among the photoelectric conversion circuits PD, the connection electrodes 1000, and the memory circuits M are schematically shown corresponding to the configuration (arrangement) of the pixels 1. In the part (c) of FIG. 13, the relationships among the electrical signals from the photoelectric conversion circuits M held by the memory circuits M are schematically shown corresponding to the configuration (arrangement) of the pixels 1.

In FIG. 13, a two-digit number showing the row number and the column, number of the arranged position is affixed to the numeral sign designated to each configuration element. In the two-digit number affixed to each configuration element, the upper number (tens place) shows the column number and the lower number (ones place) shows the row number thereof. More specifically, the photoelectric conversion circuit PD, the connection electrode BMP, and the memory circuit M arranged in the second column and fifth row are shown as the photoelectric conversion circuit PD-25, the connection electrode BMP-25, and the memory circuit M-25. Moreover, the photoelectric conversion circuit PD, the connection electrode BMP, and the memory circuit M arranged in the fifth column and first row are shown as the photoelectric conversion circuit PD-51, the connection electrode BMP-51, and the memory circuit M-51 respectively.

As shown in the part (a) of FIG. 13, in the first semiconductor substrate 20, the connection layer 1001, and the second semiconductor substrate 21, the photoelectric conversion circuits PD, the connection electrodes BMP (connection electrodes 1000), and the memory circuits M are configured (formed) in one-to-one correspondence therein. In the conventional solid-state imaging device having the plurality of semiconductor substrates stacked with each other, when the poor connection occurs in the adjacent connection electrodes BMP, the adjacent plurality of pixels 1 become the defective pixels. In this case, the correction precision of the defective pixels becomes low and the image quality of the captured images becomes low.

In the solid-state imaging device 202 (solid-state imaging device 252) of the present invention, as described above, the adjacent photoelectric conversion circuits PD are connected with the memory circuits M via the separated connection electrodes such that even if the poor connection occurs in the adjacent plurality of connection electrodes, the adjacent plurality of pixels 1 do not become the defective pixels.

In this case, the two-dimensional connection relationship, in other words, the connection electrode through which the photoelectric conversion circuit PD is connected to the memory circuit M is shown in the part (b) of FIG. 13. The connection relationship shown in the part (b) of FIG. 13 is an example in which the connection between the photoelectric conversion circuit PD and the memory circuit M is changed, in the same way as the connection relationship example in the solid-state imaging device 202 according to the first embodiment as shown in FIG. 6. For example, in the first row, the photoelectric conversion circuit PD-11 is connected with the memory circuit M-11 via the connection electrode BMP-11, the photoelectric conversion circuit PD-21 is connected with the memory circuit M-41 via the connection electrode BMP-41, the photoelectric conversion circuit PD-31 is connected with the memory circuit M-21 via the connection electrode BMP-21, the photoelectric conversion circuit PD-41 is connected with the memory circuit M-51 via the connection electrode BMP-51, and the photoelectric conversion circuit PD-51 is connected with the memory circuit M-31 via the connection electrode BMP-31. In the connection relationship example as shown in the part (b) of FIG. 13, the connections of the photoelectric circuits PD, the connection electrodes BMP, and the memory circuits M are the same with each other in each row.

In the part (c) of FIG. 13, the relationships of the memory circuits M and the electrical signals output from the photoelectric conversion circuits PD and held/stored in the memory circuits M, in other words, the photoelectric conversion circuits PD which output the electrical signals held by the memory circuits M are shown. For example, it is shown that in the first row, the memory circuit M-11 holds the electrical signals output from the photoelectric conversion circuit PD-11, the memory circuit M-21 holds the electrical signals output from the photoelectric conversion circuit PD-31, the memory circuit M-31 holds the electrical signals output from the photoelectric conversion circuit PD-51, the memory circuit M-41 holds the electrical signals output from the photoelectric conversion circuit PD-21, and the memory circuit M-51 holds the electrical signals output from the photoelectric conversion circuit PD-41. In the connection relationship example shown in the part (b) of FIG. 13, the connections of the photoelectric circuits PD, the connection electrodes BMP, and the memory circuits M are the same with each other such that the relationships of the memory circuits M and the electrical signals output from the photoelectric conversion circuits PD and held/stored in the memory circuits M are the same with each other in each row.

Accordingly, by changing the connection of the photoelectric conversion circuit PD and the memory circuit M, in the solid-state imaging device 252, even if the poor connection occurs in the adjacent two connection electrodes BMP during the manufacture of the solid-state imaging device 252, the adjacent two pixels 1 do not become the defective pixels.

In the example shown in FIG. 13, the case in which the connections of the photoelectric circuits PD, the connection electrodes BMP, and the memory circuits M are the same with each other in each row is shown; however, as described above, the connection relationship and the connection unit may have multiple variations. For example, the connection relationships in the odd-numbered rows and the even-numbered rows of the pixels 1 arranged in the pixel array section 2 may be different with each other. In this case, in the imaging apparatus 200 having the solid-state imaging device 252, when the image-processing unit 203 performs the rearrangement image-processing with respect to the image signals output from the solid-state imaging device 252 so as to rearrange the image signals into the sequence of the pixels 1 in the pixel array section 2 of the solid-state imaging device 252, the sequence of the image signals with respect to the odd-numbered rows is different from that of the image signals with respect to the even-numbered rows. When the solid-state imaging device 252 has the same rearrangement image-processing function as that of the image-processing unit 203, for example, the rearrangement circuit (not shown) is configured to change the rearrangement sequence with respect to the odd-numbered rows and the even-numbered rows. Further, when the horizontal read circuit 5 reads (outputs) the pixel signals which are generated by performing the column processing with respect to the amplified signals (noise removal signals) and held by the memory circuit M to the horizontal signal line 10, the selection sequence in which the column processing circuit 4 is selected is changed due to the odd-numbered rows and the even-numbered rows. Accordingly, in the imaging apparatus 200 having the solid-state imaging device 252, the image-processing unit 203 may not perform the rearrangement image-processing.

According to the fifth embodiment of the present invention, the solid-state imaging device (solid-state imaging device 252) is configured to have the connection unit varying due to the rows or the columns (for example, by the odd-numbered rows and the even-numbered rows) in which the photoelectric conversion elements (photoelectric conversion element 101) included in each photoelectric conversion circuit (photoelectric conversion circuit PD) in the first semiconductor substrate (first semiconductor substrate 20).

As described above, in the solid-state imaging device 252 according to the fifth embodiment, in the same way as the solid-state imaging device 202 according to the first embodiment, in the first semiconductor substrate 20 in which the photoelectric conversion circuit PD is formed, the position of the connection electrode 1000 corresponding to each photoelectric conversion circuit PD is changed such that the adjacent photoelectric conversion circuits PD are connected to the memory circuits M via the separated connection electrodes 1000 (connection electrodes BMP. Accordingly, in the solid-state imaging device 252 according to the fifth embodiment, in the same way as the solid-state imaging device 202 according to the first embodiment and the solid-state imaging device 212 according to the second embodiment, even if the poor connection such as the short circuit (short) or the unconnection (open) occurs in the plurality of adjacent connection electrodes 1000, the adjacent two pixels 1 do not become the defective pixels. Accordingly, in the solid-state imaging device 252 according to the fifth embodiment, the same effects can be achieved as that of the solid-state imaging device 202 according to the first embodiment and the solid-state imaging device 212 according to the second embodiment. Accordingly, in the imaging apparatus 200 having the solid-state imaging device 252 according to the fifth embodiment, the same effects can be achieved as that of the imaging apparatus having the solid-state imaging device 202 according to the first embodiment and the solid-state imaging device 212 according to the second embodiment.

As described above, according to the embodiment of the present invention, in the solid-state imaging device having the stacked structure of the plurality of semiconductor substrates, when the first semiconductor substrate in which at least the photoelectric elements are formed and the second semiconductor substrate in which at least the analog memories are formed are connected with each other, the positions of the connection electrodes corresponding to each photoelectric conversion element are changed such that the adjacent photoelectric conversion elements or the unit formed by the plurality of photoelectric conversion elements are connected with the analog memories by the separated connection electrodes which are not adjacent to each other. Accordingly, in the embodiments of the present invention, even if the poor connection such as the short circuit (short) or the unconnection (open) occurs in the plurality of adjacent connection electrodes, pixels defects due to the poor connection occurred in the adjacent two connection electrodes will be distributed, and the ratio of the continuing defects occurred in the plurality of pixels 1 will be reduced. Accordingly, in the solid-state imaging devices according to the embodiment of the present invention, the possibility of the defective products (proportion defective) will be reduced. Accordingly, in the imaging apparatus having the solid-state imaging devices according to the embodiments of the present invention, it is possible to prevent the lowering of the precision of the defective pixel correction performed according to the image signals output from the solid-state imaging devices according to the embodiments of the present invention so as to prevent the lowering of the image quality.

In the embodiments, it is described that the pixel 1 is configured by the photoelectric conversion circuit PD and the memory circuit M. Further, it is described that the photoelectric circuit PD is formed in the first semiconductor substrate 20 and the memory circuit M is formed in the second semiconductor substrate 21. However, the functions of the pixel 1 are not limited to the functions described in the embodiments. For example, the pixel 1 may include the functions realized by the analog-digital transformation circuit and the logic circuit. In this case, instead of the memory circuit M, or in addition to the memory circuit M, the analog-digital transformation circuit and the logic circuit may be formed (arranged) in the second semiconductor substrate 21. Further, the photoelectric conversion circuit PD and the memory circuit M may be formed (arranged) in the first semiconductor substrate 20, and the analog-digital transformation circuit and the logic circuit may be formed (arranged) in the second semiconductor substrate 21.

In the embodiments, as the example of the rearrangement processing, the case in which the sequence of column processing circuit 4 selected by the horizontal read circuit 5 is changed to be the same as the sequence of the pixels 1 when the image signals are output (read) to the horizontal signal line 10 is described. However, the rearrangement processing may be realized by the vertical scanning circuit 3, or by both of the horizontal read circuit 5 and the vertical scanning circuit 3.

The number of the pixels 1 arranged in the pixel array section 2 in the row direction and the column direction are not limited to that described in the embodiments, without departing from the scope of the present invention, the number of the pixels 1 arranged in the row direction and the column direction may be changed.

In the embodiment of the present invention, the structure of the solid-state imaging device configured by stacking the two semiconductor substrates of the first semiconductor substrate 20 and the second semiconductor substrate 21 is described. However, the substrates stacked in the solid-state imaging device are not limited thereto and the solid-state imaging device may be configured to have more than two substrates being stacked.

In the embodiments of the present invention, the case in which the color filters arranged in the RGB Bayer array are adhered to the solid-state imaging device is described. In other words, according to the embodiments of the present invention, the case of changing the positions of the connection electrodes 1000 (connection electrodes BMP) connecting the first semiconductor substrate 20 and the second semiconductor substrate 21 in the solid-state imaging device of the RGB Bayer array is described. However, the color configuration of the color filters adhered to the solid-state imaging device and the configuration of the image pixels are not limited to the example of the RGB Bayer array described above, with respect to the solid-state imaging device having the color filters arranged in other arrangement, the scope of the present invention can be applied thereto.

The embodiments of the invention have been described above with reference to the drawings, but specific structures of the invention are not limited to the embodiments and may include various modifications without departing from the scope of the invention. The invention is not limited to the above-mentioned embodiments and is limited only by the accompanying claims.

What is claimed is:

1. A solid-state imaging device having circuit elements configuring a plurality of pixels, wherein the circuit elements are distributed in a plurality of semiconductor substrates configured in a stacked structure, the solid-state imaging device comprising:
    a first semiconductor substrate having a plurality of photoelectric conversion circuits forming a two-dimensional array, each of the plurality of photoelectric conversion circuits having a part of the circuit elements including a photoelectric conversion element configured to transform incident light to an electrical signal;
    a second semiconductor substrate having a plurality of signal processing circuits forming a two-dimensional array, each of the plurality of signal processing circuits having another part of the circuits elements configured to process the electrical signal output by the plurality of photoelectric conversion circuits, and a number of the plurality of signal processing circuits being equal to a number of the plurality of photoelectric conversion circuits; and
    a plurality of connection electrodes formed in a two-dimensional array between the first semiconductor substrate and the second semiconductor substrate and configured to electrically connect signal lines of the plurality of photoelectric conversion circuits and signal lines of the plurality of signal processing circuits respectively,
    wherein a pixel set is defined by including at least one of the plurality of photoelectric conversion circuits, and
    wherein each of the plurality of photoelectric circuits included in the pixel sets adjacent to each other is connected to one of the plurality of signal processing circuits via separated connection electrodes which are not adjacent to each other among the plurality of connection electrodes, respectively.

2. The solid-state imaging device according to claim 1,
    wherein the pixel set is configured by including multiple photoelectric conversion circuits among the plurality of photoelectric conversion circuits in which the photoelectric conversion elements are adjacent to each other, and
    wherein the multiple photoelectric conversion circuits included in the pixel set are connected to one corresponding signal processing circuit via the connection electrodes adjacent to each other, respectively.

3. The solid-state imaging device according to claim 2,
    wherein the plurality of connection electrodes are formed in correspondence with the plurality of pixel sets respectively, and
    wherein the multiple photoelectric conversion circuits included in the same pixel set are connected to the corresponding signal processing circuits via one of the plurality of connection electrodes.

4. The solid-state imaging device according to claim 1,
    wherein the pixel set is configured by including multiple photoelectric conversion circuits among the plurality of photoelectric conversion circuits in which the photoelectric conversion elements are adjacent to each other, the photoelectric conversion elements being configured to transform light having different wavelengths into the electrical signal, and wherein the multiple photoelectric conversion circuits included in the pixel set are connected to the corresponding signal processing circuits via the connection electrodes adjacent to each other, respectively.

5. The solid-state imaging device according to claim 1, wherein the photoelectric conversion circuits included in the pixel sets adjacent to each other are connected to the corresponding signal processing circuits via the different connection electrodes which are formed at separated positions in either of a row direction or a column direction adjacent to the photoelectric conversion circuits, respectively.

6. The solid-state imaging device according to claim 5, wherein a connection unit is defined by including a predetermined number of the pixel sets, and wherein each of the photoelectric conversion circuits included in the pixel sets adjacent to each other is connected to the corresponding signal processing circuit via separated connection electrodes which are not adjacent to each other among the plurality of connection electrodes by a cycle of the connection unit.

7. The solid-state imaging device according to claim 6, wherein the connection unit has multiple variations in either of the row direction or the column direction in which the pixel sets are adjacent to each other, and wherein the multiple variations of the connection unit are periodically repeated in either of the row direction or the column direction, respectively.

8. The solid-state imaging device according to claim 7, wherein the connection units are different by each row or each column in which the photoelectric conversion element included in each photoelectric conversion circuit in the first semiconductor substrate is formed.

9. The solid-state imaging device according to claim 1, wherein a plurality of image signals according to a plurality of the electrical signals which are processed by the plurality of signal processing circuits connected to the plurality of photoelectric conversion circuits respectively are output in a sequence same as a sequence in which the photoelectric conversion elements formed in the first semiconductor substrate are queued.

10. An imaging apparatus, comprising:

the solid-state imaging device according to claim 1, and a processor configured to rearrange image signals output from the solid-state imaging device in a sequence in which a plurality of the photoelectric conversion elements are queued, the plurality of the photoelectric conversion elements being configured to transform light incident on the solid-state imaging device to electrical signals for generating the image signals.

* * * * *